(12) United States Patent
Dahm

(10) Patent No.: US 9,632,294 B2
(45) Date of Patent: *Apr. 25, 2017

(54) MICRO-CHANNEL-COOLED HIGH HEAT LOAD LIGHT EMITTING DEVICE

(71) Applicant: Heraeus Noblelight America LLC, Gaithersburg, MD (US)

(72) Inventor: Jonathan S. Dahm, Key Largo, FL (US)

(73) Assignee: Heraeus Noblelight America LLC, Gaithersburg, MD (US)

( * ) Notice: Subject to any disclaimer, the term of this patent is extended or adjusted under 35 U.S.C. 154(b) by 98 days.

This patent is subject to a terminal disclaimer.

(21) Appl. No.: 14/326,561

(22) Filed: Jul. 9, 2014

(65) Prior Publication Data

US 2014/0319386 A1 Oct. 30, 2014

Related U.S. Application Data

(63) Continuation of application No. 13/589,519, filed on Aug. 20, 2012, now Pat. No. 8,809,820, which is a
(Continued)

(51) Int. Cl.
*G02B 19/00* (2006.01)
*B05D 3/06* (2006.01)
*F21V 29/00* (2015.01)

(52) U.S. Cl.
CPC ......... *G02B 19/0023* (2013.01); *B05D 3/067* (2013.01); *F21V 29/30* (2013.01)

(58) Field of Classification Search
CPC . F21V 7/08; F21V 7/005; F21V 29/30; F21V 23/004; F21V 23/005;
(Continued)

(56) References Cited

U.S. PATENT DOCUMENTS 7,284,882 B2 * 10/2007 Burkholder ........... F21S 48/321
257/712
8,809,820 B2 * 8/2014 Dahm ................... B05D 3/067
250/503.1
(Continued)

FOREIGN PATENT DOCUMENTS

JP 2006332042 A * 12/2006
WO 03096387 11/2003
(Continued)

*Primary Examiner* — David E Smith
(74) *Attorney, Agent, or Firm* — Stradley Ronon Stevens & Young LLP

(57) ABSTRACT

Micro-channel-cooled UV curing systems and components thereof are provided. According to one embodiment, a lamp head module includes a high aspect ratio, high fill factor array of light emitting devices and a submount. The array includes multiple groups of electrically seriesed light emitting devices that are connected in electrical parallel. The submount is of monolithic construction and includes multiple L-shaped patterned circuit material layers. Each of the L-shaped patterned circuit material layers includes an arm portion and a stem portion. The arm portion functions as a light emitting device bond pad and the stem portion functions as a wire bond pad and a circuit trace. Each light emitting device of a group is affixed to a corresponding arm portion of the submount. The stem portions are located external to the array, run parallel to the length of the array and perform a primary current carrying function for current flow between adjacent light emitting devices of the group.

17 Claims, 38 Drawing Sheets

Related U.S. Application Data continuation of application No. 13/014,069, filed on Jan. 26, 2011, now Pat. No. 8,378,322.

(60) Provisional application No. 61/336,979, filed on Jan. 27, 2010, provisional application No. 61/341,594, filed on Apr. 1, 2010, provisional application No. 61/456,426, filed on Nov. 5, 2010.

(58) Field of Classification Search
CPC ....... F21V 23/006; B05D 3/067; G02B 19/00; G02B 19/0019; G02B 19/0023; G02B 19/0061; G02B 19/0066; H01L 33/32; H01L 33/62
See application file for complete search history.

(56) References Cited

U.S. PATENT DOCUMENTS

| | | | |
|---|---|---|---|
| 2004/0120162 A1 | 6/2004 | Tsimerman et al. | |
| 2004/0222433 A1* | 11/2004 | Mazzochette | H01L 25/0753 257/99 |
| 2005/0023551 A1* | 2/2005 | Mizuyoshi | B41J 2/45 257/99 |
| 2006/0214092 A1 | 9/2006 | Kinoshita et al. | |
| 2006/0262514 A1* | 11/2006 | Conner | G02B 27/283 362/19 |
| 2007/0000644 A1 | 1/2007 | Campbell et al. | |
| 2007/0154823 A1* | 7/2007 | Marson | G03F 7/2024 430/30 |
| 2007/0257335 A1* | 11/2007 | O'Brien | H05K 1/053 257/618 |
| 2009/0168395 A1* | 7/2009 | Mrakovich | F21S 8/032 362/84 |
| 2011/0062464 A1* | 3/2011 | Gerhard | H01L 25/0753 257/93 |
| 2011/0188203 A1* | 8/2011 | Smith | F21V 29/02 361/699 |

FOREIGN PATENT DOCUMENTS

| | | |
|---|---|---|
| WO | 2004011848 | 2/2004 |
| WO | 2005091392 | 9/2005 |

\* cited by examiner

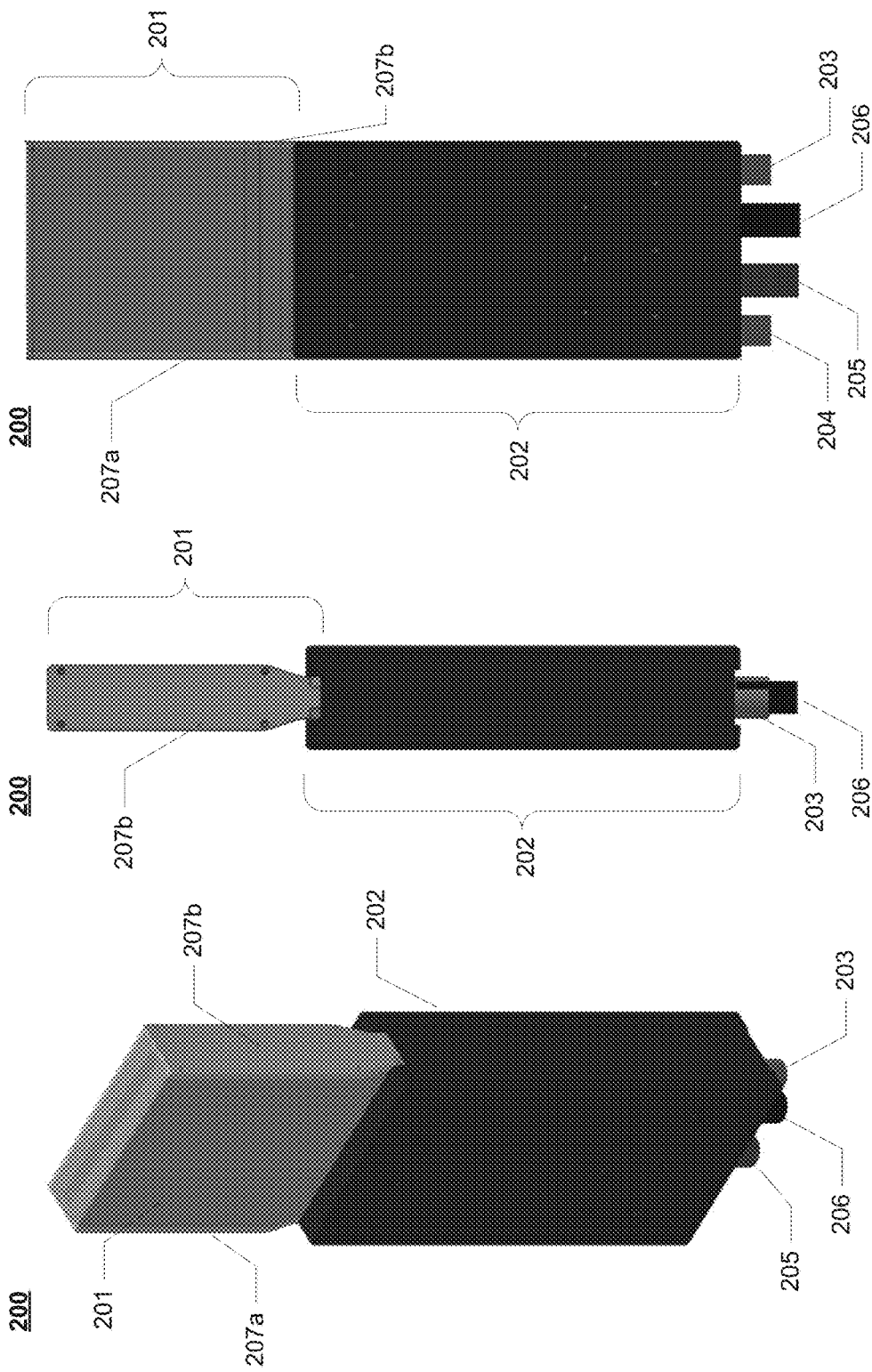

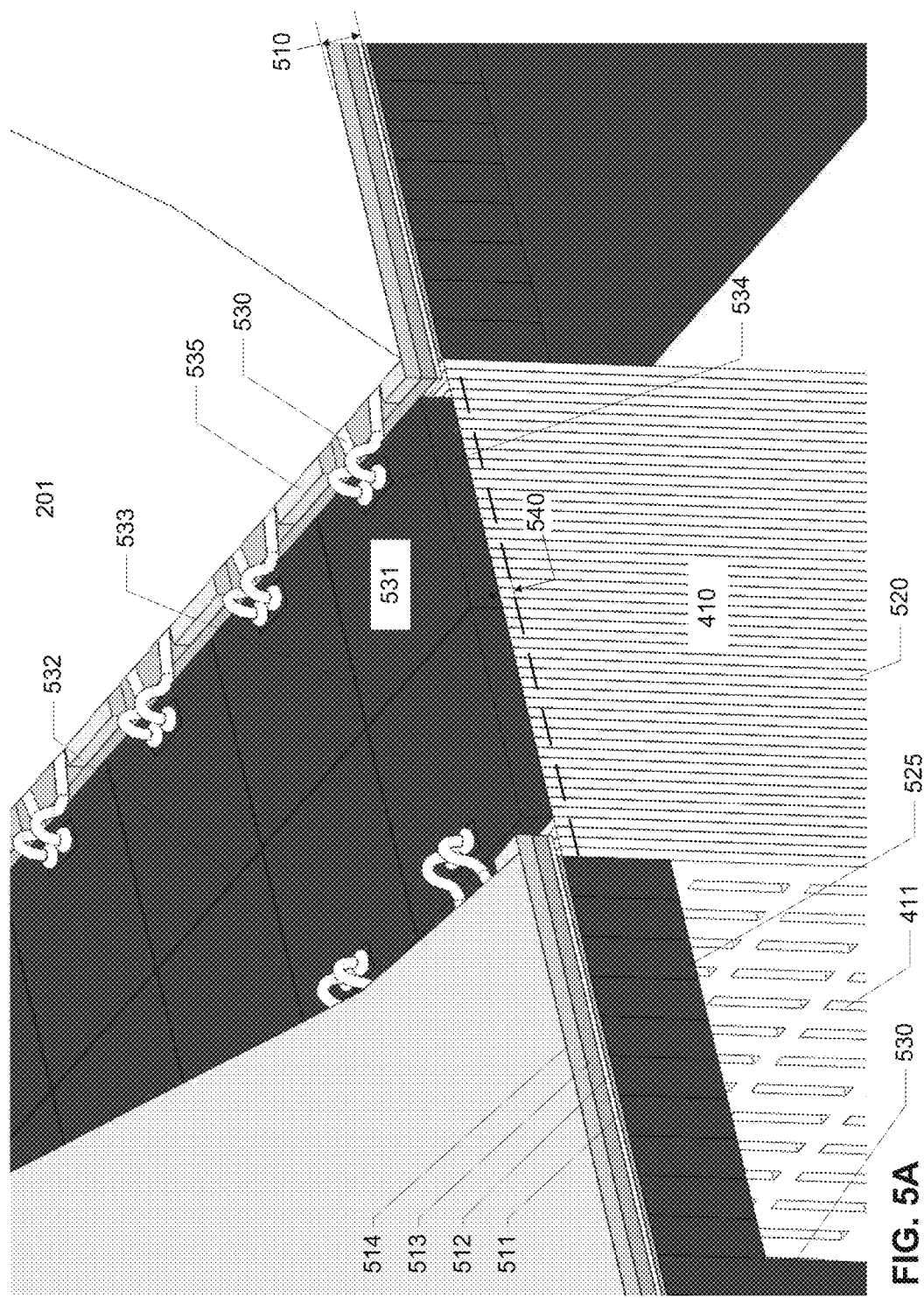

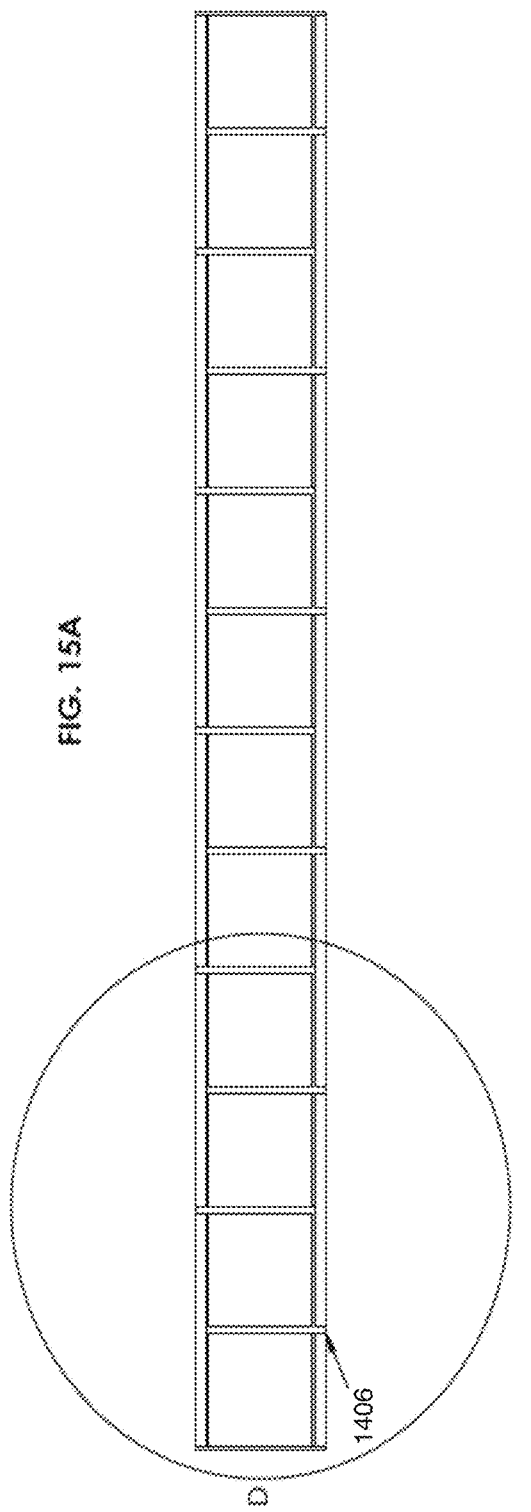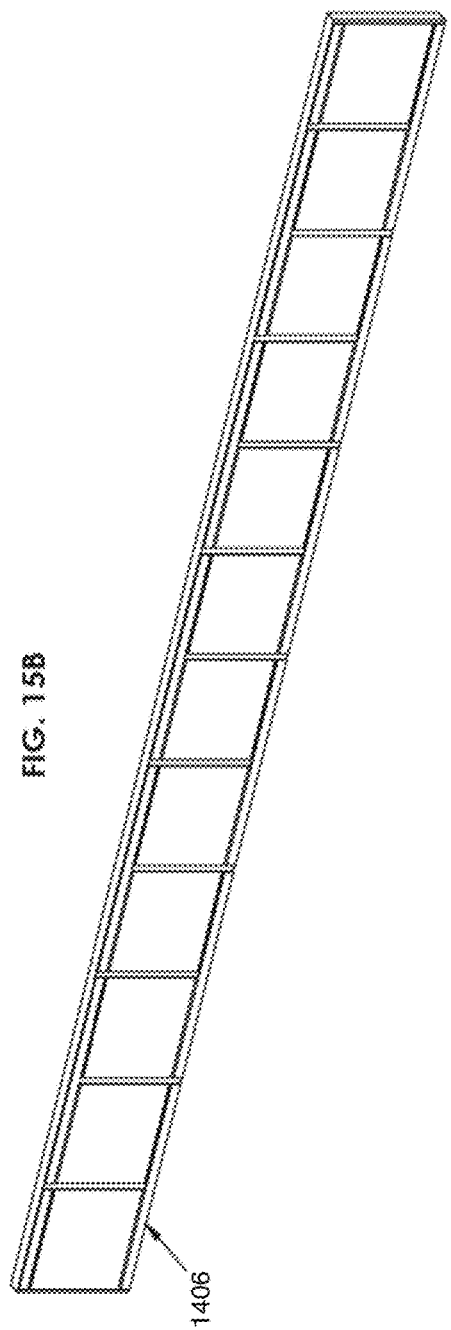

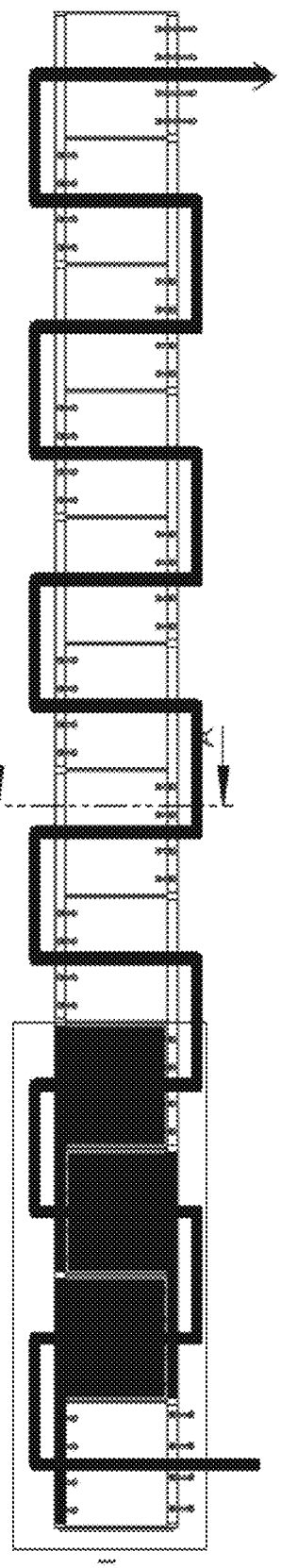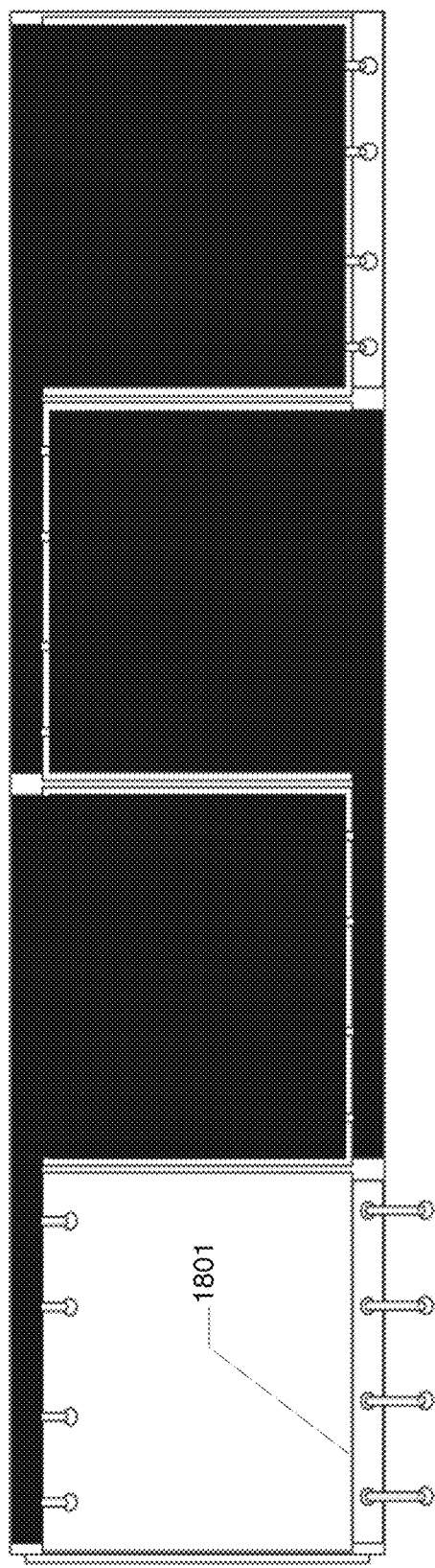

MICRO-CHANNEL-COOLED HIGH HEAT LOAD LIGHT EMITTING DEVICE

CROSS-REFERENCE TO RELATED APPLICATIONS

This application is a continuation of U.S. patent application Ser. No. 13/589,519 filed on Aug. 20, 2012, which is a continuation-in-part of U.S. patent application Ser. No. 13/014,069 filed on Jan. 26, 2011, now U.S. Pat. No. 8,378,322, which claims the benefit of priority to U.S. Provisional Patent Application No. 61/336,979, filed on Jan. 27, 2010; U.S. Provisional Patent Application No. 61/341,594, filed on Apr. 1, 2010; and U.S. Provisional Patent Application No. 61/456,426, filed on Nov. 5, 2010, all of which are hereby incorporated by reference in their entirety for all purposes.

COPYRIGHT NOTICE

Contained herein is material that is subject to copyright protection. The copyright owner has no objection to the facsimile reproduction of the patent disclosure by any person as it appears in the Patent and Trademark Office patent files or records, but otherwise reserves all rights to the copyright whatsoever. Copyright© 2010-2014, Heraeus Noblelight Fusion UV Inc.

BACKGROUND

Field

Embodiments of the present invention generally relate to micro-channel-cooled light emitting diodes (LEDs). In particular, embodiments of the present invention relate to high power density, high fill-factor, micro-channel-cooled ultraviolet (UV) LED lamp head modules that provide high brightness, high irradiance and high energy density.

Description of the Related Art

Today's UV LEDs remain relatively inefficient (typically, operating at about 20% efficiency when operated at high current densities). These inefficiencies result in the production of large quantities of waste heat and therefore require at least air cooling and often liquid cooling (e.g., heat exchangers and/or chillers) to remove the unwanted waste heat, which is a by-product of the electrical to optical conversion process within the p-n junction of the semiconductor device. If the heat is not removed in a very effective and efficient manner, the LED devices may suffer loss of efficiency, decrease in light output and even catastrophic failure.

Liquid-cooled UV LED lamps (or light engines) are currently being used in a variety of curing applications; however, existing systems have several limitations. For example, while industry literature acknowledges the desirability of high brightness/high irradiance arrays, currently available UV LED lamps provide sub-optimal performance. A specific example of a prior art UV LED array is illustrated in FIGS. 1A and 1B. In this example, which is taken from US Pub. No 2010/0052002 (hereafter "Owen"), an alleged "dense" LED array 100 is depicted for applications purported to require "high optical power density". The array 100 is constructed by forming micro-reflectors 154 within a substrate 152 and mounting an LED 156 within each micro-reflector 154. The LEDs 156 are electrically connected to a power source (not shown) through a lead line 158 to a wire bond pad on substrate 152. The micro-reflectors 154 each include a reflective layer 162 to reflect light produced by the associated LED 156. Notably, despite being characterized as a "dense" LED array, LED array 100 is in reality a very low fill-factor, low brightness, low heat flux array in that the individual LEDs 156 are spaced quite some distance apart having a center-to-center spacing of about 800 microns. At best, it would appear the LEDs account for approximately between 10 to 20% of the surface area of LED array 100 and certainly less than 50%. Such low fill-factor LED arrays can create an uneven irradiance pattern that can lead to uneven curing and visually perceptible anomalies, such as aliasing and pixelation. Additionally, the micro-reflectors 154 fail to capture and control a substantial amount of light by virtue of their low angular extent. Consequently, array 100 produces a low irradiance beam that rapidly loses irradiance as a function of the distance from the reflector 154. It is to be further noted that even optimally configured reflectors would not make up for the low brightness of LED array 100 as the ultimate projected light beam onto the work piece can never be brighter than the source (in this case LED array 100). This is due to the well-known conservation of brightness theorem. Furthermore, Owen also teaches away from the use of macro-reflectors due to their size and the perceived need to have a reflector associated with each individual LED 156.

The aforementioned limitations aside, the relatively large channel liquid cooling technology employed in prior-art cooling designs is not capable of removing waste heat from the LEDs in a manner that would be effective in keeping junction temperatures adequately low when the current per square millimeter exceeds approximately 1.5 amps.

Oxygen inhibition is the competition between ambient oxygen reacting with the cured material at a comparable rate as the chemical cross-linking induced by the UV light and photoinitiator (PhI) interaction. Higher irradiance is known to create thorough cures more rapidly and higher irradiance is known to at least partially address oxygen inhibition issues. Ultra high irradiance is now thought to perhaps overcome oxygen inhibition issues in certain process configurations perhaps even without a nitrogen cover gas. However, to produce ultra high irradiance to overcome oxygen inhibition, the heat flux removal rate needed to keep junction temperatures adequately low in such a high fill-factor LED array environment operating at extremely high current densities and is simply not attainable with currently employed UV LED array architectures and UV LED array cooling technologies.

SUMMARY

Micro-channel-cooled UV curing systems and components thereof are described that are configured for photochemical curing of materials and other high-brightness applications. According to one embodiment a lamp head module is provided with an array of light emitting devices (LEDs) and a submount. The array has a high aspect ratio in which a length of the array is greater than a width of the array. The LEDs are closely spaced to create a high fill factor. The array includes multiple groups of electrically seriesed LEDs that are connected in electrical parallel. The submount is of monolithic construction and includes multiple L-shaped patterned circuit material layers. Each of the L-shaped patterned circuit material layers includes an arm portion and a stem portion. The arm portion functions as an LED bond pad and the stem portion functions as both a wire bond pad and a circuit trace. Each LED of a group of electrically seriesed LEDs is affixed to a corresponding arm portion of the submount. The stem portions are located substantially external to an area defined by the length and width of the array, run substantially parallel to the length of the array and collectively perform a primary current carrying function for current flow between adjacent LEDs of a group of electrically seriesed LEDs.

In another embodiment, a lamp head module includes an array of light emitting devices (LEDs) and a pair of optical macro-reflectors. The array has a high aspect ratio in which a length of the array is greater than a width of the array. The pair of optical macro-reflectors direct photons emitted by the array and produce a beam pattern having a top hat profile on a surface of a workpiece.

In yet another embodiment, a lamp head module includes a lamp body, a power source, a high brightness and high aspect ratio array of light emitting devices (LEDs), a submount and a flex circuit. The power source includes an anode output connection and a cathode output connection. The array has a light emitting surface. The submount is configured to electrically couple a multiple LEDs of the array in electrical series and includes multiple LED bond pad areas and multiple wire bond areas. The flex circuit is mounted to the lamp body and has a high aspect ratio in terms of its length and height. The flex-circuit has formed therein a locating aperture within which the submount is mounted and includes opposite electrical polarity conductive patterned layers including an anode layer and a cathode layer. A first end of the flex-circuit exposes a first portion of the anode layer to form an electrical connection with the anode output connection of the power source and exposes a first portion of the cathode layer to form an electrical connection with the cathode output connection of the power source. A second end of the flex-circuit exposes a second portion of the anode layer, which is electrically coupled to an LED bond pad area associated with a first LED of a group of electrically seriesed LEDs. The second end of the flex-circuit exposes a second portion of the cathode layer, which is electrically coupled to a cathode portion of a wire bond area that is associated with a last LED of the group.

Other features of embodiments of the present invention will be apparent from the accompanying drawings and from the detailed description that follows.

BRIEF DESCRIPTION OF THE DRAWINGS

Embodiments of the present invention are illustrated by way of example, and not by way of limitation, in the figures of the accompanying drawings and in which like reference numerals refer to similar elements and in which:

FIG. 2A is an isometric view of a UV LED lamp head module in accordance with an embodiment of the present invention.

FIG. 2B is a front view of the UV LED lamp head module of FIG. 2A.

FIG. 2C is a side view of the UV LED lamp head module of FIG. 2A.

FIG. 5A is a further magnified isometric cut-away view illustrating an LED array and its interface with a common anode substrate layer of the UV LED lamp head module of FIG. 2A.

FIG. 15A is a top view of a submount in accordance with an embodiment of the present invention.

FIG. 15B is an isometric view of the submount of FIG. 15A.

FIG. 18A conceptually illustrates a power path of a group of electrically seriesed LEDs in accordance with an embodiment of the present invention.

FIG. 18B is a magnified view of the first 4 LEDs of the group of electrically seriesed LEDs of FIG. 18A.

DETAILED DESCRIPTION

Figure 1A:
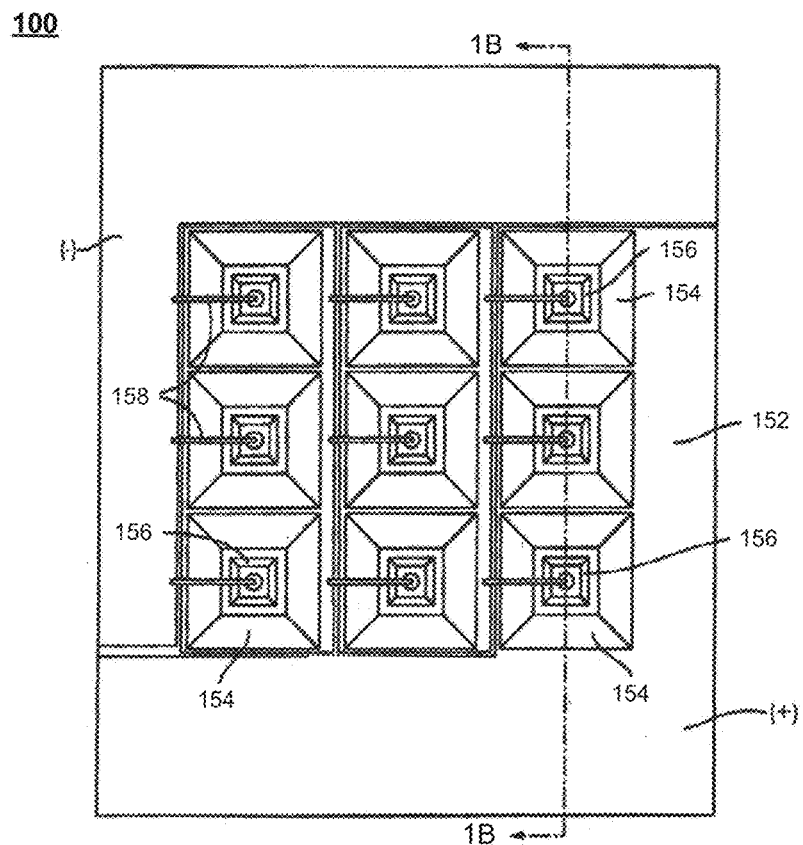
FIG. 1A is a top view of a portion of a prior art LED array.
Figure 1B:
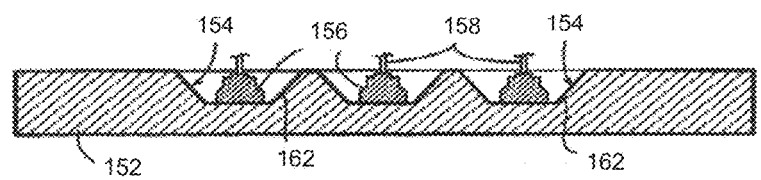
FIG. 1B is a view of the LED array of FIG. 1A taken along section line 1B-1B.

Micro-channel-cooled UV curing systems and components thereof are described that are configured for photochemical curing of materials and other applications requiring high fill-factor, high current density and high-brightness attributes (which ultimately leads to the attribute of high-irradiance). According to one embodiment of the present invention, LEDs of a high fill factor LED array of an ultra high irradiance UV curing system are placed in series/parallel with one or more groups of LEDs in series run by a corresponding power source. For example, multiple groups of LEDs in series can be run by a single power source, each group can be run by its own power source or a combination thereof. UV curing systems can provide a wide range of wave lengths from 100 nanometers to 10,000 nanometers.

According to embodiments of the present invention, in order to accommodate the heat flux/thermal demands of a high fill-factor, high current density and high-brightness UV LED lamp head module, practical means to achieve isothermal substrate behavior are also provided. According to one embodiment, an LED array is directly bonded to a micro-channel cooler and the coolant flows across and underneath the LED array in a direction substantially parallel to the shortest dimension of the LED array. In one embodiment, coolant flow through micro-channels running beneath the LEDs is approximately equal (e.g., balanced) so that the p-n junctions of the LEDs of the LED array are substantially isothermal. In one embodiment, the high aspect ratio substrate is substantially isothermal from side to side and end to end. This may be achieved through the use of a substantially copper micro-channel cooler having micro-channels that direct the coolant flow under the LED array in a substantially lateral direction to the longitudinal axis of the LED array, while maintaining a tight flow balance range between each channel. In one embodiment, this flow balance is achieved by designing the primary coolant inlet and exit coolant fluid channels that run parallel to the longitudinal axis of the LED array to reach a level of pressure drop that is nearly homogeneous along their length.

In various embodiments, a multi-layer flex-circuit, bonded to a micro-channel cooler, is used to power groups of LEDs of an LED array so as to allow a pair of macro-non-imaging-optical reflectors to be positioned in close proximity to the LED array, which thereby maintains irradiance by maximizing the number of emitted photons that are controlled by the reflector pair.

In some embodiments, the LED array is driven by an AC/DC power supply (sometimes referred to as a rectifier) available from General Electric (GE) of Niskayuna, N.Y. and preferably has a high voltage swing, whereas the typical 48V DC output has a range of 1% or so. For example, in one embodiment, a power supply having a voltage swing of approximately +/−20 to 25% while still maintaining high efficiency (e.g., approximately 97% or more), compactness and low cost is used. GE-Lineage of Plano, Tex., makes a range of 12, 24 and 48V AC-DC power supplies that are high MTBF and highly efficient and are intended primarily for the data storage and telecommunications industries. Embodiments of the present invention advantageously employ a preferably 48V "large voltage swing" model, e.g., the CP2000, that can efficiently output a range of user selected output voltages below and above the nominal 48V. Most power supplies do not have this large voltage swing feature—especially OTS, efficient, and cost effective. The voltage can be user selected through a +/−5V input. This voltage swing ultimately allows for easy control of the optical power emitted by the LED array.

In some embodiments, factory and/or field replaceable macro-reflectors are employed, which may be customized for particular applications by providing different performance characteristics (e.g., high-irradiance, highly focused; short working distances to focused, long working distances; applications requiring large depth of focus while maintaining high-irradiance; and very wide-angle, more uniform irradiance applications).

In the following description, numerous specific details are set forth in order to provide a thorough understanding of embodiments of the present invention. It will be apparent, however, to one skilled in the art that embodiments of the present invention may be practiced without some of these specific details.

Notably, while embodiments of the present invention may be described in the context of UV LED systems, embodiments of the present invention are not so limited. For example, other wavelengths outside of the UV range, including deep UV, visible, infrared, microwaves and x-rays, alone or in combination, with one or multiple UV wavelengths, may also benefit from the architecture described herein. Also, varying wavelengths can be used within the same light emitting device lamp to mimic the output of mercury lamps by using UV A, B or C light emitting devices and visible and/or IR light emitting devices. The high fill-factor characteristic of embodiments of the present invention also enables inter-disbursement of the various wavelengths while avoiding pixelation effects on the work piece surface which would likely result in deleterious process effects. Further, in accordance with various embodiments, the wavelength mixing within the macro-non-imaging-optical reflectors result in a uniform (non-pixelated) output beam from both a power density and wavelength mixing standpoint.

For sake of brevity, embodiments of the present invention may be described in the context of LEDs having the anode side on the bottom, those of ordinary skill in the art will recognize that the anode side could be on the top surface and/or both anode and cathode contacts could be on the top or the bottom. As such, references to anodic/cathodic structures herein could be reversed (or could be electrically neutral) depending upon the particular implementation. Similarly, flip chip no wire bond LEDs, conductive substrate and non-conductive substrate LED chips (such as those with the EPI layer on sapphire, aluminum nitride, silicon, zinc oxide or gallium nitride (GaN)), arrays and/or packaged devices may be considered. The EPI layer could be selected from the group of nitrides, oxides, silicides, carbides, phosphides, arsenides, etc.).

Terminology

Brief definitions of terms used throughout this application are given below.

The phrase "average irradiance" generally refers to the irradiance value across a width of an output beam pattern projected on a work piece wherein the irradiance value falls to essentially zero on each side of the output beam pattern. In embodiments of the present invention, at 2 mm from the window, a UV LED lamp head module produces average top hat irradiance of approximately 80 W/cm$^2$ (range 8-800 W/cm$^2$). In embodiments of the present invention, at 53 mm from the window, a UV LED lamp head module produces average irradiance of approximately 10 W/cm$^2$ (range 5-50 W/cm$^2$). In embodiments of the present invention, at 5 mm from the window, a UV LED lamp head module produces average irradiance of approximately 32 W/cm$^2$ (range 10-100 W/cm$^2$) with an output beam pattern having a width of approximately 8 mm and a "top hat" profile. In other embodiments, at 65 mm from the window, a UV LED lamp head module produces average irradiance of approximately 7 W/cm$^2$ (range 1-20 W/cm$^2$) with an output beam pattern having a width of 25 mm and a "top hat" profile. In other embodiments, at 170 mm from the window, a UV LED lamp head module produces average irradiance of approximately 7 W/cm$^2$ (range 0.5-10 W/cm$^2$) with an output beam pattern having a width of 50 mm and a "top hat" profile. In some embodiments, an asymmetric top hat profile (tilted top hat) and output beam pattern having a width of 25 mm may also be produced at 65 mm from the window with a peak irradiance of approximately 8 W/cm$^2$ (range 1-20 W/cm$^2$).

The terms "connected," "coupled," "mounted" and related terms are used in an operational sense and are not necessarily limited to a direct connection, coupling or mounting.

The phrase "diffusion bonding" generally refers to a method of joining metals similar to welding, but relies only on the surface diffusing into one another as a means of "welding." For example a diffusion bonding process may bond layers of usually substantially similar materials by clamping them together, sometimes with an oxidation inhibiting plating such as nickel, and subjecting the layers to extremely high temperatures of around 1,000 degrees C. (range 500-5,000 degrees C.), and thereby molecularly intermixing the surfaces and forming a substantially monolithic material wherein the grains are intermixed and often the bond-line is substantially indistinguishable from the bulk material, and the properties of the diffusion bonded materials do not differ substantially from bulk non-diffusion bonded materials in terms of thermal conductivity and strength. Diffusion bonding could have some similarities to sintering. Thin layers of silver plating on the order of microns may also be employed to facilitate the ease of bonding of the layers. This later process may have some similarities to soldering.

The phrase "directly mounted" generally refers to a mounting in which no substantial intervening and/or thermally impeding layer is introduced the two things being attached or affixed. In one embodiment, an LED array is mounted to a common anode substrate provided by a surface of a micro-channel cooler with a thin solder layer. This is an example of what is intended to be encompassed by the phrase "directly mounted." So, the LED array would be considered to be directly mounted to the common anode substrate. Examples of thermally impeding layers would include bulk substrate material, foil, thin-film (dielectric or conducting), or other material (other than a thin solder layer) introduced between the two things being attached or affixed.

The phrase "high irradiance" generally refers to an irradiance of greater than 4 W/cm$^2$. According to embodiments of the present invention, peak irradiance levels achievable are approximately on order of magnitude to several orders of magnitude beyond the levels of current state-of-the-art UV LED curing systems while maintaining both high efficiency and long life of the LEDs. As described further below, in accordance with various embodiments, the irradiance on the work piece is substantially devoid of deleterious pixelation and/or gaps found in current UV LED curing systems. Meanwhile, it is to be noted most UV LED lamp manufacturers measure peak irradiance at the window, whereas in various embodiments described herein it is measured at the work piece surface. Measurements at the window are essentially meaningless as the work piece is not typically located at the window.

The phrase "high fill-factor LED array" generally refers to an LED array in which the LEDs are closely spaced and the light emitting area (active region) exceeds 50% (often exceeding 90%) of the area (length×width) of the LED array. Depending upon the particular implementation, the fill factor of an LED array may be greater than 60%, 70%, 80%, 90% or 99%. In one embodiment of the present invention, LEDs within LED arrays are spaced less than 20 microns edge-to-edge and in some instances 10 microns edge-to-edge, with a range of edge-to-edge distances from 1-100 microns (zero micron spacing could be considered for a completely monolithic LED). Both inorganic as well as substantially organic LEDs are contemplated.

The phrases "in one embodiment," "according to one embodiment," and the like generally mean the particular feature, structure, or characteristic following the phrase is included in at least one embodiment of the present invention, and may be included in more than one embodiment of the present invention. Importantly, such phrases do not necessarily refer to the same embodiment.

The term "irradiance" generally refers to the radiant power arriving at a surface per unit area (e.g., watts or milliwatts per square centimeter (W/cm$^2$ or mW/cm$^2$).

The phrase "light emitting area" generally refers to an active region or the epitaxial region of a light emitting device or array.

The phrase "light emitting device" generally refers to one or more light emitting diodes (LEDs) (emitting substantially incoherent light) and/or laser diodes (emitting substantially coherent light) whether they be edge emitters or surface emitters. In various embodiments of the present invention, light emitting devices may be packaged or bare dies. A packaged die refers to a device that not only consists of the bare die, but usually also consists of a substrate to which the die is mounted (usually soldered) to facilitate the traces for electrical in and out current paths, as well as thermal paths, and usually a means for attaching a lens and/or reflectors, an example of which would be the Lexeon Rebel available from Philips, USA. Bare light emitting devices could have a vertical structure or a horizontal structure and have an electrically conductive substrate or a non-conductive substrate. According to one embodiment, bare light emitting device dies (i.e., dies excised directly from wafers that have epitaxial grown p-n junctions) are bonded (usually soldered) directly (without an additional significantly thermally impeding layer) to at least one diffusion bonded layer of a high thermal conductivity material (selected from the group of copper, Glidcop, BeO, Si, GaN, AlN, $Al_2O_3$, Al, Au, Ag, graphite, diamond and the like), which is in itself, in various embodiments of the present invention, usually a layer of a multi-layer laminate forming a monolithic diffusion bonded micro-channel cooler structure. The laminate does not necessarily have to be diffusion bonded as the bonding process could be selected from soldering, brazing, gluing, etc. In other embodiments, a submount may be used. LEDs include flip chip no wire bond LEDs, conductive substrate and non-conductive substrate LED chips (such as those with the EPI layer on sapphire, aluminum nitride, silicon, zinc oxide or gallium nitride (GaN)), arrays and/or packaged devices.

The phrase "light emitting diode" or the acronym "LED" generally refer to a semiconductor device containing a p-n junction (the junction between a p-type semiconductor and an n-type semiconductor) designed to emit specific narrow band wavelengths within the electromagnetic spectrum via a process known as electroluminescence. In one embodiment, an LED emits incoherent light.

The phrase "low fill-factor LED array" generally refers to an LED array in which the LEDs are sparsely arranged and do not exceed approximately 50% of the surface area of the LED array.

The phrase "low irradiance" generally refers to an irradiance of around 20 $W/cm^2$ or less. UV LED systems rated at less than 4 $W/cm^2$ are not typically sufficient for most curing applications other than pinning (e.g., ink setting).

The term "macro-reflector" generally refers to a reflector having a height of greater than or equal to 5 mm. In some embodiments, macro-reflectors may range from 5 mm to over 100 mm.

The term "optical power density" generally refers to a measure of optical power per unit area. One measure of optical power density may be determined by measuring optical power at the surface of photon emitting areas of an LED array and determining a ratio of photon emitting areas to non-photon emitting areas (dead areas) for the LED array. In one embodiment, the optical power density at the emitting surface of the LED array is at least 100 $W/cm^2$. Depending upon the particular implementation, the optical power density may range from 1-10 $W/mm^2$.

If the specification states a component or feature "may", "can", "could", or "might" be included or have a characteristic, that particular component or feature is not required to be included or have the characteristic.

The phrase "patterned circuit material layer" generally refers to a layer of electrically conductive material usually containing metal selected from the group of copper, silver, gold, titanium, tungsten, nickel and may also contain electrically conductive polymers that are patterned (e.g., direct or via lithographic means) onto a substrate (e.g., ceramics, dielectrics, semiconductors and/or polymers).

The phrase "peak irradiance" generally refers to the maximum irradiance value across a width of an output beam pattern projected on a work piece. In embodiments of the present invention, at 2 mm from the window, a UV LED lamp head module can achieve a peak irradiance of approximately 84 $W/cm^2$ (range 50-100 $W/cm^2$). In embodiments of the present invention, at 53 mm from the window, a UV LED lamp head module can achieve a peak irradiance of approximately 24 $W/cm^2$ (range 10-50 $W/cm^2$).

The phrases "radiant energy density," "total output power density" or "energy density" generally refer to the energy arriving at a surface per unit area (e.g., joules or millijoules per square centimeter ($J/cm^2$ or $mJ/cm^2$)).

The term "responsive" includes completely or partially responsive.

The phrases "top hat beam cross-section profile," "top hat profile" and the like generally refer to a beam profile which when projected on to a work piece applies a uniform intensity well-defined spot onto the work piece and enables sharp and accurate transitions on the work piece being processed. Top hat profiles may also be asymmetric. For example, between the abrupt boundaries there may be a positive or negative slope or there may be multiple peaks and valleys between the abrupt boundaries.

The phrase "top hat irradiance workpiece pattern," "top hat pattern" and the like generally refer to an irradiance pattern on a workpiece in which higher irradiance values are uniform over some distance with abrupt boundaries on either side as the irradiance decreases to lower or negligible values. This is in comparison to a typical Gaussian or smoothly tapered pattern, where the irradiance falls off from a center peak value more smoothly.

The phrase "total output power" generally refers to the aggregate power in W/cm of output beam pattern length. According to one embodiment, at 2 mm from the window, total output power of approximately 20.5 W per cm of output beam pattern length is produced by each UV LED lamp head module. According to one embodiment, at 53 mm from the window, total output power of approximately 21.7 W per cm of output beam pattern length is produced by each UV LED lamp head module.

The phrase "ultra high irradiance" generally refers to an irradiance of greater than 50 $W/cm^2$ at a work piece. In one embodiment, a UV LED lamp head module can achieve peak irradiance of greater than 100 $W/cm^2$ at short working distances (e.g., ~2 mm with a range of 0.1 to 10 mm). In view of rapidly advancing power output and efficiency of LEDs, it is reasonable to expect peak irradiances achievable to improve by more than an order of magnitude in the coming decades. As such, some of today's high irradiance applications will be accomplished with air-cooled LED arrays and others will take advantage of or be enabled by these higher irradiances for faster, harder or more complete cures and/or use less photoinitiator. Also unique in the context of various embodiments of the present invention is the ability to provide both ultra high peak irradiance, ultra high average irradiance, ultra high total irradiance (dose) and concentration of the dose (as compared to the prior art) that is delivered to the work piece.

The phrase "UV curing process" generally refers to a process in which a photoinitiator (PhI) will absorb UV light first, causing it to go in to an excited state. From the excited state, PhI will decompose into free radicals, which then starts a photo polymerization. However, there is always some amount of oxygen (1-2 mM) in the UV curable formulation. Therefore, the initial free radicals from PhI photo-decomposition will react with oxygen first, instead of reacting with the monomer's double bond of (typically an acrylate), because the reaction rate of PhI free radical with oxygen is about 105 to 106 faster than that of the acylate double bonds. Furthermore, at very early stages of UV curing, oxygen in air will also diffuse into the cured film and also react with the PhI, which results in major oxygen inhibition. Only after the oxygen in UV curable film is consumed can photo-initiated polymerization take place. Therefore, in order to overcome oxygen inhibition, a large amount of free radicals are required at surface of the cured film within a very short period of time; i.e., a high intensity UV light source is required. The absorption of the UV light intensity for a particular formulation depends on the UV light wavelength. Mathematically, the absorbed UV light intensity (Ia) is given by Ia=I0×[PhI], where I0 is a UV light intensity from UV light source and [PhI] is photoinitiator concentration. At the same [PhI] levels, increasing I0 will increase Ia and thereby reduce oxygen inhibition. Stated another way, by using a high I0 light source less [PhI] can used, which is typically the most expensive portion of the formulation. The absorption of UV light follows the well-known Lambert-Beer Law: A (absorption)=$\epsilon$ cd, where $\epsilon$ is the PhI extinction or absorption coefficient, c is the concentration of PhI and d is the thickness of the sample (film to be cured). As seen from the below table, the efficiency of PhI light absorption varies greatly with wavelength. In this case, at 254 nm, the efficiency of absorbing light is 20 times higher than that at 405 nm. Therefore, if the UV LED light intensity at 400 nm can be provided at 100 times typical curing powers at shorter wavelengths (~100 W/cm$^2$), the photoinitiator's efficiency difference in absorption of light can reduce oxygen inhibition.

1.95×104 at 254 nm,
1.8×104 at 302 nm,
1.5×104 at 313 nm,
2.3×103 at 365 nm,
8.99×102 at 405 nm;

FIGS. 2A-C provide isometric, front and side views, respectively, of an ultra-high brightness UV LED lamp head module 200 in accordance with an embodiment of the present invention. According to one embodiment, ultra-high brightness UV LED lamp head module 200 produces ultra-high irradiance. Ultra-high brightness UV LED lamp head module 200 may be used to, among other things, photo polymerize, or cure inks, coatings, adhesives and the like. Depending upon the application, a UV curing system (LED UV emitting system) (not shown) may be formed comprising one or more UV LED lamp head modules 200 and other components, including, but not limited to, LED drivers (internal or external to the UV LED lamp head module 200), one or more cooling systems, one or more main AC/DC power supply systems (e.g., available from Lineage (now, a division of GE of Niskayuna, N.Y.) or Power-One, USA, which are approximately 90% (or even approximately 97%) efficient and weighing about 1 kg.), one or more control modules, one or more cables and one or more connectors (not shown).

According to one embodiment, the high brightness of UV LED lamp head module 200 allows a range of possible optical properties of the output beam (not shown) including: narrow width (e.g., ~0.65 cm (range 0.1 to 2 cm)) with high power density (e.g., ~20.5 W per cm of output beam pattern length (range 10-30 W)), wider widths (e.g., ~3.65 cm (range 3 to 10 cm) with greater depth of focus, or short or long working distances (with or without greater depth of focus), or even very wide angle/large area beam output patterns (with or without greater depth of focus). Output beam patterns with homogenous irradiance (e.g., top hat) across the width of the beam (as well as the length of the beam) pattern may be considered as well as asymmetric irradiance.

As discussed further below, according to embodiments of the present invention, the high brightness results from a high fill-factor (in excess of 50%, and often in excess of 90%) LED array (not shown) and the LED array being operated at high electrical power densities, which results in a high irradiance output beam. The high electrical power densities result in high thermal densities (due to electrical to optical conversion loses) that are effectively managed via various novel methodologies that are described in detail below.

Ultimately, the UV LED lamp head module 200 is intended to replace not only the current state-of-the-art UV LED lamps, but also the current state-of-the-art mercury lamps, due to the uniquely high irradiance and flexible optical output beam properties that a high brightness source allows. UV LED lamp head module 200 is also considered to be a "green technology" as it contains no mercury, and is also electrically very efficient. This efficiency is partly derived from the inherent efficiency of LEDs compared to mercury containing lamps, but also derived in part from cooling methodologies, which are described below, that provide for very low thermal resistance between the LED junctions and the cooling fluid (introduced into the UV LED lamp head module 200 via inlet cooling tube 203 and evacuated from the UV LED lamp head module 200 via outlet cooling tube 204), thereby creating low junction temperatures that are needed for highly efficient and long life operation of LED devices.

In this depiction, a housing 202 and a reflector 201 of the UV LED lamp head module 200 are illustrated. According to various embodiments, the housing 202 of the UV LED lamp head module 200 is approximately 80 mm in length× 38 mm in width×125 mm in height. The length of the novel easily swappable and field-replaceable reflector 201 that is chosen for a given application would be substantially in the range of tens to hundreds of millimeters in length, but such reflectors are typically about 100 mm in length, and provide working distances in the range of 0-1000 mm, but typically between 2 mm to 65 mm, inclusive.

According to embodiments of the present invention, UV LED lamp head module 200 is designed to be used stand alone or serially in combination with one or more other UV LED lamp head modules. As described further below, multiple UV LED lamp head modules 200 are easily configured serially in length from one head (module) (e.g., 80 mm), to perhaps 100 heads (modules), for example, with a length of 8,000 mm. Multiple UV LED lamp head modules 200 could also be configured serially in width. According to one embodiment, a unique feature of a length-wise serial combination of UV LED lamp head modules 200 is that the output beam does not contain a substantially discernable loss of irradiance at each interface point at which the heads (modules) are butted up against each other serially end-to-end to make a long output beam pattern at the work piece surface even in short working distance (e.g., ~2 mm) applications.

As described in further detail below, in one embodiment, reflector 201 is factory swappable and preferably also field replaceable. The reflector 201 may be machined from aluminum and polished, cast, extruded metallic or polymer, etc., or injection molded. The reflector 201 could have silver coatings and could have a dielectric stack of coatings. The reflector 201 could have a single layer protective dielectric coating using deposition processes (e.g., ALD, CVD, sputtering, evaporation, sol-gel). The reflector 201 could be mechanically or electrolytically polished. It is contemplated that multiple UV LED lamp head modules 200 may often need to be placed end-to-end in long length applications, like wide-format printing. In these cases, it is desirable that the projected and/or focused beam created by the reflector 201 has nearly uniform irradiance along the entire beam path, especially in the areas between the end-to-end configured UV LED lamp head modules 200 and/or LED arrays, so that the coatings, inks, adhesives, etc. of the work piece are uniformly cured. It should be noted that due to the high irradiances provided by embodiments of the present invention coating and inks, etc., may have substantially less photoinitiator in them or essentially no photoinitiator and cure in a similar matter to E-beam in that electromagnetic energy is supplied in a sufficient dose to cure the material without the aid of any appreciable photoinitiator.

In various embodiments, the irradiance of the UV LED lamp head module 200 can be in excess of 100 W/cm$^2$ in short working distance (e.g., ~2 mm) applications, such as inkjet printing, to in excess of 25 W/cm$^2$ in long working distance (e.g., 50 mm +) applications, such as clear coat curing. According to one embodiment, the beam widths can vary, to meet a variety of applications and operating conditions, from around 1 mm wide to 100 mm wide or more, and the length, as stated previously can be as short as the width of one head (module) (e.g., 80 mm) to as long as 100 heads (modules) (e.g., 8,000 mm) or more. It should be noted that the length of the beam could be shorter than the length of the UV LED lamp head module 200 if focusing reflectors or optics were so employed to affect this beam shape. Curved or extended end caps may also be considered. External refractive or diffractive optics are also contemplated. Depending upon the particular implementation, the length of the UV LED lamp head module 200 could range from tens to hundreds of millimeters in length. The LEDs could range from approximately 0.3 mm$^2$ to 4 mm$^2$ or more and they could be rectangular, oriented in single long rows, multiple long rows or monolithic.

Figure 3A:
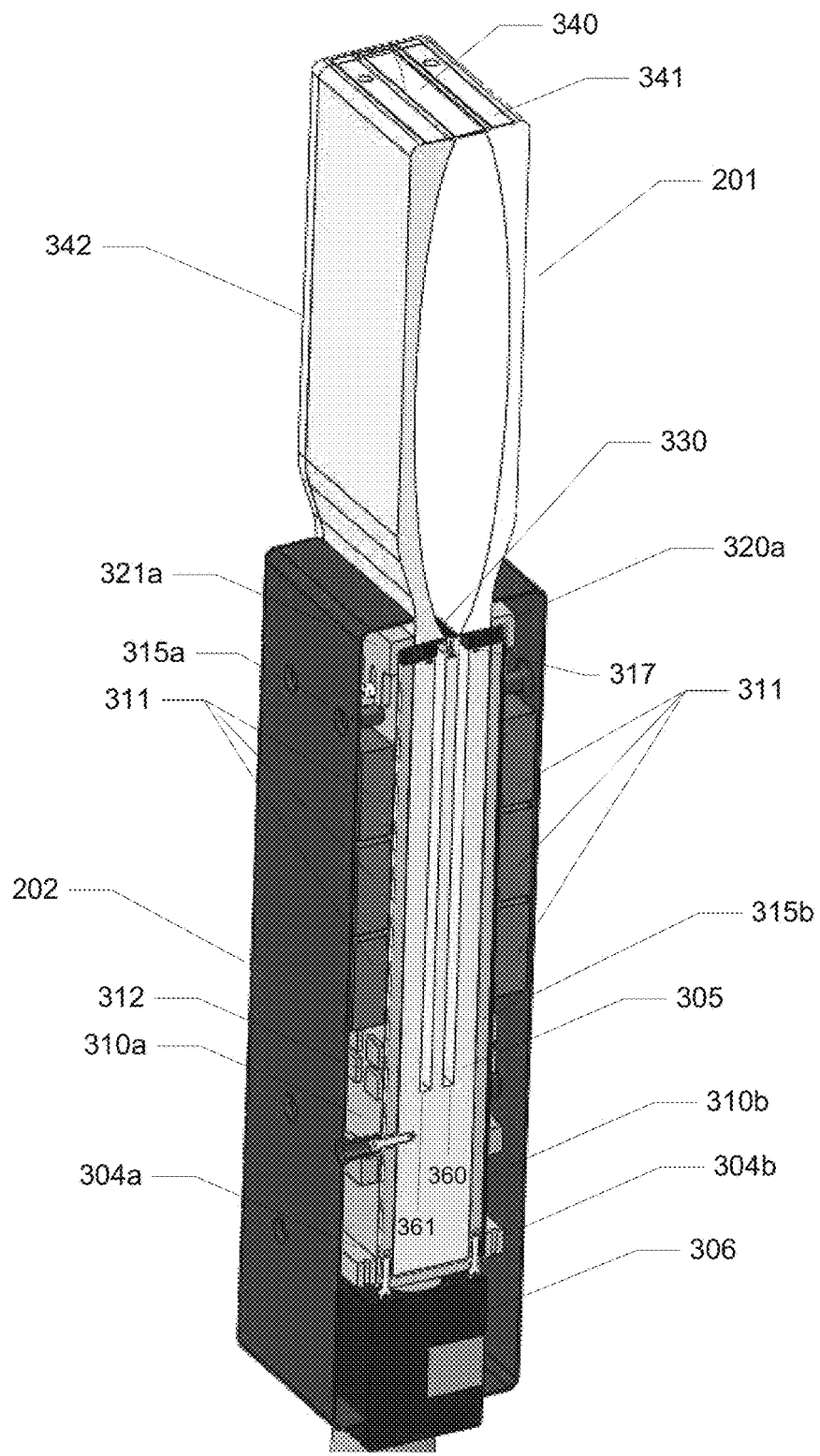
FIG. 3A is a top-level isometric cut-away view of the UV LED lamp head module of FIG. 2A.

According to embodiments of the present invention, the efficiency of the LED array 330 of FIG. 3A is usually well in excess of 10-20%, and the overall system efficiency (including heat exchanger or chiller, pump, and power supply losses, is usually well in excess of 5-10%). In the future, efficiencies of over 50% are contemplated.

Returning briefly to the inlet cooling tube 203 and the outlet cooling tube 204, these may constructed of, for example, extruded polyurethane, vinyl, PVC (available from Hudson Extrusions, USA) and the like and could be ~5/16 inch ID and ~7/16 inch OD. In one embodiment, the tubes 203 and 204 are of a polyurethane with high tensile strength and low moisture absorption. Tube fittings available from Swagelok, USA may be employed or fittings from John Guest, USA. Depending upon the usage environment, it may be preferable to use more than one inlet cooling tube 203 and outlet cooling tube 204, such as perhaps ~4 smaller inlet lines and ~4 smaller outlet lines (not shown). This may make for a less cumbersome unit with smaller bend radiuses and may allow slightly more evenly distributed coolant flow through the micro-channel cooler (not shown); however, the deep main inlet and outlet channels (not shown) within the UV LED lamp head module 200 essentially eliminate pressure gradients at the point of entrance to and exit from the preferable micro-channel cooler channels (not shown). In one embodiment, coolant enters the UV LED lamp head module 200 via inlet cooling tube 203 at between 1-100 PSI and preferably between approximately 15-20 PSI at a temperature of between about 5-50 degrees Celsius (C) and preferably at about 20 degrees C. and exits via outlet cooling tube 204 at a temperature of between about 10-100 degrees C. and preferably at approximately 24 degrees C.

According to one embodiment, waste heat from various internal components (e.g., LED driver PCBs and LED array) of the UV curing system may be dissipated into the lamp body (not shown) and carried away by coolant flow to a heat exchanger and/or a chiller. An exemplary chiller is available from Whaley, USA. In one embodiment, the chiller utilizes a highly efficient scroll compressor (available from Emmerson, USA). Depending upon the usage model, the chiller may be of the "split" variety in which the reservoir, pump, evaporator and controls are located inside a building housing the UV curing system, and the rest of the components, such as scroll compressor, fan, condenser, etc. are located outside the building (e.g., on the roof or on the side of the building). It should be noted that many or all of the chiller or heat exchanger components may be operated in series or parallel or a combination of both for one or more UV LED lamp head modules 200 and/or supply components. By way of example, one large chiller could be employed for multiple UV curing systems that may have one or more pumps and or reservoirs. An exemplary heat exchanger element for water to air is available from Lytron, USA. Any cooling solution could use a bypass arrangement so that differing pressure or flow rates could go through the evaporator and the micro-channel-cooler simultaneously.

According to one embodiment, the cooling liquid (coolant) comprises water. The coolant may also contain one or more bio-fouling inhibitors, anti-fungicides, corrosion inhibitors, anti-freezing materials (e.g., glycol) and/or nano particles (e.g., alumina, diamond, ceramic, metal (e.g., nano copper), polymer, or some combination) for enhanced heat transfer, and the coolant system could contain membrane contractors, oxygen getters and micron filters. Nano particles, such as titania, excited by UV lamp energy for the dual purpose of enhancing thermal conductivity and/or heat transfer and due to the resulting Photo-Fenton process the elimination of biological materials, such as funguses and the like. Membrane contractors effectively reduce $CO_2$ in the water and help to maintain optimal pH for optimal corrosion resistance of copper micro-channel surfaces.

In one embodiment, a sliding vane pump (available from Fluidotech, Italy) may be employed. It has a flow rate of greater than ~4 GPM and pressure as high as ~60 PSI. This flow rate is well-suited for the micro-channel cooler architecture described in connection with various embodiments of the present invention (e.g., serial connection of 4 or more 80 mm UV LED lamp head modules 200). The pump also is very quiet, compact, long lasting, and efficient, as it only consumes ~0.25 KW. In various embodiments, redundant coolant pumps may be employed to reduce opportunities for a single point of failure. Average flow rate may be approximately 0.75 GPM (range 0.1 to 10 GPM) per lamp head.

Figure 3B:
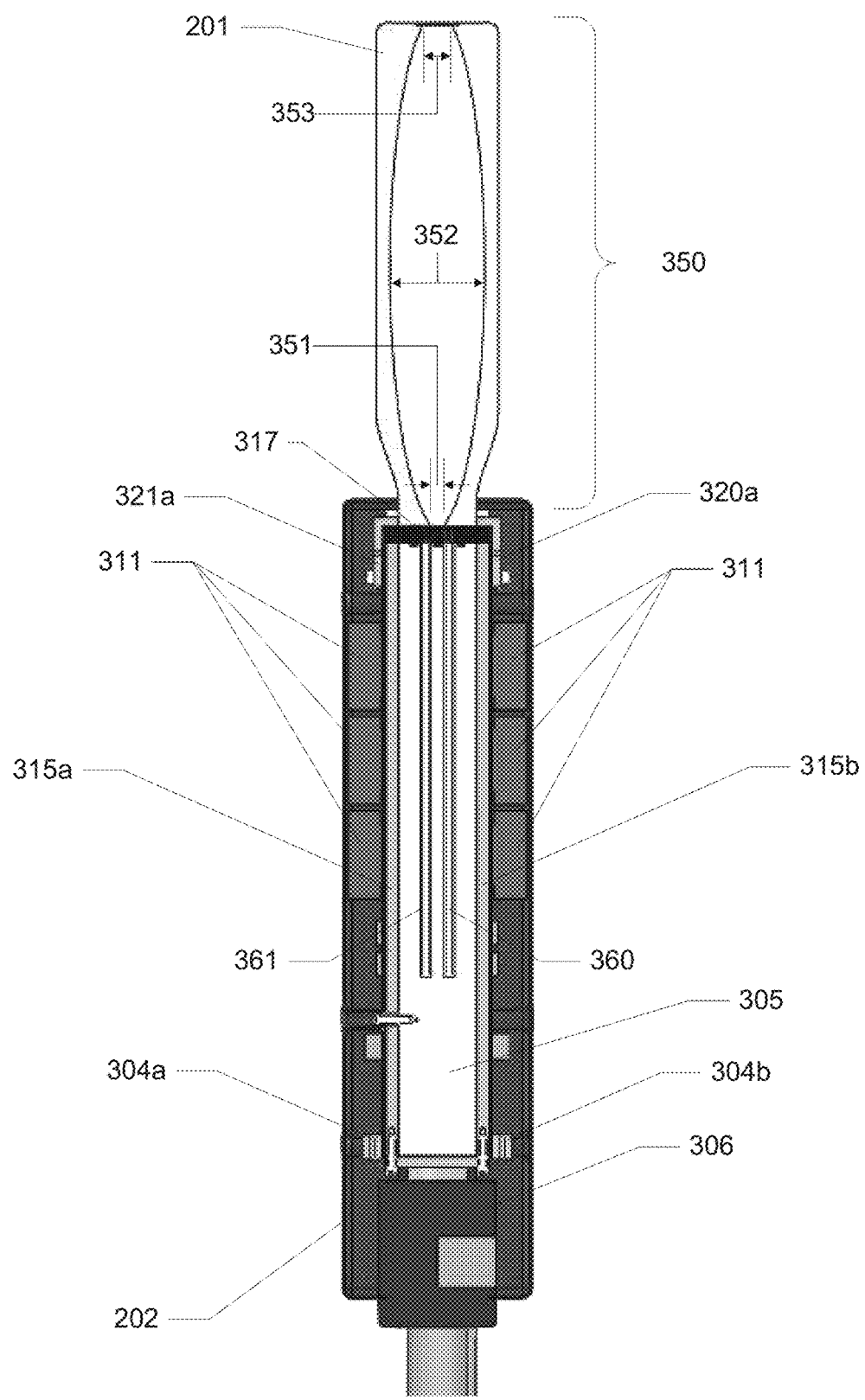
FIG. 3B is a top-level front cut-away view of the UV LED lamp head module of FIG. 2A.

FIGS. 3A-B provide cut-away views of the UV LED lamp head module 200 of FIG. 2A. From these views, it can be seen that an optical reflector layer 350 comprising reflector 201 is mounted to a body 305 enclosed within housing 202. According to one embodiment, body 305 is constructed from copper or a dielectric polymer material (e.g., PEEK; Torlon; LCP; acrylic; polycarbonate; PPS potentially filled with fillers, such as graphite, ceramic, metals, carbon, carbon nanotubes, graphene, nano-sized or micron-sized flakes, tubes, fibers, etc.). Some of these filled resins are available from Cool Polymers of North Kingstown, R.I. The lamp body 305 may be machined with 5-axis milling or injection molded. Alternatively, body 305 may be injection molded and optionally secondarily milled or drilled. As described further below, various components may be mounted directly or indirectly to the body 305, including, but not limited to, the housing 202, the reflector 201, an LED array 330, the micro-channel cooler (preferably forming part of the common anode substrate for the LED array 330), cathode claws 321 and anode bus body 315a-b, and one or more LED driver printed circuit boards (PCBs) 310, which are preferably metal core PCBs (MCPCBs) and the anode bus body 315*a-b* may serve as the metal core of the MCPCBs (a/k/a common anode back plane). Molded or glued thermally conductive pads may be inserted between the MCPCB and the flowing coolant in the outer side walls of the lamp body.

In the present non-limiting example, body 305 has formed therein a main inlet lamp body cooling fluid channel 360 and a main outlet lamp body cooling fluid channel 361 both of which run the length of body 305. The main inlet lamp body cooling fluid channel 360 is in fluid communication with the inlet cooling tube 203 via a first coolant inlet (not shown) formed in the base of the body 305. The main outlet lamp body cooling fluid channel 361 is in fluid communication with the outlet cooling tube 204 via a second coolant inlet (not shown) formed in the base of the body 305. The channels 360 and 361 are sized such that coolant flows substantially uniformly through a micro-channel cooler (not shown) disposed there between. In one embodiment, the first and second coolant inlets may be on opposite ends of the base of the body 305, across from each other, staggered, or some combination thereof to facilitate equal and uniform flow of coolant from the main inlet lamp body cooling fluid channel 360 to the main outlet lamp body cooling fluid channel 361 through the micro-channel cooler. In alternative embodiments, multiple inlet lamp body cooling fluid channels and multiple outlet lamp body cooling fluid channels may be used.

In one embodiment, flow balance through the micro-channel cooler is achieved by designing the primary coolant inlet and exit manifold channels that run parallel to the longitudinal axis of the LED array 330 to reach a level of pressure drop that is nearly homogeneous along their length by extending the channel depth to a point that the coolant pressure differential near the top of the channel (nearest the micro-channel cooler (not shown)) has reached a point of near homeostasis along the entire length of the channel by spreading out from the inlet port, or converging to the exit port by way of a very deep channel. In other words, the exceedingly deep channels 360 and 361 give the coolant sufficient time, hydraulic resistance and surface drag to spread out along the length of the micro-channel cooler and achieve a small pressure differential near the top of each channel therein resulting in balanced flow through each micro-channel under the LED array 330.

According to one embodiment, sub-assembly components of the LED driver PCBs 310, include, but are not limited to, LED driver controller ICs (not shown, which could also be part of a DC/DC converter system), FETs 312, gates (not shown), inductors 311, capacitors (not shown), resistors (not shown) and cathode bus bars 304*a-b*. As indicated above, in one embodiment, the LED driver PCBs 310 are multi-layer metal foil (e.g., copper)/dielectric layers on a metal (core) substrate (e.g., MCPCB) (available from Cofan, Canada) and are coupled (e.g., affixed via screws) to the body 305 with an intervening thermal conduction compound in order to dissipate the waste heat from the driver assemblies into the body 305 where it is carried off by the coolant flow through the main inlet lamp body cooling fluid channel 360 and the main outlet lamp body cooling fluid channel 361. In the present example, the channels 360 and 361 extend deep enough in the body 305 to provide cooling to the area substantially under the FETs 312 and inductors 311, where a significant amount of waste heat is generated. Vias may be used to electrically connect the multi-layer metal foil layers.

In one embodiment, LED driver assembly PCBs 310*a-b*, containing surface mount electrical components and other semiconductor components are at least 90% efficient. Exemplary high current capable and efficient LED driver ICs (not shown) are available from National Semiconductor USA (e.g., part LM 3434 or LM 3433 or a substantially equivalent). Linear and Maxim, USA also make similar parts. LED driver ICs (not shown) are semiconductor junction p-n containing devices, preferably silicon based, that allow the buck conversion of a higher voltage/lower current input to be converted to a lower voltage and higher current amenable to the high current LED driving conditions desired in various embodiments of the present invention. PWM may be employed.

Individual LEDs or groups of LEDs of the LED array 330 are driven by corresponding segments of LED driver PCBs 310*a-b*. For example, 4 groups of 17 LEDs per side of the UV LED lamp head module 200 driven at approximately 3 A (range 0.5 to 30 A) per LED and approximately 4.5-5V (range 2-10V). In such an embodiment, the LED array 330 comprises 68 LEDs in 2 rows of LEDs (136 total), with opposite LED groups electrically driven and/or controlled by corresponding LED driver ICs at around 3A per LED resulting in an approximately 2 kW input per UV LED lamp head module 200. Another non-limiting example would be 16 LEDs in 15 groups×2, which may be driven at approximately 4 V and 40 A per group (range 1-10 V and 1-500 A) and have an input of only approximately 12 V into the LED driver PCBs 310*a-b*.

In some embodiments, due to the high efficiency of the surface mount electrical components and other semiconductor components, custom metal core PCBs (MCPCBs) can be constructed such that they may be affixed, preferably with screws or other means, to the sides of the body 305, and be conduction cooled through the interface material and into the thermally conductive body 305. The waste heat ultimately being removed by the convective transport of the coolant flow through the body 305. For example, two LED driver PCBs 310*a-b*, one on each side of the body 305, may be constructed on a 2.5 mm (range 0.1-10 mm) thick copper core board that has approximately 4-12 mil thermally conductive dielectric material layers (available from Thermagon USA and/or Cofan, Canada). In one embodiment, highly thermally conductive dielectric layers are interposed between copper metal layers (e.g., 1-4 oz. copper foil layers) of the LED driver PCBs 310*a-b*, which are affixed to body 305. Each LED driver PCB 310*a-b* (e.g., ×2) may have 4 electrically isolated cathodic segments corresponding to the locations of the 4 groups of LEDs isolated by flex-circuit sections (4 of which are shown in the cut-away exploded view of FIG. 6—two of which are driven by opposing LED driver PCBs 310*a-b*). In one embodiment, the LED driver PCBs 310*a-b* and the flex-circuit sections are arranged orthogonal to each other. Another non-limiting example is that each side of the body 305 has one LED driver PCB 310*a-b* affixed to each side with 4 separate LED driver controller ICs located on each PCB (8 LED driver controller ICs total, that in sum can be driven up to around 2 kW or more per (e.g., 80 mm long) UV LED lamp head module 200). Again, by affixing the LED driver PCBs 310 to the sides of the body 305, the waste heat from the LED driver PCBs 310*a-b* may be dissipated into the body 305 and carried away by the coolant flow to the heat exchanger or chiller. In one embodiment, a thermally conductive grease or other compound may be placed between the LED driver PCBs 310*a-b* and the body 305. In alternative embodiments, the LED driver PCBs 310*a-b* could be attached to the body 305 in a non-thermally efficient manner and be convectively cooled via fans.

According to one embodiment, a common anode substrate layer 317 is clamped between cathode claws 320*a-d* and 321*a-d* and anode bus body 315*a-b*. A monolithic U-shaped common anode is formed by anode bus body 315*a-b* (which are substantially parallel to each other) and the common anode substrate layer 317 (which is substantially orthogonal to the anode bus body 315*a-b*). In another embodiment, the common anode substrate 317 and the anode bus body 315*a-b* may form a monolithic rectangular or square shaped common anode.

In one embodiment, one surface of cathode claws 320*a-d* and 321*a-d* is substantially parallel to the cathode portion of the common anode substrate 317 and another surface is substantially parallel to a top surface of the LED driver PCBs 310*a-b*, thereby allowing the to make electrical contact between these two layers. Further details regarding the assembly forming the common anode substrate layer 317, including mounting mechanisms for affixing the cathode claws 320*a-d* 321*a-d*, the anode bus body 315*a-b*, are provided below.

In the present example, reflector 201 is a large (macro: e.g., tens of millimeters in height), modular, non-imaging reflector structure having a mid-portion 352 significantly wider than either entrance 351 or exit apertures 353. Such a structure is well suited to printing applications where short stand-off distances (e.g., 2 mm) from the work piece to the reflector 201, and high irradiance (e.g., greater than ~50 $W/cm^2$) are beneficial for high process speed, cure hardness and cure completeness (tack free). According to one embodiment, the entrance aperture of the reflector pair (e.g., entrance aperture 351) has an area that is 110% (range 100-150%) as large an area of the light emitting surface of the LED array.

In one embodiment, reflector 201 captures and controls approximately 90% or more (range 50-99%) of the light emitted by the LED array 330 and each half of the elongate reflector 201 is an ellipse having a focal point on the opposite side of the centerline of the projected optical pattern on the work piece, with the result of increasing the peak irradiance over a traditional shared focal point (along the projected beam centerline) design approach. Compound ellipses or other compound parabolic shapes may also be considered. In one embodiment, reflector 201 is designed to have a high angular extent of approximately 80 degrees (range of 45-90 degrees).

Various embodiments of the present invention seek to produce a high-quality cure (e.g., 100% or nearly so) by producing both high peak irradiance and high total output power (e.g., approximately 184 W per UV LED lamp head module 200) as photo-initiators can be toxic (and expensive) and uncured inks, coatings, or adhesives are undesirable. As noted above, high irradiance results in faster, deeper, and harder cured materials. Consequently, embodiments of the present invention, seek to achieve peak irradiance levels that are approximately ten times (or more) the levels disclosed in current state-of-the-art UV LED (and mercury lamp) curing systems while also maintaining both high efficiency and long life of the LEDs.

According to one embodiment, reflector 201 is easily factory swappable and preferably field-replaceable thereby allowing other reflectors to be attached to the body 305 of UV LED lamp head module 200 for different applications, which might fulfill different process goals/parameters. In the present example, reflector 201 is shown as an elliptical reflector that is of two-part construction, where the two major components are the opposing sides of one or more ellipses. Reflector 201 may be machined on a five-axis mill and then polished with a diamond grit polish or it may be extruded metal and post polished, or it may be extruded polymer without the need for post polishing due to the prior polishing of the mold cavity/extrusion die. As described above, reflector 201 may be of modular design, such that an application, such as ink curing on a flat substrate that demands a narrow projected focal beam "line" of high irradiance (output power density) could use a bolt on ultra-high intensity line generating reflector (not shown), whereas an application on a rough topological substrate that demands a longer depth of field could require a reflector pair (not shown) specifically designed for this longer depth of field (or longer depth of focus) that is easily interchanged with the high intensity reflector pair by simply unbolting the previous reflector pair and bolting the new reflector pair in place as described in more detail below. Similarly, a reflector pair may be specifically configured for long working distance with high intensity or long working distance with a wide area smooth intensity beam pattern (e.g., a top hat beam pattern) on the work piece. Locating pins between the reflector 201 and the common anode substrate layer 317 may be employed.

In one embodiment, the internal surface of the preferably injected molded polymeric reflector 201 is a silver vacuum-deposited coating with an ALD (atomic layer deposition) protective overcoat that is corrosion resistant due to the pin-hole free nature of the ALD process. The silver coating may be deposited using various deposition processes (e.g., ALD, CVD, sputtering, evaporation, sol-gel). As polycarbonate is an inexpensive polymeric reflector resin, a vapor barrier should be placed on the polycarbonate before the silver is deposited so that the side of the silver coating facing the polymeric reflector substrate does not allow corrosive vapor (molecules) to corrode the silver from the inside out. Low vapor permeable resins (e.g., E48R (Zeon Chemicals, USA)) may be considered. High temperature resins like Ultem and Extem are available from Sabic, USA. Also, vapor barriers (e.g., copper, ALD oxide coatings) may additionally be considered and, deposited on the reflector prior to the silver or aluminum coating. The ALD dielectric overcoat is selected from the group of oxides (e.g., $Al_2O_3$) or fluorides (e.g., $MgF_2$) or some combination thereof. Alternatively, an HR coating on the reflector 201 can also be a dielectric overcoated aluminum coating on an injection molded polymeric reflector. The dielectric coating is preferably a single layer magnesium fluoride or silicon dioxide tuned for peak reflectivity around the wavelength that is best suited to the application. A dielectric stack based on optical interference may be employed for any of the above-mentioned configurations to increase peak irradiance in the selected wavelength range.

Embodiments of the present invention may employ secondary optics (not shown) for beam control and/or a window (e.g., a lens) 340 that has an antireflective (AR) coating. The AR coating is preferably a BAAR (broad angle antireflective) coating as the angles emitting from the exit aperture 353 may be in excess of 45 degrees, as such high angles would undergo significant deleterious reflection from the window surface if such a BAAR coating was not used. High UV resistant acrylic for tanning beds could be considered, but borosilicate glass is preferable for window 340 and secondary optics. In one embodiment, a window mount 341 holds window 340 in place as described further below. According to one embodiment, an o-ring (not shown) is situated between the window 340 and reflector 201. In one embodiment, the external housing for the reflector 201 may be injection molded. In various embodiments, an inert gas or micro-porous spheres (available from Zeolite, USA) may be used to control water vapor. This vapor can be an issue for LED longevity should no encapsulant over the LEDs be employed. Current state-of-the-art does not allow for an LED encapsulant (such as high purity silicone) to be employed as yellowing from the high photon energies of the short UV wavelengths is an issue. Silicone encapsulants from Schott (Germany) with low carbon content are known to be the least yellowing in existence at this time.

For purposes of measuring a distance from the window 340 to a work piece surface, it is to be understood that the window 340 has an inner surface (closest to the surface of the LED array 330) and an outer surface (closest to the surface of the work piece). Herein, distances to the work piece are generally measured with respect to the outer surface of the window 340.

Figure 4A:
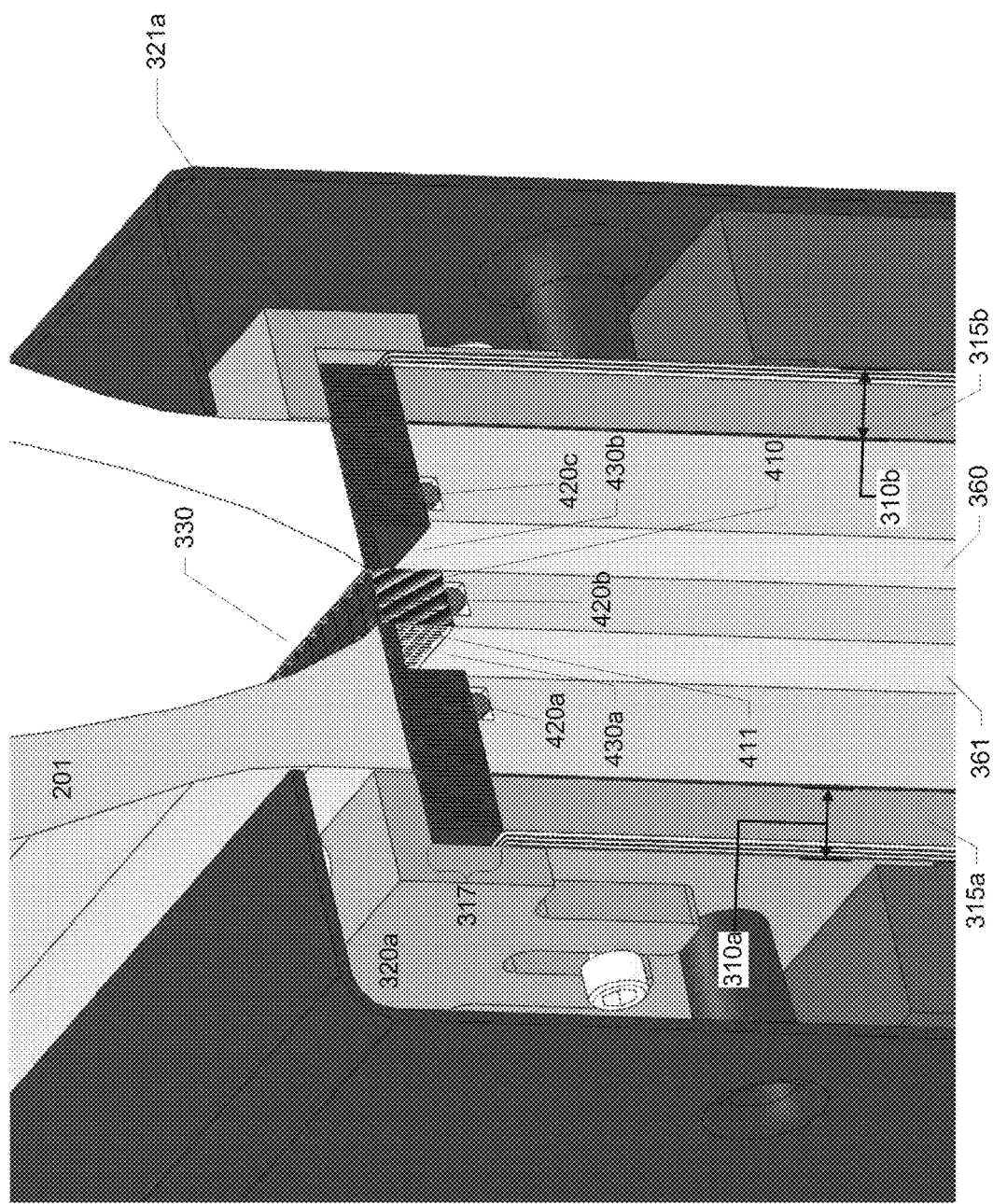
FIG. 4A is a magnified isometric cut-away view of a bottom portion of a reflector and a top portion of a body of the UV LED lamp head module of FIG. 2A.
Figure 4B:
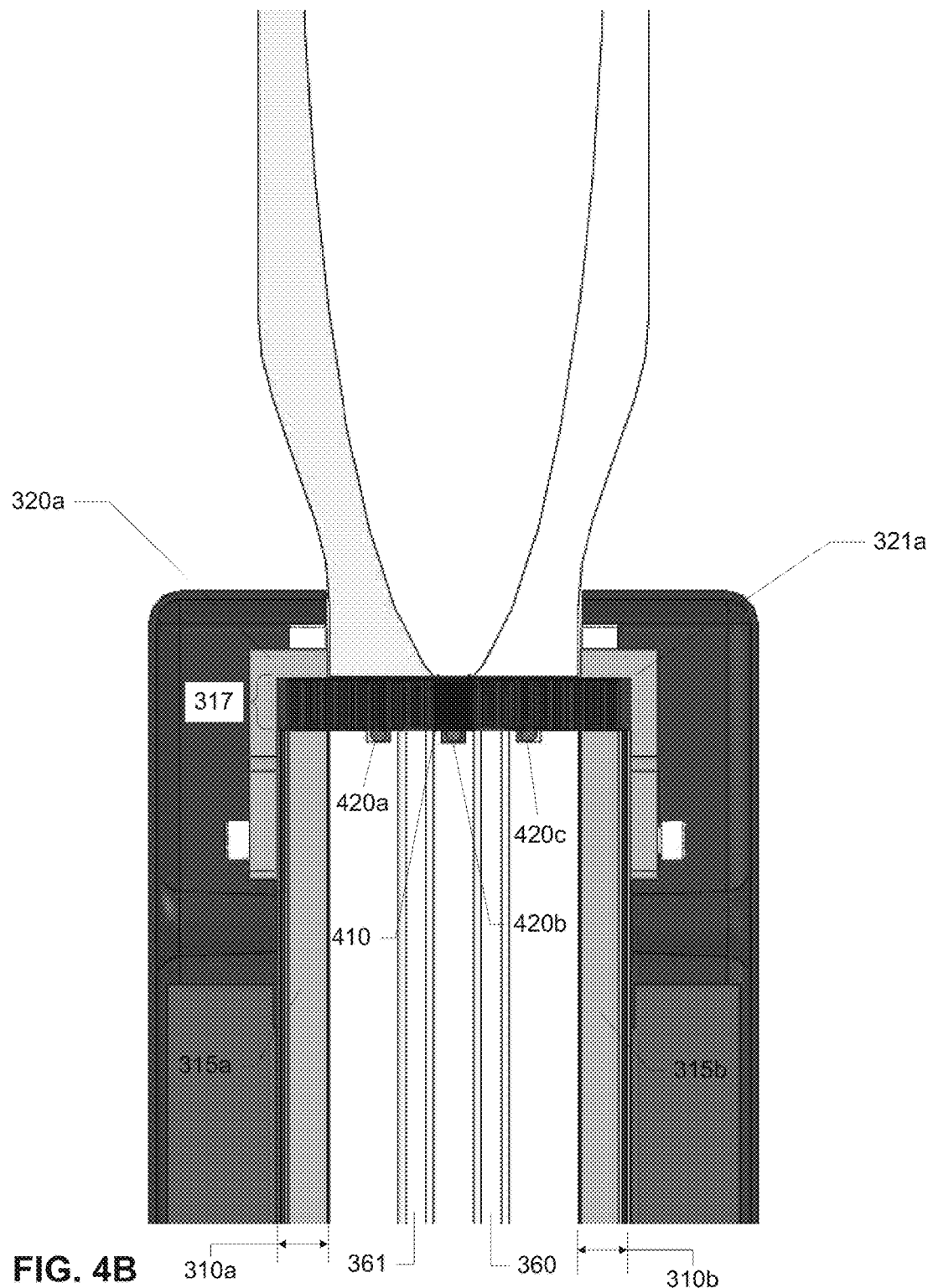
FIG. 4B is a magnified front cut-away view of a bottom portion of a reflector and a top portion of the body of the UV LED lamp head module of FIG. 2A.

FIGS. 4A-B provide magnified cut-away views of a bottom portion of reflector 201 and a top portion of body 305 of the UV LED lamp head module 200 of FIG. 2A. In these views, LED array 330 and various aspects of the common anode substrate layer 317 become apparent. Additionally, in these views, separator gasket 314 is depicted as being formed of a plurality of o-rings 420 and a preferred multi-layer construction of the LED driver PCBs 310*a-b* becomes visible.

As described in further detail below, in one embodiment, a micro-channel cooler 410 provides the common anode substrate layer 317. According to one embodiment, micro-channel cooler 410 is a diffusion bonded etched foil micro-channel cooler including a heat spreader layer (not shown) diffusion bonded to foil layers (not shown) having etched therein various primary inlet/outlet micro-channels 411 and internal micro-channels (not shown). While micro-channel cooling does have a laminar component in which the boundary layer is compressed, in embodiments of the present invention, impingement cooling (e.g., turbulence) may result from etched coolant flow path shape and/or directional changes. An exemplary micro-channel cooler is illustrated by U.S. Pat. No. 7,836,940, which is hereby incorporated by reference in its entirety for all purposes. Micro-channel coolers meeting the cooling requirements described herein are available from Micro-Cooling Concepts, USA. Those skilled in the art will recognize that various other cooling schemes may be employed. For example, macro-channel cooling and other turbulent flow cooling paths (e.g., impingement, jet-impingement) or two-phase/nucleate boiling (or some combination), and cooling schemes may be considered.

According to various embodiments of the present invention, one objective is to create and maintain a relatively isothermal state (e.g., junction temperatures within approximately ±1 degree C. and also generally a maximum average junction temperature of ~40 degrees C. (range 30-200 degrees C.) from end-to-end of the LED array 330. To achieve this objective, embodiments of the present invention attempt to balance coolant flow through the micro-channel cooler 410 from front to back, top to bottom, end to end and/or side to side. In alternative embodiments, the flow may be balanced or imbalanced to accommodate design needs. The coolant may flow through internal primary and secondary channels (not shown) of the micro-channel cooler 410 in virtually any direction, selected from vertical, horizontal, orthogonal, parallel, etc., or any combination thereof, with respect to the bottom surface of, as well as under, the LEDs of the LED array 330. Another way of describing the orientation of the channels is with respect to the p-n junction plane, which is (in most LEDs) substantially parallel to the bottom surface of the LED.

Similarly, the internal primary and/or secondary channels they may be interconnected with virtually any orientation of manifold(s) selected from vertical, horizontal, orthogonal, parallel, diagonal, angular, by-pass, partial by-pass, etc., or any combination thereof, again with respect to the orientation of the bottoms of the LEDs (or the p-n junctions of the LEDs). It is preferable that all, or almost all (near 100%) of the coolant eventually flows from the top portion (e.g., main inlet micro-channel cooler cooling fluid channel 430*b*) of main inlet lamp body cooling fluid channel 360 through the micro-channel cooler 410 to the top portion (e.g., main outlet micro-channel cooler cooling fluid channel 430*a*) of main outlet lamp body cooling fluid channel 361 in a direction that is orthogonal, or perpendicular, to the long-axis of the LED array 330 and/or micro-channel cooler 410. In one embodiment, micro-channel cooler 410 utilizes flow paths optimized by CFD to reduce flow velocities to such a level so as to greatly reduce erosion. In one embodiment, coolant velocities of approximately 2 meters/sec. are preferred to reduce erosion of the channels. Ceramic materials may be used for the channel substrate to even further eliminate erosion potential.

As noted earlier, the main inlet lamp body cooling fluid channel 360 and the main outlet lamp body cooling fluid channel 316 are sized such that the coolant flows uniformly through the etched foil internal micro-channels, and so that preferably nearly all of the coolant eventually ends up running in a substantially perpendicular direction to the long axis of LED array 330, in that any given molecule of coolant that starts in main inlet lamp body cooling fluid channel 360 eventually ends up in the main outlet lamp body cooling fluid channel 361, and so, essentially each molecule of coolant eventually flows substantially perpendicular to the long-axis of LED array 330 (substantially parallel to the short-axis of the LED array 330) as it traverses micro-channel cooler 410 and flows under the LEDs. By making the main inlet lamp body cooling fluid channel 360 very narrow (e.g., approximately 1-4 mm and preferably approximately 2.3 mm) wide and very deep (e.g., approximately 1-10,000 mm and preferably about 100 mm), the resultant hydraulic resistance aids in uniform micro-channel flow in terms of balanced flow through substantially all or most of the internal channels of micro-channel cooler 410, whether or not they be primary, cross, secondary, manifold, etc. channels. It should be understood that these channels could have curves, s-bends, protrusion for turbulence, and perhaps narrow and widen and/or deepen as they traverse the space under LED array 330 in the direction that is substantially lateral or parallel to the short axis of LED array 330. Again, the orientation of any given micro-channel can be in any orientation (as well as flow direction) with respect to the orientation of the p-n junctions of the LEDs.

As described in further detail below, LED array 330, comprising light emitting devices, such as LEDs or laser diodes, are mounted to the micro-channel cooler 410. In one embodiment, the range of the number of LEDs along the length of the micro-channel cooler is 2-10,000, and the size of each LED is approximately 1.07, 1.2, 2, 4 mm square (or 2×4 mm), range of 0.1-100 mm. The aspect ratio of the width to length is preferably about 1:68 to 1:200, but the range may be 1:10-1:1,000. It should be noted that the LED arrays may not be high aspect ratio and may be substantially square, substantially rectangular, substantially circular or other geometries. Exemplary LEDs are available from Semi- LEDs, USA. SemiLEDs' LEDs have a unique (often plated) copper substrate which is advantageously bonded to the copper (or ceramic) micro-channel cooler 410, thereby maintaining the thermal and cost advantageous of this high thermal conductivity material. According to one embodiment, the size of the LEDs employed are 1.07×1.07 mm square and the LED array 330 comprises an array of 68 LEDs long by 2 LEDs wide.

Nichia, Japan is also an exemplary LED provider that commonly manufactures horizontal structure LEDs versus SemiLEDs' common vertical structure LEDs. In one embodiment, one or more of the seriesed groups of LEDs or the entire LED array may be implemented with horizontal structure LEDs that have anode and cathode pads on a top of surface, such as on top of a non-conductive substrate, such as sapphire. For example, a cathode wire can be coupled to multi-layer flex circuit 1403 at one end of the series and an anode wire can be coupled to multi-layer flex circuit 1403 at the other end of the series without the use of a submount for the particular seriesed group of LEDs.

In one embodiment of the present invention, the LEDs of LED array 330 are placed substantially in electrical parallel, or have at least two LEDs in parallel, on a preferably common anode substrate. This is a very thermally efficient manner of connection, as no thermally impeding dielectric layer between the base of the LED and the substrate need be added for the purpose of electrical isolation as is needed in a conventional series configuration or conventional series/parallel configuration. Nonetheless, it should be noted that any of these configurations could be considered in various embodiments, as well as a purely series arrangement, or a series/parallel arrangement. While a dielectric layer could substantially add to overall thermal resistance, thereby raising the junction temperature of the device(s) and adversely impacting output power and/or efficiency, it is contemplated that a very thin dielectric layer on the order of a few microns thick or less may be grown by means such as atomic layer deposition and provide a very low thermal impedance layer over a material such as copper for the purpose of electrical insulation in a series/parallel type arrangement. This dielectric could be selected from the group of oxides, nitrides, carbides, ceramics, diamond, polymers (ALD polyimide), DLC, etc.

According to various embodiments of the present invention, one objective is to maintain extremely low thermal resistance between the epitaxial p-n junctions of the LEDs, or at least the bottom of the preferably bare die, that is approximately 0.015 K-cm$^2$/W, but the range may be 0.0010-15 K-cm$^2$/W, and is often around 0.024 K-cm$^2$/W. Very thin layers of foil, bond pads, traces, etc. of either metallic, dielectric, ceramic, or polymer layers may be considered, but are not optimal due to the increase in thermal resistance that results from these additional layers, which inevitably results in an increase in junction temperatures, with a corresponding decrease in efficiency. Various means for decreasing current droop associated with the epitaxial structure growth and design, such as thicker n or p capping layers may be employed, as well as other state-of-the-art means (e.g., new quantum barrier designs, reducing non-radiative recombination centers, etc.) found in recently published scientific journals, and authored by employees of Philips, Netherlands, and RPI, USA, and others (see, e.g., Rensselaer Magazine, "New LED Drops the 'Droop'" March 2009 and Compound Semiconductor Magazine, "LED Droop: Do Defects Play A Major Role?" Jul. 14, 2010, both of which are hereby incorporated by reference in their entirety for all purposes). Epitaxial growth on native GaN wafers and even polar GaN wafers are currently considered to reduce or eliminate current droop.

As such, in accordance with various embodiments, an extremely low thermal resistance path exists between the LED junction and the etched (e.g., chemically etched) foil layers that contain flowing liquid in the preferably chemically etched micro-channels, because the LEDs are directly mounted (preferably with 2.5 um thick SnCu solder), and the heat spreader (if employed) and foil layers are thin, and they preferably do not enlist an intervening dielectric layer. Other etching or lithographic or machining processes may also be considered in the manufacture of the micro-channels.

According to one embodiment, the LEDs of LED array 330 are bonded directly (i.e., no substantial intervening layer (whether bulk material, foil, thin-film, or other material) between the LED and the micro-channel cooler 410 other than, for example, a thin pre-sputtered solder layer that is preferably pre-applied (e.g., by sputter deposition means) to a bottom surface of the LEDs.

As described in further detail below, a separator gasket 314 may be formed by one or more o-rings 420 to seal the common anode substrate layer 317 to the body 305 and also prevent coolant bypass substantially directly under the LED array 330. While in this and other figures, the o-rings 420*a-c* do not appear to be compressed, it will be appreciated that in real-world operation, they would in fact be compressed to perform their intended function of preventing fluid by-pass between channels or into the external environment. In the present example, separator gasket 314 is substantially parallel to, and in the same z-axis plane, as the bottom surface (opposite to the light emitting direction) of the diffusion bonded foil layers (not shown) of the micro-channel cooler (whether layered vertically or horizontally). The cross-section of the separator gasket 314 is preferably substantially round, may be made of a soft durometer silicone, and may be manufactured by Apple Rubber USA. In alternative embodiments, the cross-section of the separator gasket 314 may be square or rectangular.

With reference to the multilayer construction of the LED driver PCBs 310*a-b* illustrated in the present example, in one embodiment, copper (or aluminum, polymer, filled polymer, etc.) metal core PCB boards that are approximately 2.5 mm thick (range 0.1-10 mm) and available from Cofan Canada are constructed of multiple layers to keep the size of the PCB at a minimum. The high power FETs and gate drivers and inductors and resistors and capacitors may be mounted on the preferably Thermagon USA layer that is closest to the metal core. In fact, in some embodiments, this layer could be windowed or cored so that the FETs (or other driver PCB components) can be mounted directly to the metal core with or without attachment screws. The LM 3434 or LM 3433 (examples only) series LED common anode drivers available from National Semiconductor USA could also be mounted as close as possible to the metal core as well, meaning that a minimal dielectric layer thickness (if any) may exists between the components and metal core. Equal trace path lengths and close component spacing should also be considered for efficient electrical and stable operation. Custom wound inductors can increase drive subassembly efficiency greatly. The inductors could be oriented in such a manner as to make the magnetic fields of the separate drivers (e.g., 8 or 15) with a preferable common backplane (e.g., anode body 315*a-b*) that also may be shared with the common anode substrate 317 of the micro-cooler flex-circuit assembly advantageously interacting with each other to increase the efficiency of the preferably constant current driver (though a constant voltage driver may be considered, especially with special circuitry). Pulse width modulation (PWM) constant current drivers may be considered, although, PWM can have a deleterious effect on LED lifetime at high currents due to current ripple, additional capacitors between the inductors and the LEDs should be considered. Alternatively, an iron substrate could be placed between the inductors to reduce undesirable interaction between the inductors or other components that may be orientation and spacing dependent. Most preferably, shielded, off-the-shelf (OFS) inductors from VASHAY, India can be considered.

On the backside of the lamp body 306 (the side where the main input water and electrical energy in/out sources are located) the preferably metal (copper, aluminum, composite) MCPCB cores can have a screwed or soldered tie bar (or anode cross plate between the two MCPCB (PCBs with metal cores available from Cofan, Canada) cores to make a space and/or strong mounting plate for a single wire connection for the anode that will then run to the main AC/DC front end power supplies that are connected to the AC mains.

In one embodiment, the metal cores of the LED driver PCBs 310*a-b* are the ground plains—there may be more than one ground plane on each LED driver PCB 310*a-b*. As such, the edge of the PCB is preferably clamped or soldered to the ground plain of the common anode substrate layer 317. This is preferably accomplished by allowing the common anode substrate layer 317 to extend, or hang over, each side of the body 305, such that the anodic side of the common anode substrate layer 317 can touch and be in electrical communication with the anode side (edge) of the LED driver PCBs 310*a-b*, and the cathodic sides of the common anode substrate layer 317 (e.g., the top foil layer) can preferably touch and be in electrical communication with the proper top cathode area of the individual cathodic segments that are in electrical communication with the LED driver PCBs 310*a-b*.

Figure 5B:
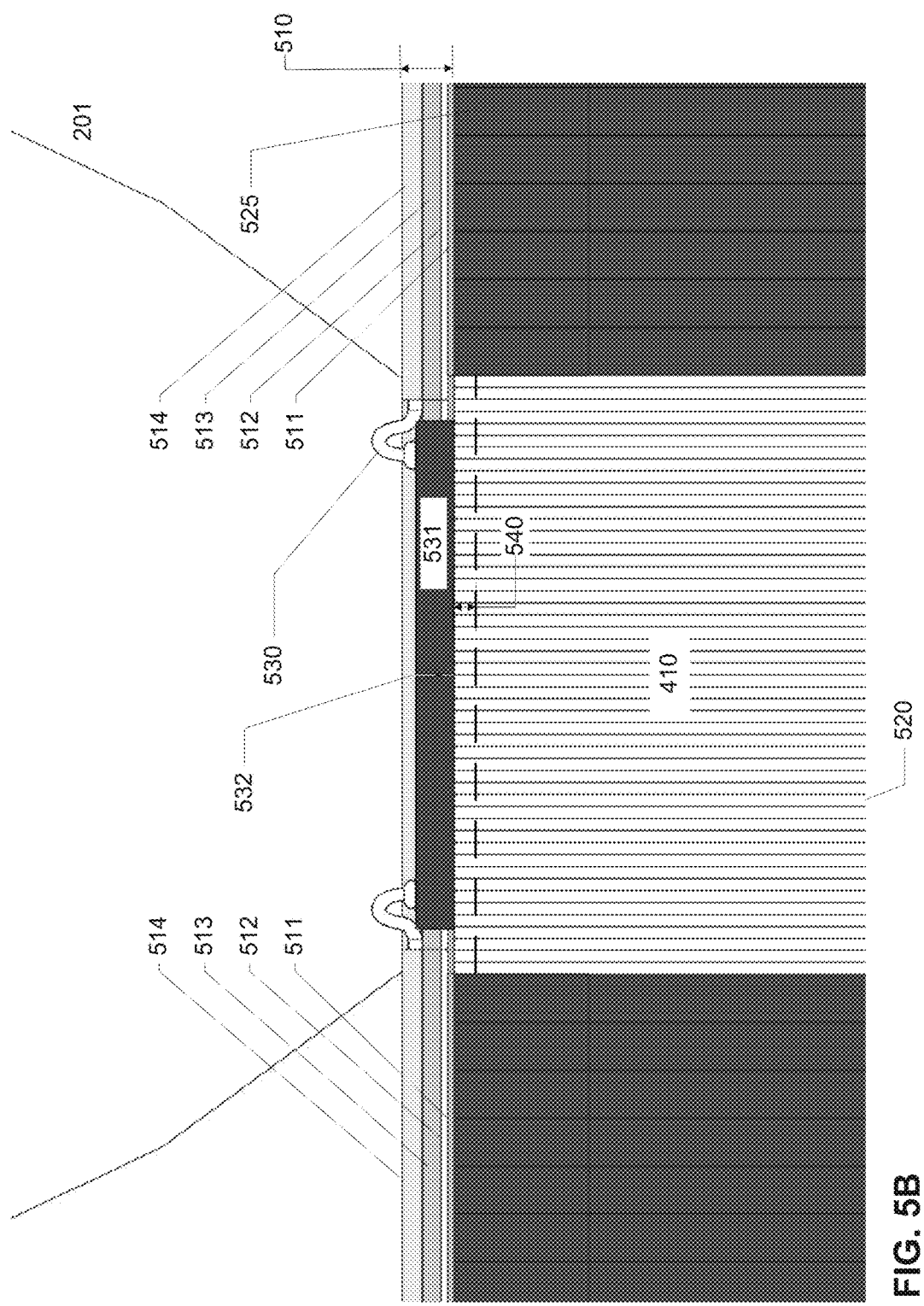
FIG. 5B is a further magnified front cut-away view illustrating an LED array and its interface with a common anode substrate layer of the UV LED lamp head module of FIG. 2A.

FIGS. 5A-B provide further magnified views illustrating LED array 330 and its interface with common anode substrate 317 of the UV LED lamp head module 200 of FIG. 2. In these views, the high fill-factor of the LED array 330, the electrical coupling of the individual LEDs, the proximity of the base of the reflector 201 to the surface of the LEDs and the various layers of a flex-circuit 510 become apparent. Additionally, in these views, the preferably vertically-oriented foil layers of the micro-channel cooler 410 become visible.

According to one embodiment, common anode substrate layer 317 may include a micro-channel cooler 410 for transferring heat from LED array 330, an integrated etched capping layer 525 and a solid capping layer 530. In one embodiment, the width of the micro-channel cooler 410 is only slightly (e.g., less than about 400 microns (range 50-2,000 microns)) wider than the LED array 330. In one embodiment, the total width of the micro-channel cooler 410 is about 1.2 times (range 1, 1.1, 1.3, 1.4, 1.5, 1.6, 1.7, 1.9, 2, 2.1, 2.2, 2.3, 2.4 to 2.5×) the total width of the LED array 330. In the present context, computer modeling suggests that increasing the total width of the micro-channel cooler 410 to a width of nearly double (2×) the width of the LED array 330 decreases the peak thermal resistance by only about 5%.

The micro-channel cooler 410 may include a heat spreader layer 540 (a/k/a thermal diffusion layer or a heat dissipating top surface) (e.g., approximately 125 microns thick (ranging from less than 500 microns, less than 250 microns, less than 200 microns, less than 150 microns, less than 100 microns, less than 50 microns, to less than 25 microns), below a top surface of the micro-channel cooler 410, a plurality of primary inlet/outlet micro-channels (e.g., primary inlet micro-channel 411) and various inlet manifold passages, heat transfer passages and outlet manifold passages. Notably, in the present context, the heat spreader layer 540 really provides little true heat spreading; however, it does provide an extremely short thermal diffusion length (distance between the bottom of the LEDs and the closest of the heat transfer channels (not shown) of the micro-channel cooler 410). Exemplary heat transfer channels, their orientation, flow directions and dimensions are provided by U.S. Pat. No. 7,836,940, incorporated by reference herein.

The top surface of the micro-channel cooler 410 may couple the micro-channel cooler 410 with LED array 330. Primary inlet micro-channels (not shown) may be configured to receive and direct a fluid into internal passages within the micro-channel cooler 410, including heat transfer passages. The heat transfer passages may be configured to receive and direct the fluid in a direction substantially parallel to the top surface and substantially perpendicular various input and output manifold passages. The outlet manifold passages may be configured to receive and direct the fluid to one or more primary outlet micro-channels (e.g., primary outlet micro-channel 411).

In one embodiment, micro-channel cooler 410 may be formed from a plurality of etched foil sheets (e.g., foil sheet 520) having formed therein the internal passages and manifolds for directing coolant flow. In the current example, a monolithic micro-channel cooler body is formed by diffusion bonding the combined etched capping layer 525 and solid capping layer 530 to micro-channel cooler 410. As shown in FIG. 5A, foil layers of the etched capping layer 525 are preferably thicker than the foil layers 520 of the micro-channel cooler 410. In one embodiment, the capping layers 525 and 530 could be machined.

In an embodiment in which the diffusion bonded foil layers (e.g., foil layer 520) are vertically stacked (and diffusion bonded together) with their edges lying under the bottom portion of the LEDs as illustrated in FIGS. 5A and 5B, the LEDs are preferably bonded directly to the vertically-oriented micro-cooler (with or without plating such as ENIG, or ENEPIG, Superior plating, USA), and preferably two machined pure (C101 or C110 ) copper blocks, with mirrored (matching) macro-coolant flow and/or coolant directing channels, "pinching" the vertically laid up etched diffusion bonded micro-channel cooler. Each copper block (which could be in and of itself be a stack of diffusion bonded foils or a solid block) is diffusion bonded to opposing sides of the vertically stacked foil micro-channel cooler 410 in one step. In other words, the foil layers and blocks are preferably diffusion bonded all in one step. The resultant stack is then preferably machine excised, and the assembly can then be referred to as the micro-channel cooler assembly, whereas portions of the micro-channel cooler assembly may be referred to as outer capping layer portions (525 and 530) and a micro-channel cooler portion 410. The micro-channel cooler assembly (e.g., outer capping layer portions 525 and 530) is/are preferably drilled before performing a machined excision process and before surface finishing process(es) (e.g., a plating process). If a plating process is utilized for the purpose of providing a solderable surface for the LEDs and/or a wire bondable surface for the wires that attach to the LED bond pads on the preferable LED top-side, a machined polymer panel is preferably provided that allows for an o-ring groove (preferable utilizing the same aforementioned separator gasket/o-ring design) that allows the micro-channel cooler assembly to be clamped to the polymer block and put into a plating bath with out solution getting into the ID of the micro-channels. This process may also allow for a non-corrosive surface to be plated in regions that the anode and/or cathode bus bars 304*a-b* may be eventually clamped or soldered to in the end product. The LED driver PCBs 310*a-b* may also be edge plated for corrosion reduction and low voltage drop purposes.

The micro-channel cooler assembly could undergo a quenching or annealing or precipitation hardening process so that pure hardened copper (which has an approximately 10% higher thermal conductivity than Glidcop) could be used in the foil layers (e.g., foil layer 520). Pure copper would enhance solder wetting.

In an embodiment in which the diffusion bonded foil layers (e.g., foil layer 520) are oriented horizontally, the micro-channels of micro-channel cooler 410 may be etched in the same plane as the bottom of the LEDs (e.g., LED 531) so the primary inlet/outlet micro-channels (e.g., channel 411) can be etched or even machined in the foil layers. The internal micro-channels of micro-channel cooler 410 may be formed through all or substantially all of the diffusion bonded foil layers (e.g., foil layer 520) substantially as deep as the thickness of all the layers together and/or stopping near or at the bottom of the heat spreader layer 540 may be considered.

Turning now to the positioning of reflector 201, it is preferable that dielectric spacer layer 514, such as polyimide film, be placed between the bottom surface of the reflector 201 and the micro-channel cooler 410. This insulates the reflectors from the micro-channel cooler 410 both thermally and electrically, as well as provides a space for the wires (e.g., wire 530) from the LEDs (e.g., LED 531) to fit under the reflector 201 and have the crescent end of the wire affixed to the preferably gold containing plated copper foil layer 513 that is part of the flex-circuit assembly 510, which is directly bonded to the micro-channel cooler 410. As such in one embodiment, the dielectric spacer layer 514 is at least as thick as the thickness of the wires (e.g., wire 530).

Using an automated die bonder such as a Datacon, Austria, MRSI, USA or Palomar, USA with a tamping tool or even a capillary tool, the wires (e.g., wire 530) can be automatically tamped (bent) down in such a way as to lower the wire loop until it is substantially parallel (and perhaps even touching the foil layer on top of the polyimide layer before the crescent termination point) to the flex-circuit 510-polyimide/copper foil layer(s) (a/k/a conductive circuit material layer). The flattened wire does not touch the anode surface or the edge of the LED (e.g., LED 531) as a short could otherwise result. Other manual and/or automatic means may be considered, such as one long tamping tool that tamps all of the wires in one step, or the edge reflector itself with or without a dielectric coating could be employed for this tamping purpose. The primary purpose of this wire-bending step is to allow the reflectors to be placed in very close proximity to the LEDs (e.g., within at least a wire diameter) and to eliminate chafing, touching, or shorting to the reflector 201. The reflectors (e.g., reflector 201) may be preferably designed with a non-imaging software tool such as Photopia available from LTI Optics, USA. The reflectors may have different operational characteristics such as short to long working distances, or short to long depths of field. They should be easily replaceable such that they are modular and interchangeable and such that they provide the end user with the maximum in operational flexibility. In one embodiment, external dimensions of reflector 201 does not substantially change for reflectors configured for differing stand off distances. For example, as described further below, a reflector optimized for a 2 mm focal plane may have substantially similar external dimensions of a reflector optimized for a 53, 65 or 170 mm focal plane.

The reflectors (e.g., reflector 201) may be injection molded from acrylic, polysulphone, polyolefin, polyetherimide, etc. They may be coated with aluminum and/or silver with a dielectric enhancement layers at DSI, USA. They may also be extruded from a polymer or metal. It should be noted that monolithic reflector halves 201 running the length of the entire assembly of all the UV LED lamp head modules 200 placed end to end (serially in length) may be employed. These long reflectors could have polished and coated end cap(s) at each end. They could be 5-axis machined from 6061 Al and polished with diamond and a horse hair brush (as the reflectors may be polished) and coated with, for example, a single layer of $MgF_2$ or $SiO_2$ optimized, for example (as all aforementioned examples) at 390-400 nm.

One skilled in the art could conceive of any length of LED array 330, reflector 201 and lamp body 305. As described above, one possible length of lamp body 305 is approximately 80 mm. This allows for approximately 60 45 mil per side LEDs or 68 40 mil per side LEDs, both preferably in two rows with about a 15 micron (range 5-50 um) gap (e.g., gap 532) between the two rows. A single row or multiple rows (from 1-n) LEDs may be considered. Even rectangular LEDs that have a longer length along the long-axis of the LED array may be considered. Along the long-axis, it is preferable to have less than a 25 micron (range 5-100 um) gap (e.g., gap 533). In one embodiment, center-to-center distances between LEDs of the LED array 330 are approximately 10 to 20 microns greater than the combined edge lengths of neighboring LEDs.

Embodiments of the present invention take into consideration the overall z-axis stack up of the metallic and dielectric layers of the flex-circuit 510 (minus the dielectric spacer layer 514), plus the wire layer thickness (diameter of each wire or thickness of each wire strip) running above the preferably cathode flex-circuit layer 513 and running to the rectangular-shaped cathode wire bond pad 534 shown beneath the ball bonds of the wires (e.g., wire 530) on the preferably top surface of the LEDs.

In one embodiment, the total z-axis stack up is not much thicker than the thickness of the LEDs (a/k/a the LED layer). In various embodiments of the present invention, the LED layer may have a thickness of approximately 145 microns and ranging from a thickness of approximately 250 microns or less, 200 microns or less, 150 microns or less, 100 microns or less, 50 microns or less to 25 microns or less.

In various embodiments of the present invention, in which the flex-circuit layer 510 includes the dielectric spacer layer 514, the flex-circuit layer may have a thickness of approximately 7.8 mil or less and ranging from a thickness of approximately 20 mil, 15 mil, 12 mil or less, 10 mil or less, 5 mil or less to 3 mil or less.

In various embodiments of the present invention, in which the flex-circuit layer 510 excludes the dielectric spacer layer 514, the flex-circuit layer may have a thickness of approximately 5.3 mil or less and ranging from a thickness of approximately 10 mil or less, 8 mil or less, 2.5 mil or less to 0.5 mil or less.

In one embodiment, the total z-axis stack up is not much thicker than the thickness of the LEDs (a/k/a the LED layer), which could be the thickness of the bare LED or a packaged LED. In various embodiments of the present invention, the LED layer may have a thickness of approximately 145 microns and ranging from a thickness of approximately 250 microns or less, 200 microns or less, 150 microns or less, 100 microns or less, 50 microns or less to 25 microns or less.

In one embodiment, a bottom surface of the optical reflector 201 is between approximately 1-1.5× the thickness of the wire layer above a top surface of the light emitting device array layer. In another embodiment, a bottom surface of the optical reflector 201 is between approximately 0.33-0.5×the thickness of the LED layer. This allows reflector 201 to fit in close proximity to either or both the edge of the LEDs or in relation to the top surface of the LEDs, which thereby maintains irradiance by maximizing the number of emitted photons that are controlled by the reflector 201 and minimizing the number of emitted photons that escape the reflector 201 by going underneath the reflector 201. Locating reflector 201 close to the LED edge also allows for a more compact reflector in terms of height. This proximity of the reflector 201 to the LED array 330 also allows for a shorter length cathode layer 513 of the flex-circuit 510, which also allows the cathode layer 513 to be thin and still carry high current without too much impedance. The further the reflector edge gets from the LED, the taller the reflector needs to be according to commonly known optical principles. Although slightly higher irradiance could be achieved with taller reflectors, taller reflectors may be impractical in certain implementations.

Additionally, the flex-circuit 510 is inexpensive to manufacture and is very compact and thin, as such, it is well suited to usage in the context of embodiments of the present invention in which the overall z-axis stack up of the metallic and dielectric layers of the flex-circuit are desired to be minimized. Lenthor, USA, is an example of an excellent flex-circuit manufacturer. In one embodiment, as described further below, flex-circuit 510 may extend beyond the micro-channel cooler assembly and may be connected (directly or indirectly) to external DC/DC and/or power supplies.

As described earlier, another novel feature of embodiments of the present invention includes the use of a preferably diffusion bonded (though the layers may be soldered or glued or brazed) preferably etched foil micro-channel cooler 410 that preferably has a high aspect ratio of at least one short laterally etched channel(s) (across the short direction (width) of the LED array 330) that may be in thermal parallel and preferably arrayed in a side-by-side fashion over a long length, in which the coolant flows across and underneath the LED array 330 in the direction preferably substantially parallel to the shortest dimension(s) of the array 330, usually the width not length dimension. In other embodiments, the coolant may flow in a direction along the length of the LED array 330 and/or cooler 410, and it may flow vertically (towards the bottom surface of the LEDs) in some areas. In one embodiment, many channels may flow underneath the bottom of the LEDs and very close to the bottom of the LEDs separated by only about 125 um of copper (range 1-1,000 um), plus a thin layer of solder that is used to bond the LED directly to the common anode substrate 317. Additionally, multi-directional etched coolant paths and orientations, individually or in groups, also described as internal heat transfer channels, running parallel, perpendicular, vertically, or horizontally, connected, or not connected, or some combination of both, oriented with respect to the length or width or some combination or both, of the LED array 330, and/or the bottom surface of the LED(s) may be considered.

According to one embodiment, the internal heat transfer channels may be oriented such that (i) two or more adjacent LEDs in the shortest dimension of the LED array have substantially independent heat transfer channels under each LED and (ii) the LEDs above these channels are cooled independently (i.e., the group of channels under each LED have substantially no convective communication with each other or with the group of channels under the adjacent LED). Hence, the two or more adjacent LEDs are said to be cooled in thermal parallel rather than in thermal series. Thermal series would result if the channel flow substantially directly underneath the LEDs was commingled or if a common channel flowed substantially directly underneath both LEDs.

The foil layers (e.g. foil layer 520) of the micro-channel cooler 410 are preferably substantially copper, and they preferably have around 1% (range 0.1-10%) of an interspersed ceramic material such as $Al_2O_3$ and known commonly as Glidcop, which is known to maintain its stiffness, strength and shape after being subjected to high diffusion bonding temperatures. Glidcop is now available having nearly the same thermal conductivity as pure copper.

In one embodiment, the micro-channel cooler 410 is constructed as a high aspect ratio device corresponding to the high aspect ratio of the directly mounted LED array 330. This is to say that the cooler 410 has a longer length on which the LED array 330 is mounted along, than its width, and the cooler 410 itself often has many short channels side by side and with flowing coolant in a direction often parallel to the width of the LED array 330, and perpendicular to the long-axis of the cooler 410 (the largest dimension), and that may have 1-n channels located side by side to one another. Internal micro-channels may be oriented to form manifolds that are parallel, perpendicular, horizontal and/or vertical to either or both the long-axis (length) or the short-axis (width) of LED array 330. The foils (e.g., foil layer 520) are then preferably stacked on top of each other (or together) with each channel preferably located underneath the channel that is located on or in the foil immediately above the neighboring foil whether or not the foils are stacked in any vertical or horizontal or other angular or rotationally located orientation in a three dimensional space. In one embodiment, the LED(s) are mounted directly to the surface (e.g., a common anode substrate) formed by the edges (when the foils are stacked vertically) of a multiple diffusion bonded stacked foil laminate. It is preferable that the surface formed by the edges of the foil laminate be first made flat before LED array 330 is soldered to this surface.

As a non-limiting example, the LEDs could be mounted in two (1-n) rows across the width, and be on the order of 50 to 300 LEDs along the length of the row. The length of the row is preferably around 90% (10-100%) or more of the length of the cooler 410. That is the LED array 330 extends as close as possible to the edge of the micro-channel cooler 410. In this manner, there is no significant irradiance gap in serially connected UV LED lamp head modules 200. This configuration is most beneficial in the context of short working distances (~2 mm).

It is preferable that the internal micro-channels running beneath the LEDs of LED array 330 have approximately equal flow so that the junctions of the LEDs are approximately the same temperature. For some specialized applications the flow could be different in some channels to run LEDs hotter or cooler, especially if the LEDs are of differing wavelength as short wavelength LEDs may require more cooling. It should be noted that not all embodiments require 100% of the coolant running through the micro-channel cooler to run through heat transfer channels of the micro-channel cooler.

According to one embodiment, CFD is preferably employed to design the main inlet and outlet coolant manifolds formed in base of the body 305 to enhance or constrict coolant flow as needed to accomplish the aforementioned desirable nearly equal flow in the micro-channels. CFD is preferably conducted by MicroVection USA. Enhancement could be accomplished by making the channels deeper or wider or both, or conversely, constriction could be accomplished by making the channels shallower or narrower or both. All of these geometries could be three dimensional with simple or compound contours or nearly straight or sharp geometries. Again, speaking to the micro-channels, they could be of differing size, shape, depth, width, number, center to center spacing, number of etched foil layers, curves, protrusions, squiggles, gull-wings, etc. needed in order to balance flow and or reduce thermal resistance between the channels and the LED junctions.

Figure 6:
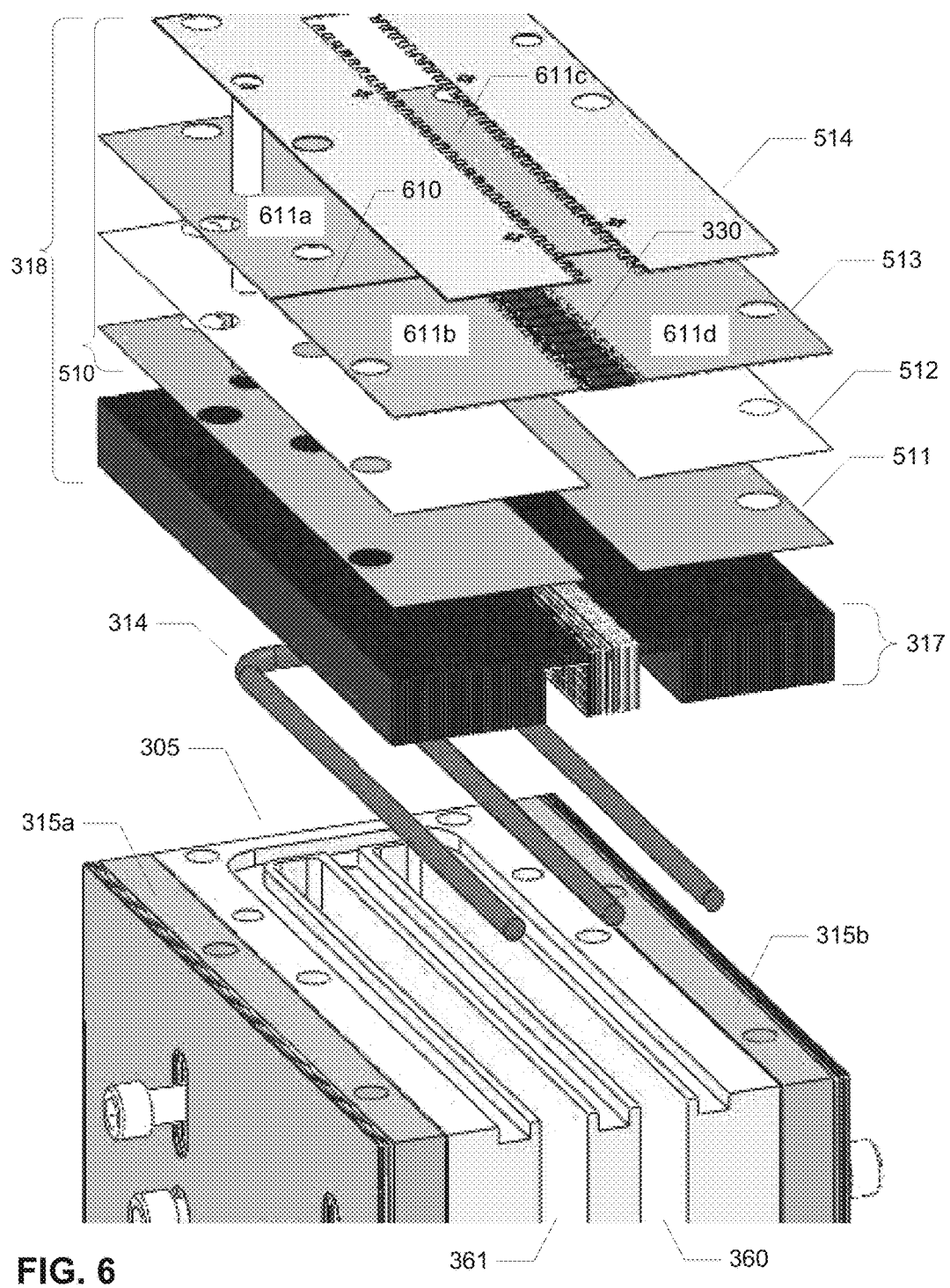
FIG. 6 is an exploded magnified isometric cut-away view of a top portion of a body of and illustrating various layers of the UV LED lamp head module of FIG. 2A.

FIG. 6 is an exploded magnified isometric cut-away view of a top portion of the body 305 of and illustrating various layers of the UV LED lamp head module 200 of FIG. 2. In this example, LED array package 318 includes the dielectric spacer layer 514, the cathode layer 513, the dielectric separator layer 512, the adhesive layer 511 and the common anode substrate layer 317. Flex-circuit 510 could also include an anode layer (not shown). As described above, layers 511-514 may collectively form a flex-circuit 510 from the Pyralux family of product. In one embodiment, the flex-circuit 510 may not include the dielectric spacer layer 514, which could be bonded to a bottom surface of the reflector 201 or simply be free floating between the bottom surface of the reflector or bonded to a top surface of the flex-circuit 510. In alternative embodiments, a rigid flex or rigid circuit with a rigid dielectric (e.g., FR4, ceramic, glass or the like) could replace flex-circuit 510.

In one embodiment, dielectric spacer layer 514 and dielectric separator layer 512 comprises a polyimide (e.g., Kapton, available from DuPont, USA), PEN or PET layer. The cathode layer 513 is preferably a copper foil. Cathode layer 513 and dielectric separator layer 512 preferably form an integrated layer of cathode foil and dielectric (which is known as "adhesiveless" in the Pyralux family of products available from DuPont, USA). As described above, these layers forming LED package 318 are pinched between cathode claws 320a-d and 321a-b and anode body 315a-b.

One design choice is binning individual UV LED lamp head modules (which when forming serial arrays would typically require connecting lamps within the same bin) versus binning LEDs within UV LED lamp head modules. Having the capability to bin within individual UV LED lamp head modules means one need not bin individual lamps. As noted above, in one embodiment in which binning is performed within the UV LED lamp head module 200, flex-circuit 510 (e.g., comprising an electrically isolated (segmented) cathode layer 511, dielectric separator layer 512 and dielectric spacer layer 514) is employed to potentially individually address each LED of the LED array 330, or groups of LEDs so that the LEDs may be binned for Vf, wavelength, size, power, etc. in groups from 1-n, thereby substantially lowering the demands on the LED manufacturer(s) to supply LEDs in just one or a few bins. According to one embodiment, the bins can be about 0.1Vf or less—and most preferably 0.05Vf or less, or even 0.01Vf or less. Depending upon the particular implementation, the LEDs of LED array 330 could be in just one or two large Vf bins, such that one or two long strips of LEDs in the arrays are from the substantially same Vf bin. Conversely, the bins could be as tight as 0.00001Vf. In this example, segmentation of the flex-circuit layer 510 and or the LED driver PCBs 310a-b could be reduced or even eliminated. This may be accomplished when very large volumes and or large LED chips are produced and there are substantial numbers of LEDs available from the manufacturers in Vfs that are close to 0.001 Vf or less.

However, the segmentation of the LED driver PCBs 310a-b and flex circuit 510 allows numerous options to bin by Vf values, or not at all. In the present example, the LEDs of LED array 330 are divided into eight individually addressable groups by locating them within eight flex-circuit segments (four of which are visible in the present view, i.e., segments 611a-d). In one embodiment the segments 611a-d are formed by photolithographically patterning the cathode layer 513 and etching away the metal foil to form electrical isolation traces (e.g., electrical isolation trace 610). Dielectric layer 512 in the area below the LEDs is removed by laser machining, routing or stamping.

In general, the most suitable UV LED wavelengths are in the range of about 360-420 nm, and most preferably ~395 nm. It should be noted that a mix of wavelengths may be use in each UV LED lamp head module 200 and smaller groups and/or even individual LEDs or some combination of both, may be individually addressed by wire bonding to an individual conductive stripe (not shown) of cathode layer 513 (patterned conductive circuit material layer) on flex-circuit 510, the conductive stripe (conductive circuit material layer) being preferably photolithographically imaged and etched with a preferably polyimide (non-electrically conductive layer a/k/a dielectric layer) beneath it. The cathode layer 513 is usually copper.

According to one embodiment, separator gasket 314 (e.g., monolithic o-ring 420) fits in a groove machined or molded into the body 305. As depicted in the present example, the groove (or gland) shape machined into the body 305 may be roughly described as an "o" with tight radiuses in the corners and a portion running through the middle of the gasket in the long axis direction. This preferably single-plane gasket design is made possible by the unique foil layer design in which the etched internal passages of the micro-channel cooler 410 for coolant are found only in the portion that lies substantially under the LED array 330, and not in the portions around the areas that fall substantially under the heat spreader peripheral regions. This allows the bottom of the preferably monolithic micro-channel cooler assembly to be flat and substantially parallel to the mating portion of the lamp body 305 that contains the groove for the separator gasket 314.

The peripheral regions of the micro-channel cooler assembly noted above are best explained as the regions that substantially exist outside of the coolant flow areas and/or the regions that exist under the preferable "o" cross-section seal. A benefit of this design is that multiple seals or a seal with differing z-axis planes is avoided. In essence, a three-dimensional (z-axis on two or more planes) configured seal is not needed as a more simple planar two-dimensional (z-axis on one plane) seal will suffice. The diffusion bonded foil layers (e.g., foil 520) are etched with not only heat transfer passages before diffusion bonding, but also the primary inlet/outlet micro-channels (e.g., primary outlet micro-channel 411) may be etched in an embodiment of the instant invention. Thus, when the foils 520 making up the micro-channel cooler 410 (e.g., 200 micron thickness) and the foils making up the portion of the micro-channel cooler 410 typically having no heat transfer passages (e.g., solid capping layer 530 and etched capping layer 525) are bonded together, a monolithic micro-channel cooler assembly (including micro-channel cooler 410) results that has a flat bottom side that is used to compress the uniquely shaped seal that exists between the preferably monolithic microchannel cooler assembly and the preferably monolithic lamp body 305.

Not shown is an optional monolithic diffusion bonded heat spreader layer (e.g., approximately 0.5 mm thick (range 0.1 to 1 mm)) that may span the top surface of common anode substrate 317.

Figure 7:
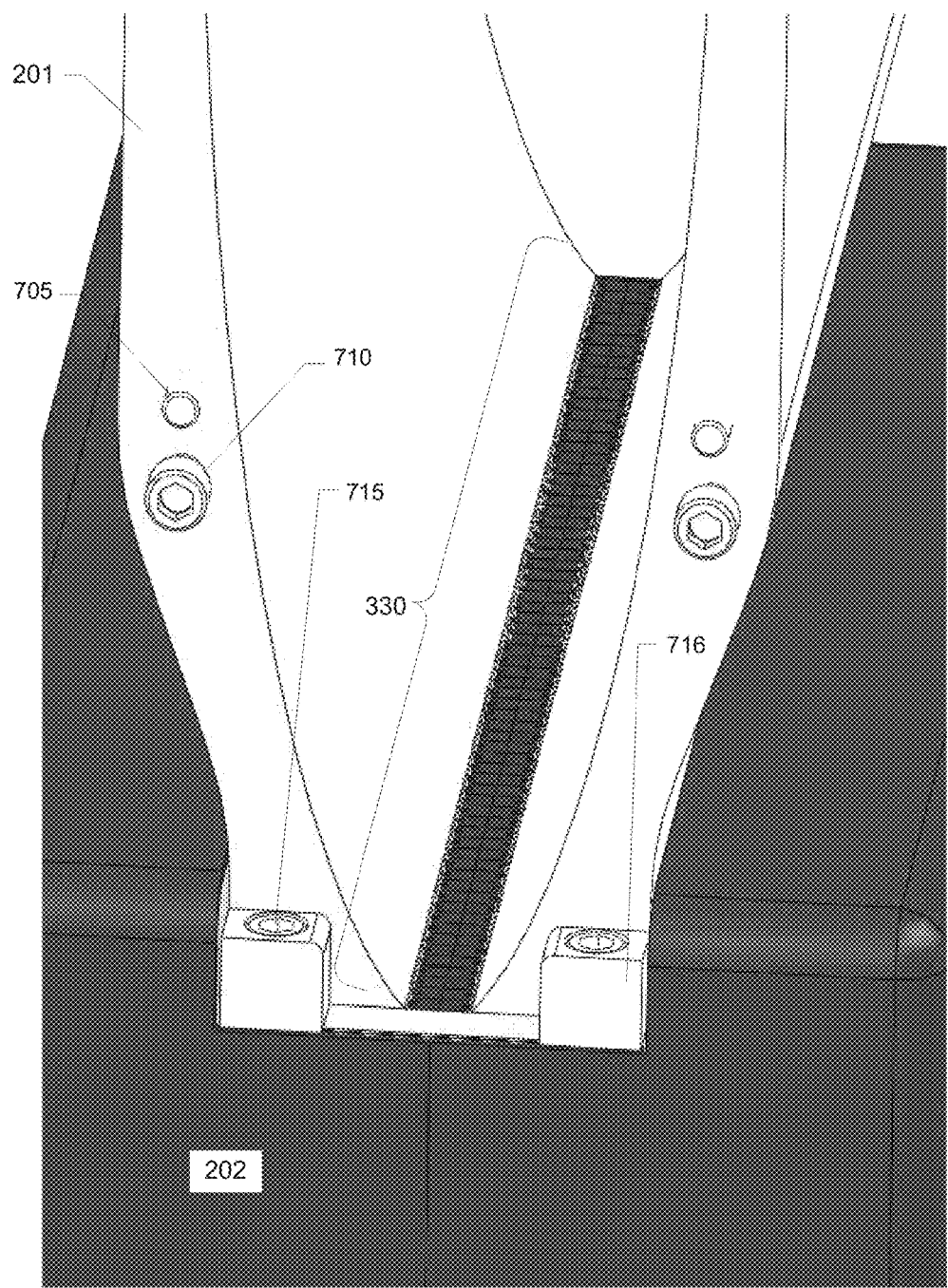
FIG. 7 is a magnified isometric view of a reflector of the UV LED lamp head module of FIG. 2A with the end cap removed.

FIG. 7 is a magnified isometric view of a reflector 201 of the UV LED lamp head module 200 of FIG. 2 with an end cap removed. This view is intended to illustrate the modularity of reflector 201. In this example, two of four screws 715 are shown that affix the reflector 201 to the lamp body 305. By simply removing these screws 715, a new reflector with different optical properties can be substituted in place of reflector 201. In the current example, integral injection molded feet (e.g., foot 716) may be used as alignment features for mini-reflectors (discussed below) or end caps. Steel screws 715 could be used to orient, align and/or hold such mini-reflectors in place if, for example, the mini-reflectors contained magnets (with their magnetic fields oriented properly with respect to the screws 715).

Also, locating pins or mated male/female features that extend from the bottom of the reflectors into or through the micro-channel cooler 410 as well as into the lamp body or vice versa may be employed for ease of alignment of the reflector 201 with respect to LED array 330. These pins or mating features may be part of the injection molded reflector or part of an injection molded (e.g., inserted molded) lamp body.

In one embodiment, locating pins, such as pin 705, could be used to align mini-reflectors or end cap reflectors. Screws 710 could be used to affix end cap reflectors to reflector 201.

Protective housing 202 is shown that preferably injection molded and each half may be a mirror image of the other.

Figure 8A:
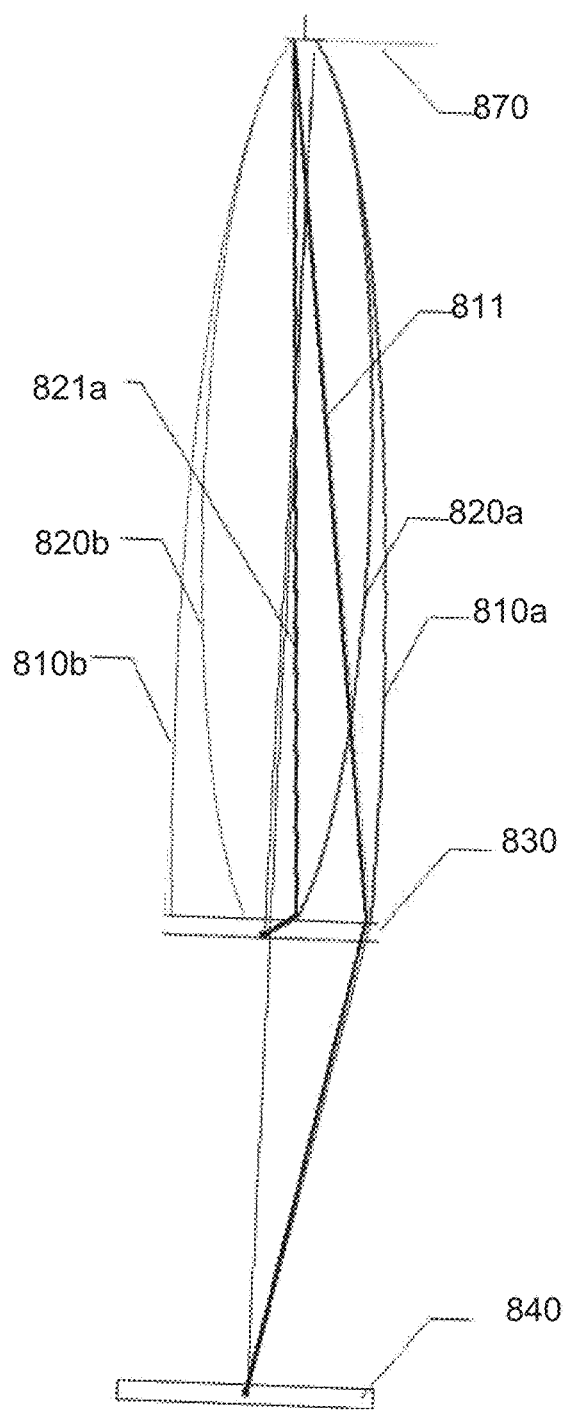
FIG. 8A conceptually illustrates two macro-reflectors of substantially the same height for different working distances in accordance with an embodiment of the present invention.

FIG. 8A conceptually illustrates a cross-section of two macro-reflectors 810*a-b* and 820*a-b* superimposed on top of each other in accordance with an embodiment of the present invention. In this example, the macro-reflectors 810*a-b* and 820*a-b* have substantially the same external height and width but are optimized for different working distances. Having a single deep trough macro reflector length and then having differing internal curved surfaces for differing focuses is efficient from a manufacturing standpoint as only a single outer mold is needed and differing curves are simply differing mold inserts.

In the present example, macro-reflector 810*a-b* is optimized for a 53 mm focal plane 840 and macro-reflector 820*a-b* is optimized for a 2 mm focal plane 830. Each curved portion shown is a mirror image of the other (assuming they have the same focal length) and represent a portion of a complete ellipse, parabola and/or a combination of the two. A parabola is a special case of an ellipse and would generally be used for collimating light.

An ellipse has two focuses, a primary focus and a secondary focus. In the current example, the primary focus is in the LED plane 870 and the secondary focus is in the work piece plane 830 or 840.

In various embodiments of the present invention, marginal ray 811 (representing the first ray captured by reflector 810*a*) and the last ray (not shown) captured by reflector 810*a* and exiting an LED array define an angular extent 850 of approximately between 60 to 89 degrees and preferably 80 to 85 degrees, thereby exemplifying (using a simplistic 2-dimensional analysis) that the 53 mm macro-reflector 810*a-b* controls more than approximately 80% of the photons that leave the LED array. In fact, 3-dimensional computer analysis suggests such a deep trough reflector design (when end caps (e.g., end caps 207*a-b*) are in place) controls over 90% of the photons that leave the LED array. The larger the angular extent the greater control over the photons that exit the LEDs. Therefore, angular extent can be increased, but practical considerations for reflector sizes (lengths and widths) need to be taken into consideration.

Figure 8B:
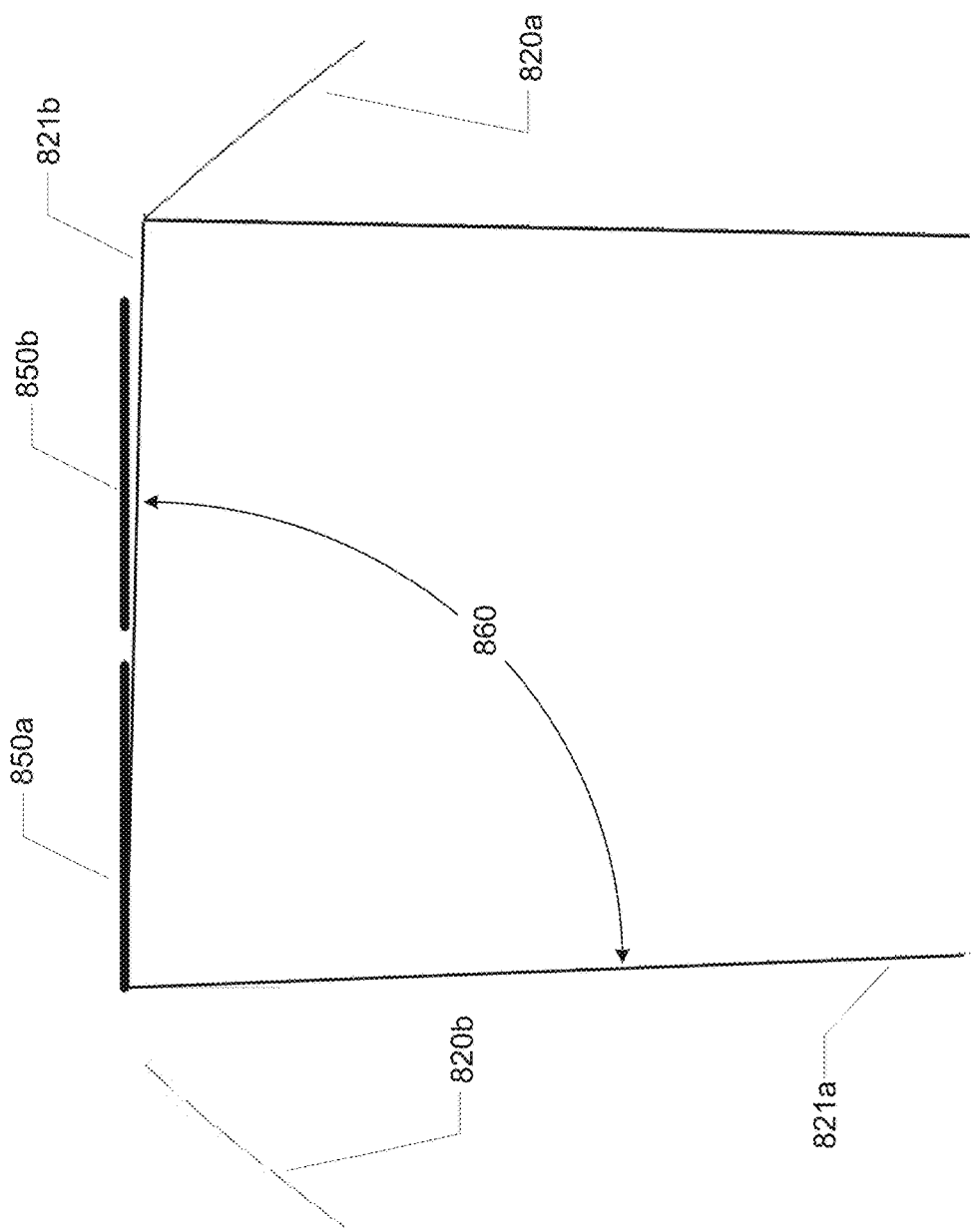
FIG. 8B is a magnified view of FIG. 8A illustrating marginal rays for a 2 mm macro-reflector in accordance with an embodiment of the present invention.

With reference to FIG. 8B it can be seen that marginal rays 821*a-b* (representing the first ray captured by reflector 820*a* and the last ray captured by reflector 820*a*, respectively) exiting LEDs 850*a* and 850*b* and reflecting off reflector 820*a* define an angular extent 860 of approximately between 65 to 89 degrees and preferably 82 to 87 degrees, thereby exemplifying (using a simplistic 2-dimensional analysis) that the 2 mm macro-reflector 820*a-b* controls more than 82% of the photons that leave the LED array in accordance with an embodiment of the present invention. In fact, 3-dimensional computer analysis suggests such a deep trough reflector design (when end caps (e.g., end caps 207*a-b*) are in place) controls over 96% of the photons that leave the LED array.

Figure 9:
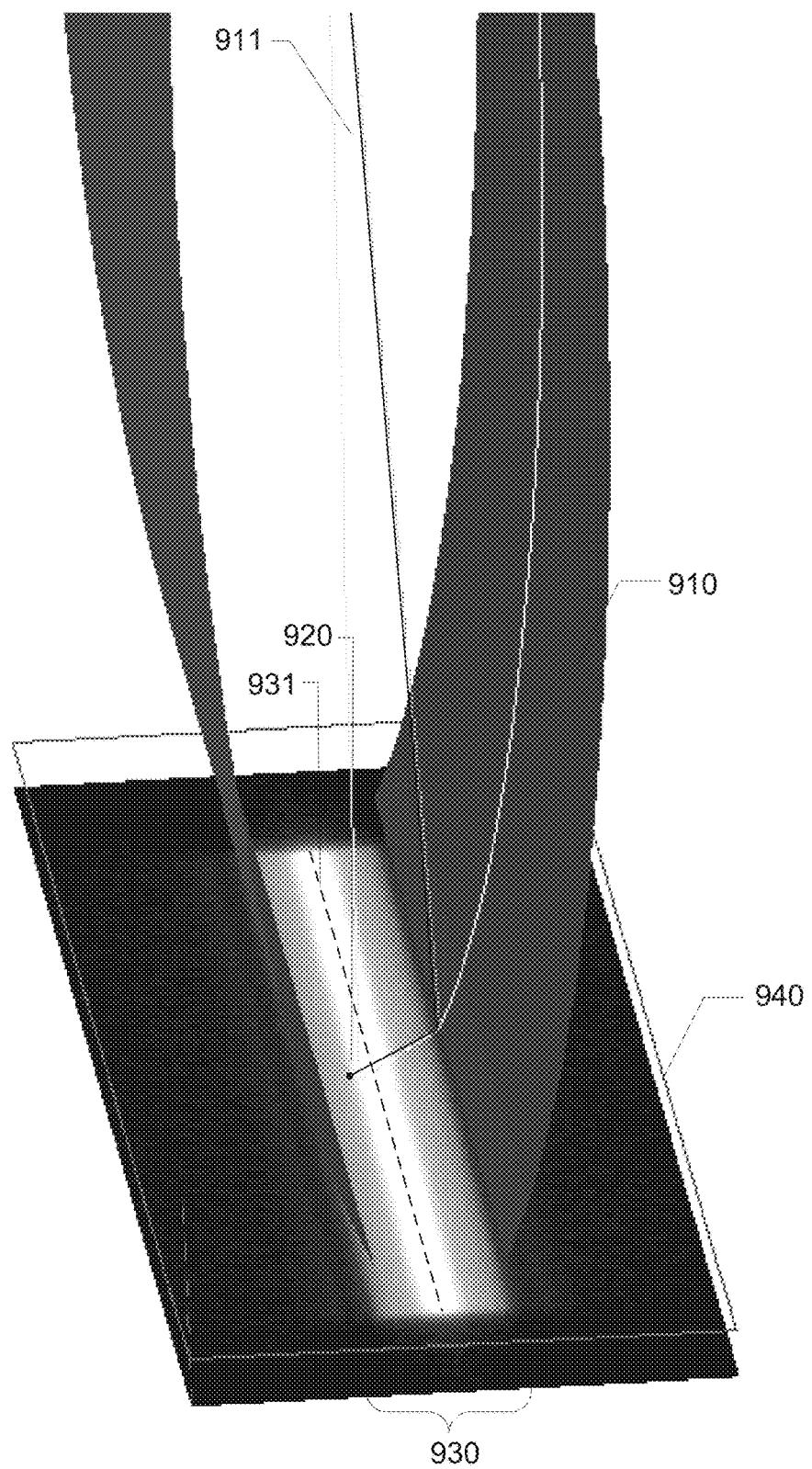
FIG. 9 shows a macro-reflector optimized for a 2 mm focal plane in which each side of the reflector has a focal point that is offset from the centerline of the focused beam on the work piece in accordance with an embodiment of the present invention.

FIG. 9 shows a portion of macro-reflector 910 optimized for a 2 mm focal plane 940 in which each side of the reflector has a focal point 920 that is offset from a centerline 931 of a focused beam 930 (having a total pattern width of approximately 7 mm and a high irradiance center portion of approximately 0.65 cm) on a work piece (not shown) in accordance with an embodiment of the present invention. As depicted in the drawing, in such a configuration, reflected light rays from the right-hand side reflector move from the left of the centerline 931 inward toward the center and reflected light rays from the left-hand side reflector move from the right of the centerline 931 inward toward the center. In this manner, the two sets of reflected light rays overlap to create the high irradiance beam 930. Computer modeling indicates about a 10% higher irradiance level than if the two sets of reflected light rays did not overlap. Notably, in one embodiment, at longer focal planes distances (e.g., ~53 mm), there is no significant loss (less than 5%) of irradiance at planes +/−3 mm from the focal point.

Figure 10:
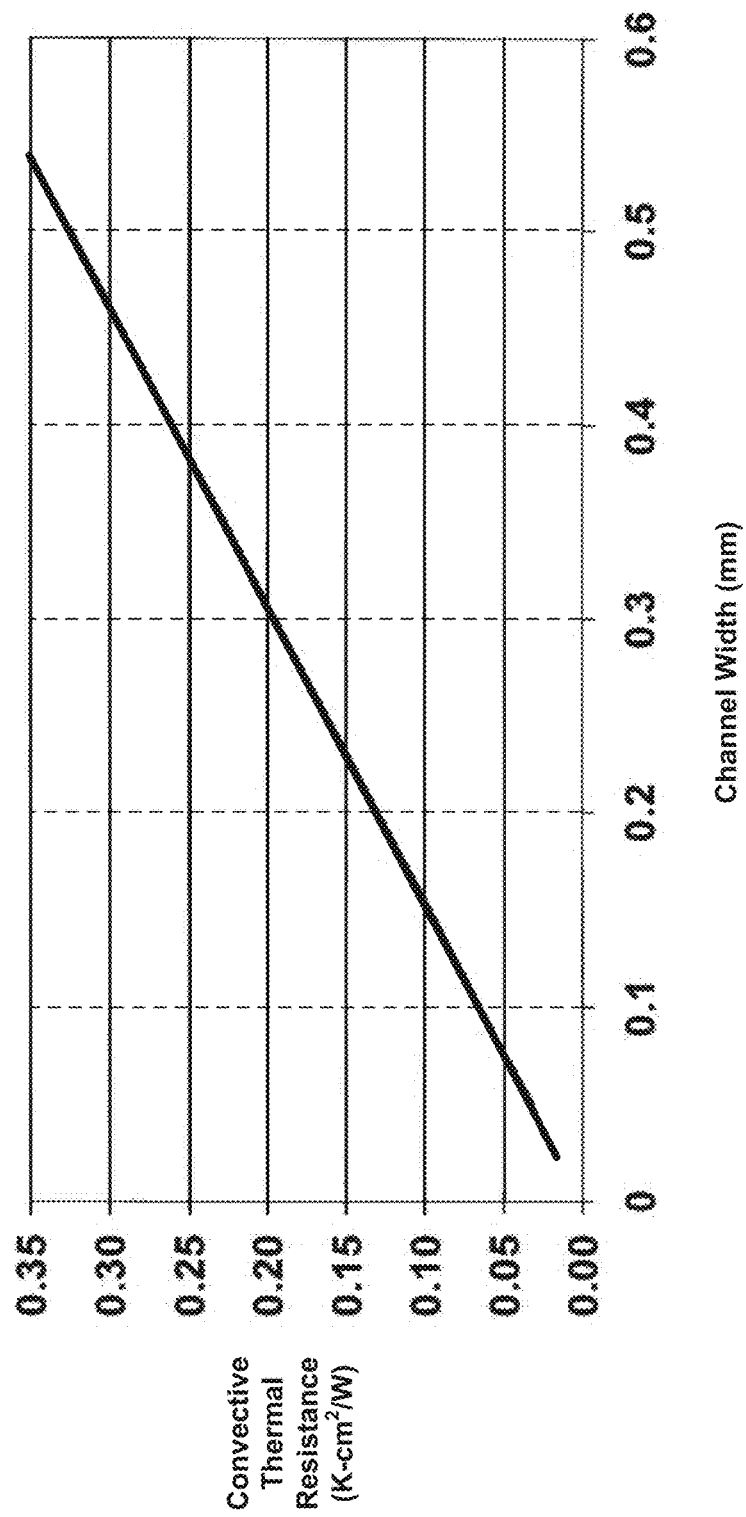
FIG. 10 is a graph illustrating estimated convective thermal resistance for various channel widths.

FIG. 10 is a graph illustrating estimated convective thermal resistance for various channel widths. This figure graphically depicts the linear decrease in thermal resistance with decreasing width of individual micro-channels. Of note is the fact that embodiments of the present invention usually use channels having widths of less than 0.1 mm, and often 0.05 mm, 0.025 mm or less. In another embodiment, mini-channels are also considered that may be wider than 0.1 mm up to about 0.5 mm. This is contrasted with the width of channels used in prior art UV LED lamp devices, such as those manufactured by Phoeseon (USA) and Integration Technology (UK), which are believed to use macro-channels on the order of 0.5 mm or larger.

As can be seen from the graph, all else being equal, the order of magnitude decrease in thermal resistance from a 0.55 mm channel to a 0.025 mm channel would in and of itself result in an order of magnitude decrease in LED junction temperature. However, all else is not equal. As currently understood by the inventors, the prior art has only one thermally-related factor working in its favor. This factor being the use of a low brightness, low fill-factor (LED packing density) array, which spreads out the heat sources and results in a low thermal density, which requires a correspondingly lower heat transfer coefficient for the same junction temperature.

Embodiments of the present invention minimize bulk thermal resistance loss through the copper substrate due to the minimal (usually about 125 um (range 5-5,000 um))

thickness between the bottom surface of the LEDs and the heat transfer passages (micro-channels).

Figure 11:
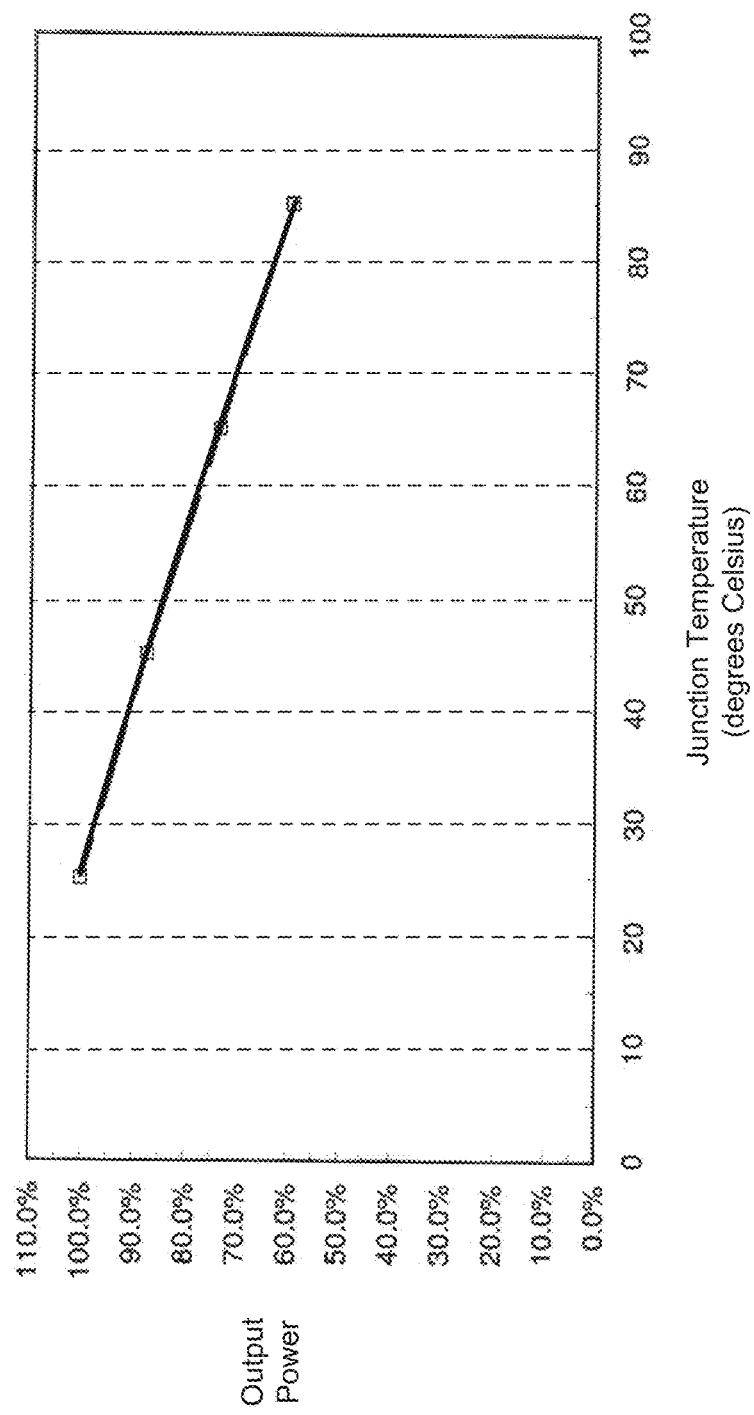
FIG. 11 is a graph illustrating output power for various junction temperatures.

FIG. 11 is a graph illustrating output power for various junction temperatures. This figure shows the severe drop off in UV LED efficiency with increasing junction temperature. A drop of inefficiency of 40% is noted with a junction temperature increase from 20 to 88 degrees C. UV LEDs are much more sensitive to heat than some longer wavelength blue and green LEDs. Hence, it is desirable to use superior thermal management in order to keep the junction temperatures low to achieve both long life and maintain a reasonable efficiency.

In accordance with embodiments of the present invention, LED junction temperatures of approximately 40-45 degrees C. are obtained, even when operating at current densities of over 2.5 A/mm$^2$, and sometimes over 3 A/mm$^2$. This may be contrasted with the UV LED lamp heads of Phoseon and Integration Technology that probably operate at current densities of less than 1.5 A/mm$^2$, with LEDs spaced much further apart (low fill-factor/low packing density), which of course leads to lower peak irradiance and lower total energy delivered to the work piece.

Figure 12:
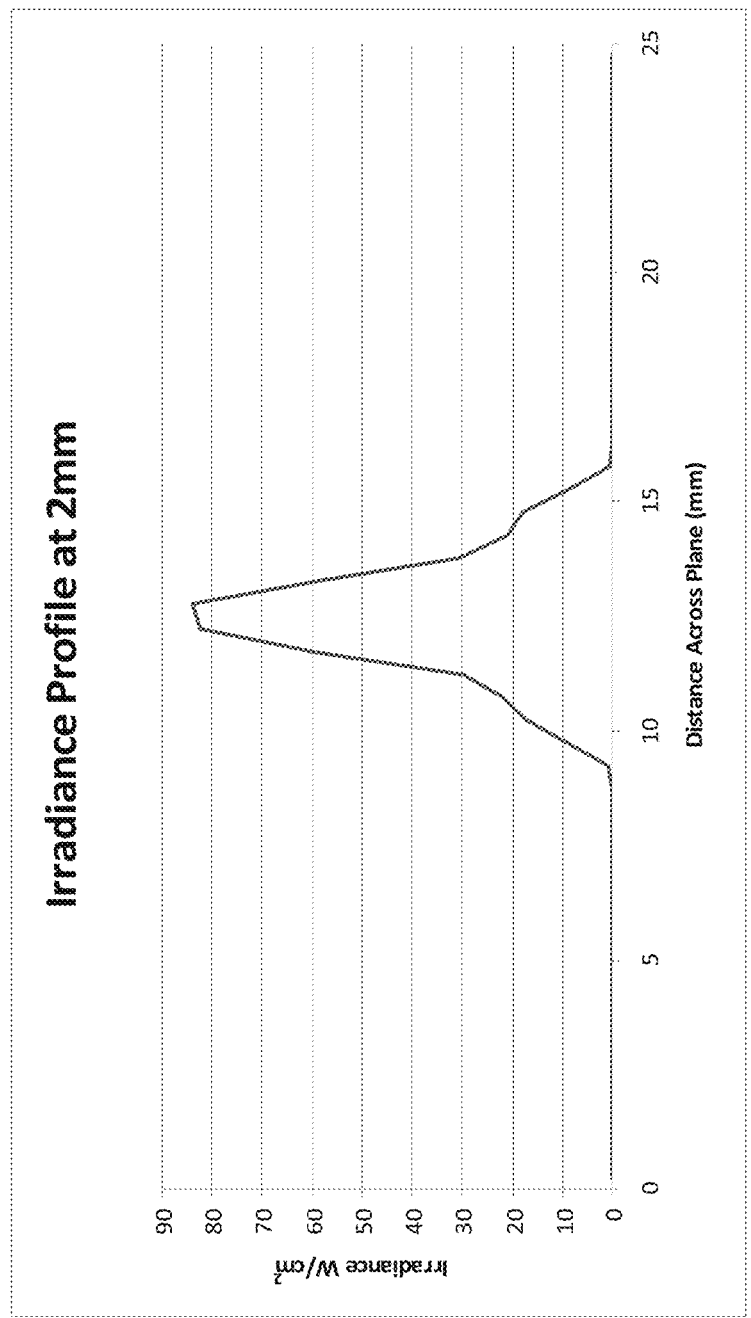
FIG. 12 is a graph illustrating an irradiance profile for a UV LED lamp head with a reflector optimized for a 2 mm focal plane in accordance with an embodiment of the present invention.

FIG. 12 is a graph illustrating an irradiance profile for a UV LED lamp head with a reflector optimized for a 2 mm focal plane in accordance with an embodiment of the present invention. According to the present example, maximum (peak) irradiance of approximately 84.8 W/cm$^2$ is achieved with an output beam pattern width of approximately 0.65 cm and producing an average irradiance across the width of the output beam pattern of approximately 31.6 W/cm$^2$ and total output power of approximately 20.5 W per cm of output beam pattern length. This example was generated with a computer model assuming the use of SemiLEDs' ~1.07× 1.07 mm LEDs, with each LED producing 300 mW output at 350 mA. It is to be noted that embodiments of the present invention could run each LED at higher current (e.g., approximately 2.5 A or more) at approximately 0.75 W to 1.25 W.

Figure 13:
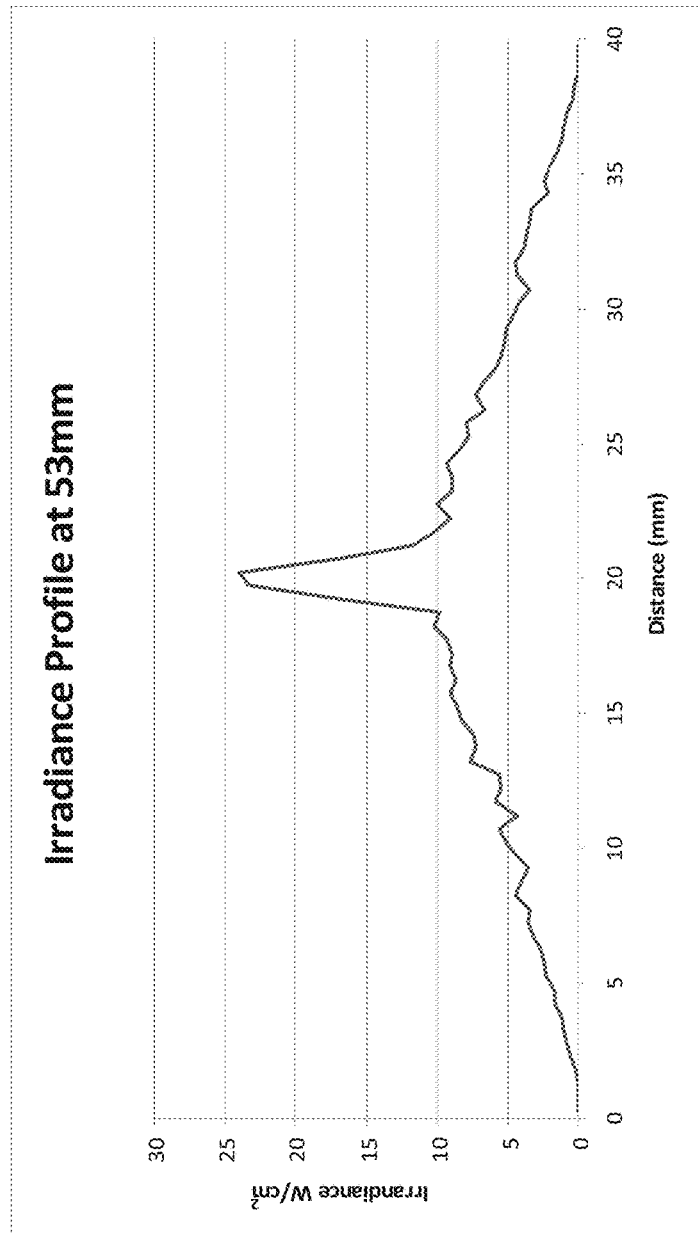
FIG. 13 is a graph illustrating an irradiance profile for a UV LED lamp head with a reflector optimized for a 53 mm focal plane in accordance with an embodiment of the present invention.

FIG. 13 is a graph illustrating an irradiance profile for a UV LED lamp head with a reflector optimized for a 53 mm focal plane in accordance with an embodiment of the present invention. According to the present example, maximum (peak) irradiance of approximately 24 W/cm$^2$ is achieved with an output beam pattern width of approximately 3.65 cm and producing an average irradiance across the width of the output beam pattern of approximately 5.9 W/cm$^2$ and total output power of approximately 21.7 W per cm of output beam pattern length. This example was generated with a computer model assuming the use of SemiLEDs' ~1.07× 1.07 mm LEDs, with each LED producing 300 mW output at 350 mA. It is to be noted that embodiments of the present invention could run each LED at higher current (e.g., approximately 2.5 A or more) at approximately 0.75 W to 1.25 W.

According to one embodiment, in which LED drivers are integrated within the UV LED lamp head module, off the shelf AC/DC power supplies designed for high volume "server farms" may be used. Exemplary front end supplies are available from Lineage Power USA model CAR2512FP series 2500W power supplies. Preferable supplies are Power-One LPS100 12V 1100W single fan server supplies that are highly efficient platinum rated front-end AC/DC power supplies that have power factor correction, may be in electrical parallel, and have a GUI i2C interface, the Lineage power supplies are available with a subsystem that incorporates four of these units off-the-shelf (OTS). In 2011 these Lineage units will be similar but with conduction cooling (without fans).

According to embodiments of the present invention, in addition to cooling the integrated drivers, the coolant water may also be advantageously employed to cool these power supplies simply by running the coolant line through a heat sink in communication with the elements (or the base plate) of the supply that need cooling. It is optimal to derate these Lineage supplies as they are more efficient at a percentage of their maximum power. By way of a non-limiting example, running each PCB with ~15 drivers at ~40 amps and ~4-5 volts one would use about 60% of the ~10000 W available. It is optimal to design for ~50A or greater and ~5.5 V to have some headroom now and into the future when the preferably ~16 LEDs that are around ~1000-1200 um square on each of all four sides (though they could be of any size and shape such as rectangular, or larger size such as ~2000 um or ~4000 um or larger per side) are desired to be operated at a current of ~3A per LED or ~48 per group solely by way of a non-limiting example. In one embodiment, the cathode bus bars 313a-b on each PCB 310a-b near the backside of the lamp body 305 could run nearly the length of the preferably ~300 mm long board (not shown) as well as solder pads running nearly the length of the PCB. In one embodiment, the cathode cross plate 375 represents a tie bar affixed across cathode bus bars 313a-b which provides an effective attach point for the preferably single main cathode wire 205 going from the UV LED lamp head module 200 to the AC/DC power supplies preferably in somewhat similar fashion to the preferable single main large AWG range ~1-10 and preferably ~2 AWG core anode wire going from the preferably constant current (CC) DC PCB boards of the UV LED lamp head module 200 to the supplies that are preferably connected to the AC mains to give a highly efficient power source to the LEDs with low ripple preferably less than 10% to maximize LED lifetime. On the PCB there may be some shared components of the aforementioned non-limiting example of ~15 CC drivers such that there would not be a definitive requirement for ~15 separate components that may not have to have their cathodes isolated. It should again be noted that 1-n cathode and anode cables may feed the lamp with electrical power from 1-n power supplies or mains. It may be preferable to use four Lineage USA 2500W power supplies per lamp and run them at derated power for efficiency. They are available with a common back end for ~4 power supplies. With or without the back end four separate anodes and cathode wires/cables per lamp may be considered so as to allow the use of smaller diameter cables (methode/cableco, USA) and or large cables and less resistive losses.

In view of the foregoing, it can be seen that embodiments of the present invention are predicated on closely spaced array(s) of LEDs, also known as high fill-factor arrays, so that maximum brightness can be obtained. This is to say that the optical power per unit area per solid angle is maximized, as brightness may be roughly defined in the present context as power per unit area per solid angle. This high brightness also correlates nearly linearly with heat flux/thermal demand as the waste heat from the electrical to optical power conversion becomes more dense as the array density increases. Embodiments of the present invention preferably utilize a fill-factor array of LEDs of equal or greater than 90%, but has a range of 30-100%. The application of a high fill-factor array in accordance with embodiments of the present invention lead to an extremely high and dense heat load on the order of 1000 W/cm$^2$ or more, range 100-10,000

W/cm². This high thermal flux is an artifact of the high brightness, i.e., the LEDs are in very close (1-1000 um) proximity to each other, operated at currents of 2-3 or more amps per square mm, (range 0.1 to 100 A), which results in extremely high heat flux demands, and of course concomitantly requires extremely low thermal resistance cooling technology that combines both a very high degree of cooling (e.g., convective cooling and/or conductive cooling (e.g., thin and high conductivity layers between the LED and flowing gas or liquid)) to achieve junction temperatures that are preferably as low as 40 C or less for long life and efficient operation at extremely high output power.

Figure 14A:
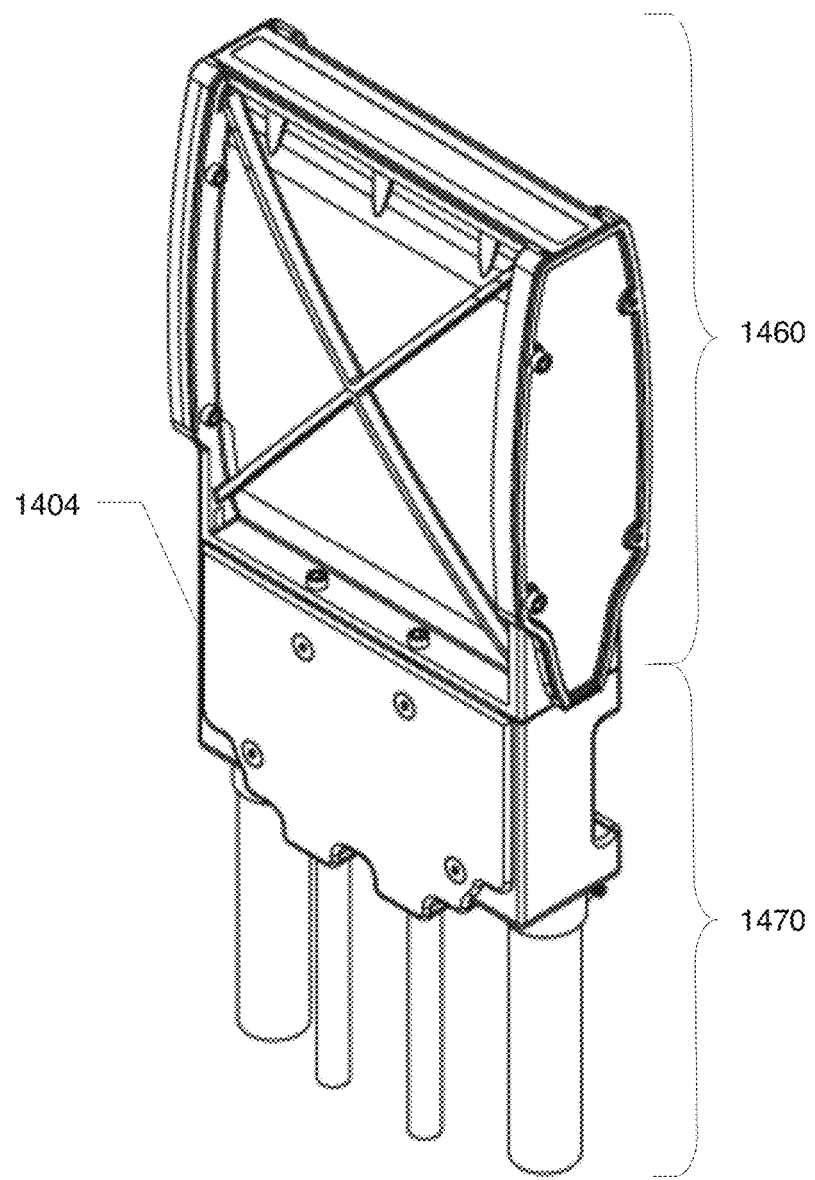
FIG. 14A is an isometric view of a UV LED lamp head module in accordance with an alternative embodiment of the present invention.
Figure 14B:
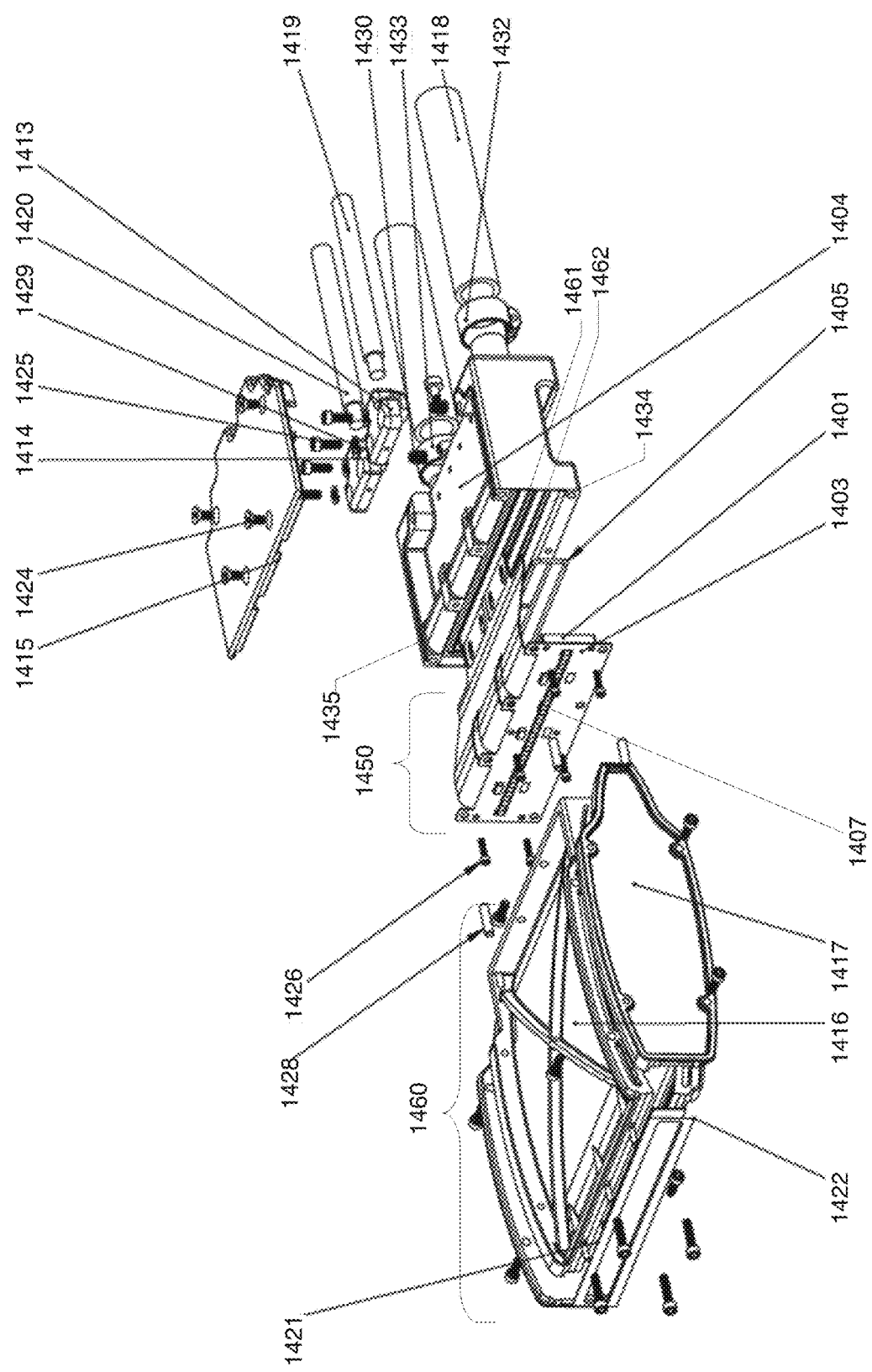
FIG. 14B is a side-facing, exploded view of the UV LED lamp head module of FIG. 14A.
Figure 14C:
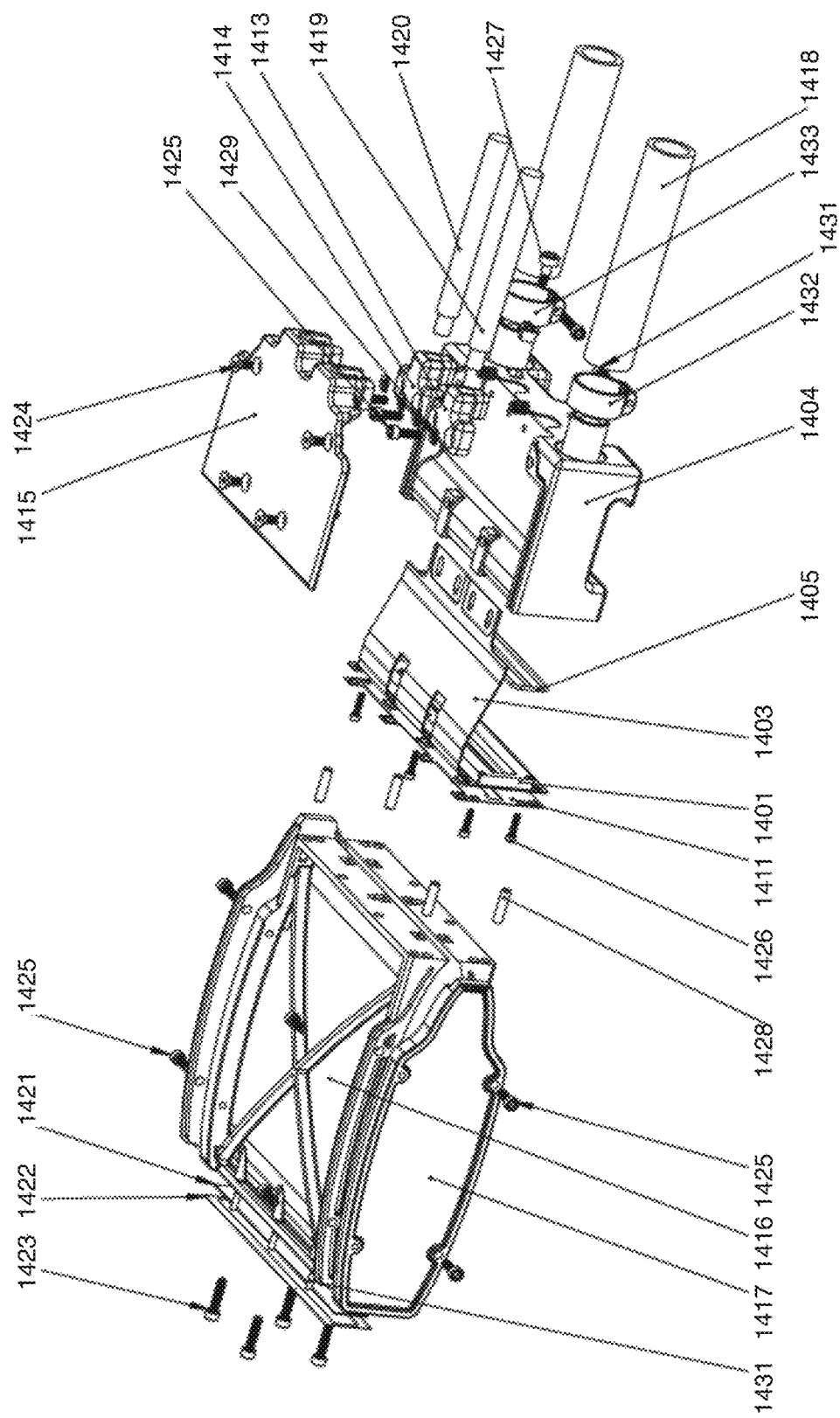
FIG. 14C is a rear-facing, exploded isometric view of the UV LED lamp head module of FIG. 14A.
Figure 14D:
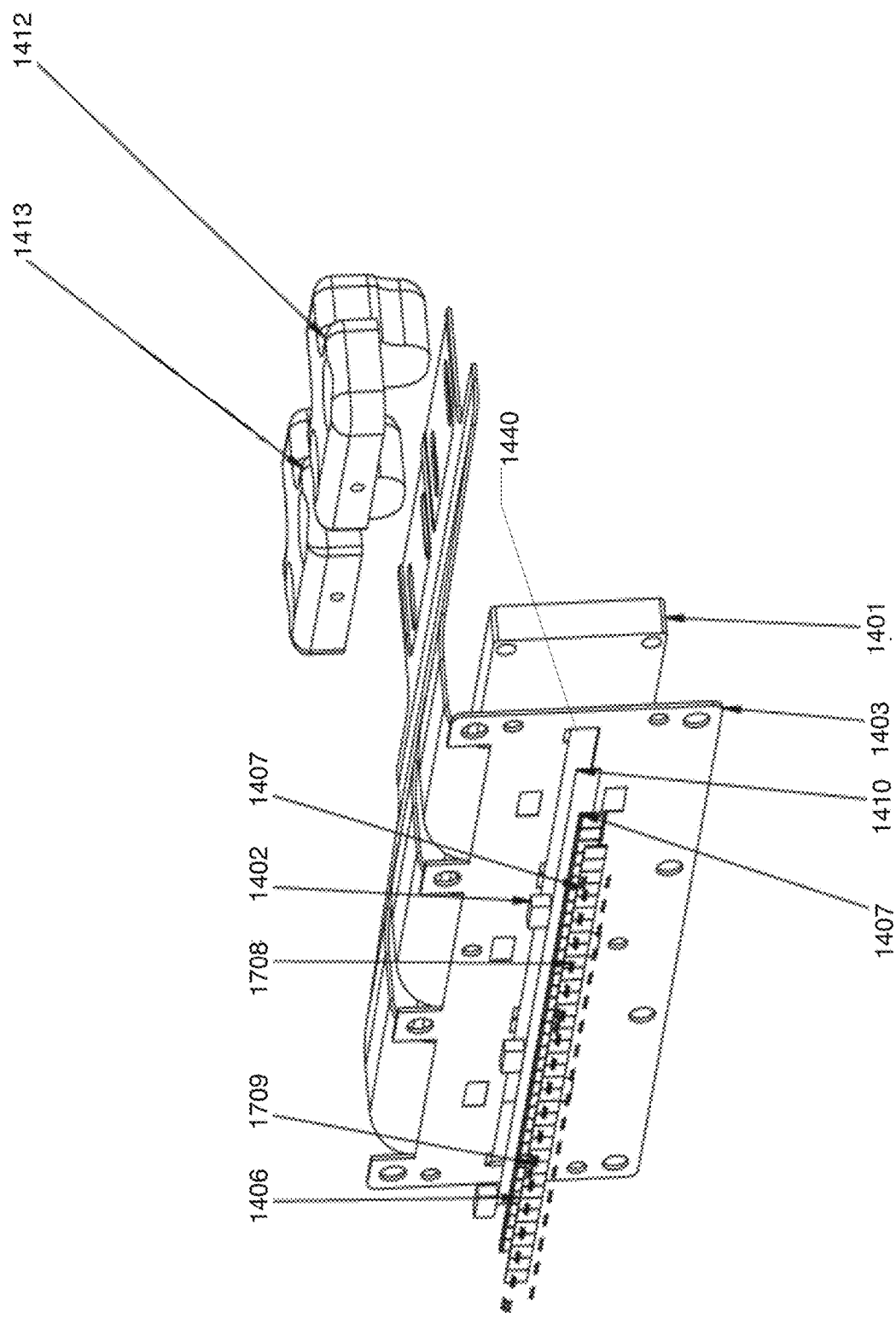
FIG. 14D is an exploded view of a flex circuit subsystem and cooling subsystem in accordance with an embodiment of the present invention.

An alternative embodiment of a UV LED lamp head module 1400 in which the LED array is comprised of multiple groups of seriesed LEDs connected in electrical parallel is now described with reference to FIGS. 14A-D. FIG. 14A is an isometric view of UV LED lamp head module 1400 in accordance with an alternative embodiment of the present invention. FIG. 14B is a side-facing, exploded view of the UV LED lamp head module 1400 of FIG. 14A, depicting the unassembled components of the lamp head module 1400 subsystems and their respective components. FIG. 14C is a rear-facing, exploded isometric view of the UV LED lamp head module of FIG. 14A, depicting the rear connections. FIG. 14D is an exploded view of flex circuit subsystem 1450 and cooling subsystem 1470 in accordance with an embodiment of the present invention.

In the present example, lamp head module 1400 includes a reflector subsystem 1460, a flex circuit subsystem and light emitting subsystem 1450 and a cooling subsystem 1470. These subsystems work together to emit UV light intended for use as a curing (e.g., photochemical curing) mechanism for materials such as, but not limited to, paints, coatings, inks, adhesives, laminates and the like. Cooling subsystem 1470, including a micro-channel cooler 1401 and lamp body 1404, is intended to cool light emitting elements, e.g., an array of LEDs, laser diodes or the like 1407 of the light emitting subsystem allowing for high power density light output. Cooling system 1470 may also include a means (e.g., mounting interface 1475) for mounting lamp head module 1400 or multiple lamp head modules (not shown) to an external device, such as an external frame, stand or track. Such track provides the means for the lamp head module(s) to be integrated into a manufacturing, printing or other process.

Reflector subsystem 1460 consists of a pair of reflectors 1418, a pair of reflector end caps 1417, an optical window 1421 and a magnetic window mount 1424. Reflectors 1418 may be bonded to reflector end caps 1417 by screws 1427 to form an internal reflective chamber (not shown), which works to focus light (preferably, according to non-imaging physical principles) emitted by the light emitting subsystem. The interior surfaces (not shown) of the internal reflective chamber are highly reflective. According to one embodiment, high reflectivity is achieved through a combination of polishing and coating of the interior surfaces.

Window 1421 is placed at the top of the reflective chamber and is fixed in place by window mount 1422 and an array of magnets or screws 1423.

Reflector subsystem 1460 is attached to cooling subsystem 1470 with the flex circuit subsystem 1450 interposed there between by a series of locating pins 30 and fixed in place by mounting screws. Optionally, a spacer layer (not shown—see FIG. 16B) may be placed immediately below the reflector subsystem 1460 to provide adjustment (e.g., z-height adjustment) and aid in the assembly process.

A main outlet lamp body cooling fluid channel 1461/1462 and a main inlet lamp body cooling fluid channel 1461/1462 are formed within lamp body of the cooling subsystem 1470.

Micro-channel cooler 1401 is recessed in pocket 1434 of lamp body 1404. This recessed pocket 1434 allows the flex circuit 1403 (that may be bonded to the top of micro-channel cooler 1401 and extends over one or more sides of the micro-channel cooler 1401) to be smoothly bent around an edge 1435 of lamp body 1404. Micro-channel cooler 1401 may be constructed as described above with reference to FIGS. 4A-C and FIGS. 5A-B; however, in the context of the present example, micro-channel cooler 1401 does not need to be conductive. As described above, micro-channel coolers meeting the cooling requirements described herein are available from Micro-Cooling Concepts of Huntington Beach, Calif.

Figure 16A:
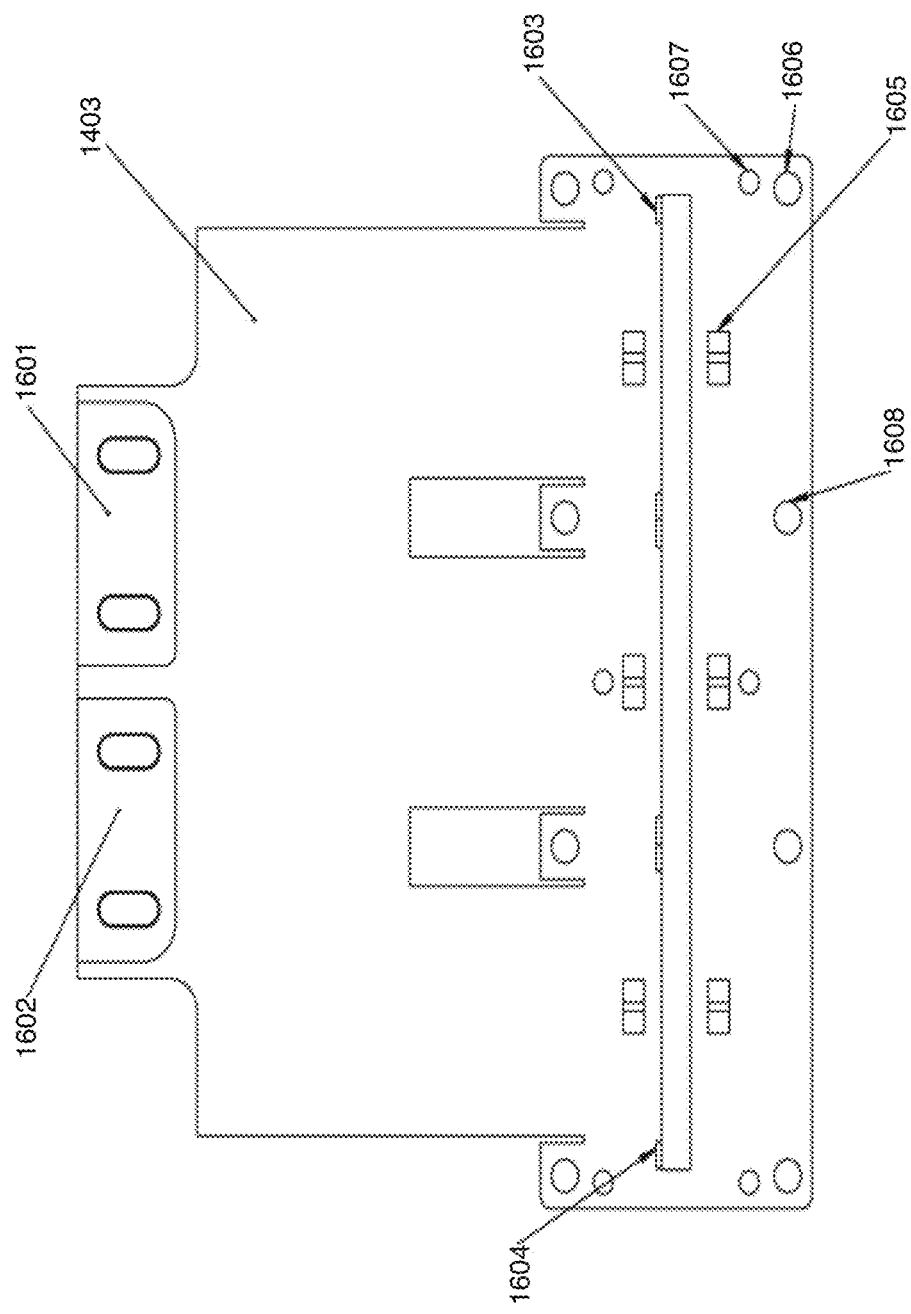
FIG. 16A is a top view of the flex circuit of FIG. 14B.
Figure 16B:
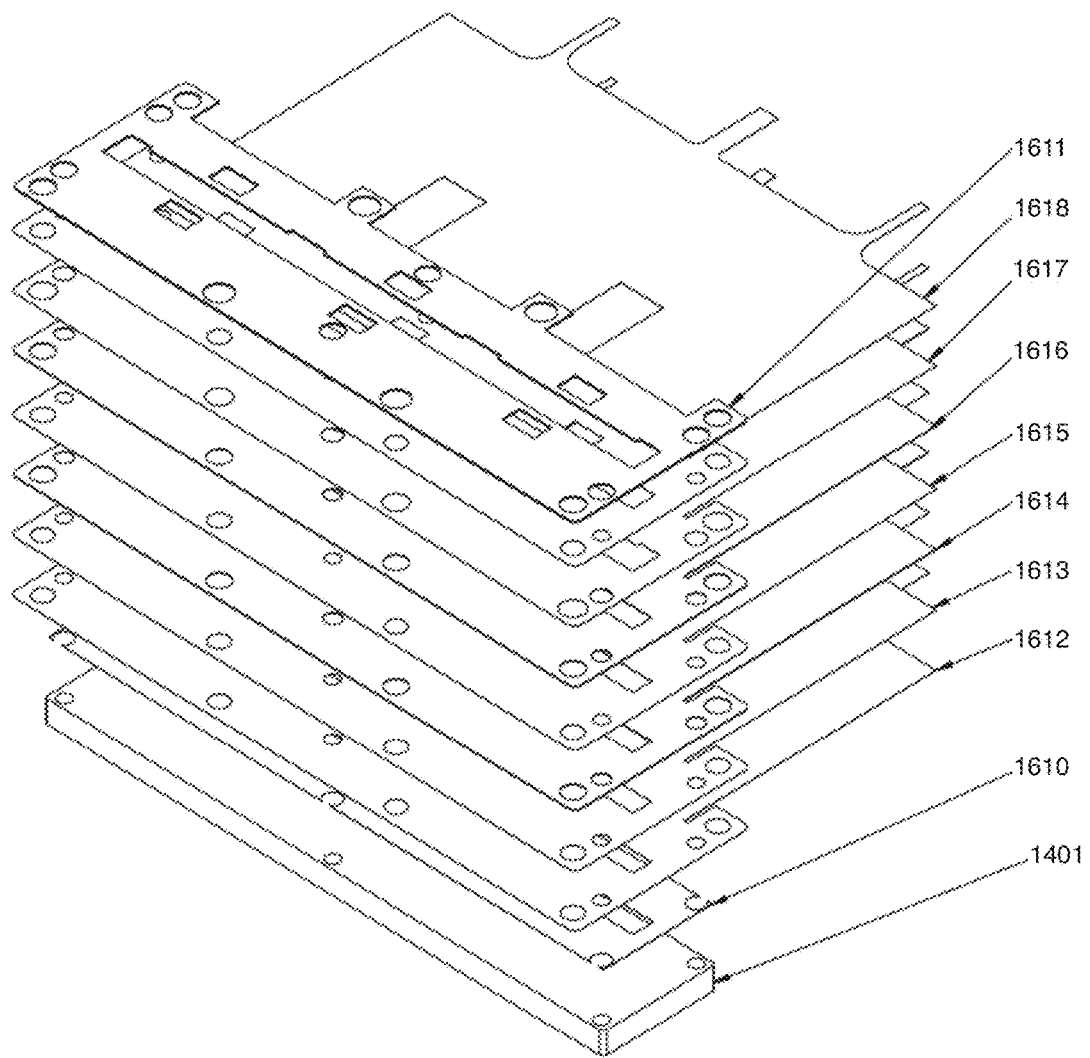
FIG. 16B is an isometric exploded view of the flex circuit of FIG. 14B.

As described in further detail below, in one embodiment, flex circuit 1403 is a multi-conductor flex circuit that preferably contains two conductors with opposite polarity. Flex circuit 1403 has a high aspect ratio in relation to its length along the long axis of LED array 1401 to the height of the LED array/submount combination. This allows a large amount of electrical current to flow to LED array 1407 in a compact z height thickness stack up. The stack up of the LED/submount is nearly the same as the flex circuit stack (as illustrated in FIG. 16B) and an optional free floating unattached spacer layer that makes up any z-height difference or intentionally adds to the z-height difference and establishes a base for the bottom of reflector subsystem 1460.

In the example depicted, an elongate opening 1440 (e.g., a void, a window, a gap, a hole or an aperture) in flex circuit 1403 serves a dual purpose of getting anode and cathode bond pads close to the LEDs and submount 1406 with low thickness (height), but may also serve as a mechanical guide when the submount 1406 is soldered into position. Indium Corp. of America, USA, provides both the flux (e.g., WS-3622) and the Indium containing preforms may have approximately 3% silver for better wetting and preform rigidity. The elongate opening 1440 may be rectangular or any other geometric shape.

In the depicted embodiment, flex-circuit 1403 is essentially formed over edge 1435 and the flow of electrical current in flex-circuit 1403 is essentially redirected from a plane that is substantially parallel to the p-n junction plane of LED array 1407 to a direction that is substantially perpendicular to the p-n junction plane. Flex-circuit 1403 fits under reflector subsystem 1460 and is further held in position by cover 1415. Zener diodes (e.g., zener diode 1402 available from Littel Fuse, Inc., USA) are shown in pockets (e.g., pocket 1436) formed within flex-circuit 1403 and are soldered into place and connected to a cathode layer of flex-circuit 1403 by a plated through hole in accordance with conventional surface mount technology (SMT) manufacturing technology. As described above, lamp body 1404 may be machined or injected molded or some combination.

Flex circuit subsystem 1450 is connected to cooling subsystem 1470 by hardware 1426. According to one embodiment, a fluid-tight seal is produced between a micro-channel cooler 1401 and a lamp body 1404 of lamp head module 1400 by use of a custom-shaped o-ring 1405 available from Apple Rubber Products of Lancaster, N.Y. Pins 1428 locate the reflector subsystem 1460 to the cooler subsystem 1470.

In the present example, lamp body 1404 provides both the fluid cooling paths for inlet and return as well as the mechanical structure to mate and fix all the subsystems together. Cooling fluid enters lamp body 1404 from an input tube 1420 connected to lamp body 1404 by an inlet tube clamp 1432 and its associated hardware 1431. Fluid flows from the inlet plenum of the fluid body through the micro-channel cooler 1401 where it becomes calorically warmed by the waste heat generated by LED array 1407. This warmed fluid then travels through an exhaust plenum (typically of identical geometry) to an outlet plenum where it is then returned to a cooling means (not shown) (e.g., a chiller, heat exchanger or the like) via an output tube. Output tube may be affixed to lamp body 1404 in much the same way as the inlet side but uses a differently configured (e.g., keyed) clamp 1416.

A cover 1415 is mounted to lamp body 1404 with hardware 1424. Cover 1415 covers and protects flex circuit 1403 and wire connectors of flex circuit subsystem 1450. Cover 1415 also holds the shape of the flex circuit 1403.

In one embodiment, lamp body 1404 has an integral protrusion (e.g., inlet clamp 1432) that inlet hose 1420 is pushed over. Similar connectivity may be provided for the outlet hose. Preferably captive and/or keyed machined hose clamps (e.g., 1432) are employed. The keyed location prevents unwanted rotation of the hose clamps and the captive feature makes installing hoses far less cumbersome. The hose clamps may preferably have "t" shaped slots, which may be wire electro-discharge machined (EDM) with preferably 120-degree separation for more uniform hose clamping action.

Cathode electrode 1413 and anode electrode 1412 are shown in FIG. 14D. These electrodes clamp or sandwich the flex-circuit 1403 between themselves and the lamp body 1404. Under each electrode are exposed areas of either the flex-circuit anode layer or the flex-circuit cathode layer so as to effect electrical contact and continuity between the respective electrode and flex-circuit surfaces.

In the context of the present example, flex circuit subsystem 1450 preferably includes a high-density array of LEDs 1407, a multi-layer, multi-conductor flexible circuit 1403, a micro-channel cooler 1401, an electrostatic discharge (ESD) protection device 1402, a power supply cable 1421 and a power return cable 1422. The cables are attached with their respective electrodes (e.g., mounting blocks) 1412 and 1413. These mounting blocks connect each cable to their respective conductor layer in flex circuit 1403. This enables electrical power to travel from a remote power source (not shown) to lamp head module 1400 via the power cables 1419 and 1420 and to the LED array 1407 through flex circuit 1403.

According to one embodiment and as described in further detail below, LED array 1407 is made up of multiple (e.g., three) smaller arrays of seriesed LEDs arrays placed in parallel, each of the multiple smaller arrays (each a "group") include multiple (e.g., twelve) LEDs. In one embodiment, these smaller arrays are constructed by solder and wire-bonding the LEDs to a submount 1406.

LEDs are arrayed along the submount 1406 in the long direction to form LED array 1407. The last edge of the first LED proceeds the beginning edge of the next LED, and so on (e.g., placed edge-to-edge). In one embodiment, between any two LEDs there is no intervening metalization and/or bond pad or circuit trace material. This allows the LEDs to be placed as closely as possible to each other thereby maximizing light emitting area in the long direction of LED array 1407 by minimizing dead space between LEDs. If there was elongate bonds pads, wire bond pad area, and/or circuit trace metalization between the LEDs, then the LEDs would have to be placed further apart, which would compromise the light emitting area along the long direction of the LED array 1407. In one embodiment, maximizing light emitting surface in the smallest area—length×width—is desired. Furthermore, a high aspect ratio—length longer than width—is also employed by the elongate reflector halves/clam shell—to control the emitted photons in a pattern on the workpiece that is preferably the same geometric shape as the emitting area with the goal of eliminating scattered photons around the edges (a/k/a blur).

In various embodiments and as described in further detail below, there may be three distinct wire-bond connections for each group of LED array 1407. For example, wire-bond connections (e.g., wire-bond 1708) may be made between the positive power path layer, also known as supply or anode, of flex circuit 1403 and anode pads of a first LED in a group. A second wire-bond type (e.g., wire-bond 1709) occurs from each LED in a group (with the exception of the final LED of the group), which bonds the LED cathode pad to a stem on submount 1406 electrically connecting it to the anode of the next LED in the group. The cathode pads of the final LED are connected to the cathode or return layer of flex circuit 1403 by a third type of wire-bond (not shown—see wire-bond 1710 of FIG. 16C). Wire-bonds 1708, 1709 and 1710 are shown in greater detail in FIG. 16C and FIG. 17D-F.

In accordance with one embodiment, the multiple groups of seriesed LEDs are placed in a line, edge to edge to produce a high-density array. In one embodiment, electrically, LED array 1407 is an array of multiple (e.g., three) parallel paths each containing multiple (e.g., twelve) LEDs wired in series.

According to one embodiment, submount 1406 is bonded to micro-channel cooler 1401 using a thin solder preform 1410 (approximately 20 microns or less) to minimize thermal resistance between the LEDs and cooling fluid, which flows through micro-channel cooler 1401.

According to one embodiment, LED array 1407 is comprised of 3 groups of 12 80 mil×80 mil LEDs available from SemiLEDs, Taiwan wired in electrical series. The three groups are wired in electrical parallel. Depending upon the particular implementation, more or fewer paralleled groups can be used and each of the groups of seriesed LEDs may also comprise more of less than 12 seriesed LEDs. The individual LEDs of LED array 1407 may be the large chip variety, which are approximately 2019 um (80 mil) on each side and 145 um thick. In one embodiment, a UV light emitting thin film material, e.g., GaN, may be deposited on native GaN substrates available from Inlustra Technologies, Inc. of Santa Barbara, Calif. This would enable extreme current densities, e.g., 3+amp/mm$^2$ of LED chip area, with little to no current droop that is common to GaN thin film devices deposited on foreign substrates, e.g., sapphire, SiC. Among other enabling reasons for the extreme current densities is the near perfect lattice match between GaN and GaN and the high thermal conductivity of GaN. Such extreme current densities generate extreme heat fluxes, which are best managed and/or ameliorated by using a micro-channel cooler as described in the context of various embodiments described herein.

According to one embodiment, the aspect ratio of the length to width of the LED array 1407 is preferably 1:36, but the range may be 1:5-1:1,000.

The preferably 12 seriesed LEDs (range could be 1-100) shown on each submount (e.g., submount 1406). The groups of parallel LEDs could be binned so that each group all have about the same impedance to reduce deleterious current hogging effects. Load balancing resistors are yet another means for accomplishing impedance matching so as to (again reduce the chance of a current hogging group), but pre-binning perhaps is considerably more elegant and cost effective. An off the shelf power supply from GE/Lineage, CP200, Plano, Tex. is the preferable AC-DC power supply (also known as a rectifier) used to power the UV LED lamp of the current embodiment. The power supply is presently available as a 2000 or 2700 W unit with ~97% efficiency. It also has a very compact form factor and has an extremely rare large output voltage swing. This large output voltage swing allows the 3 groups of 12 LEDs to be varied from 100% full power of approximately 3 A/mm² LED current density and down to a level that is perhaps 0-75% of full power by just using a 0-5V input control. Hence no heavy, expensive, and inefficient DC-DC converters are required and one can rely on the full efficiency of the compact, long life (2M Hr.MTBF) power supply (rectifier) available from GE.

Figure 15C:
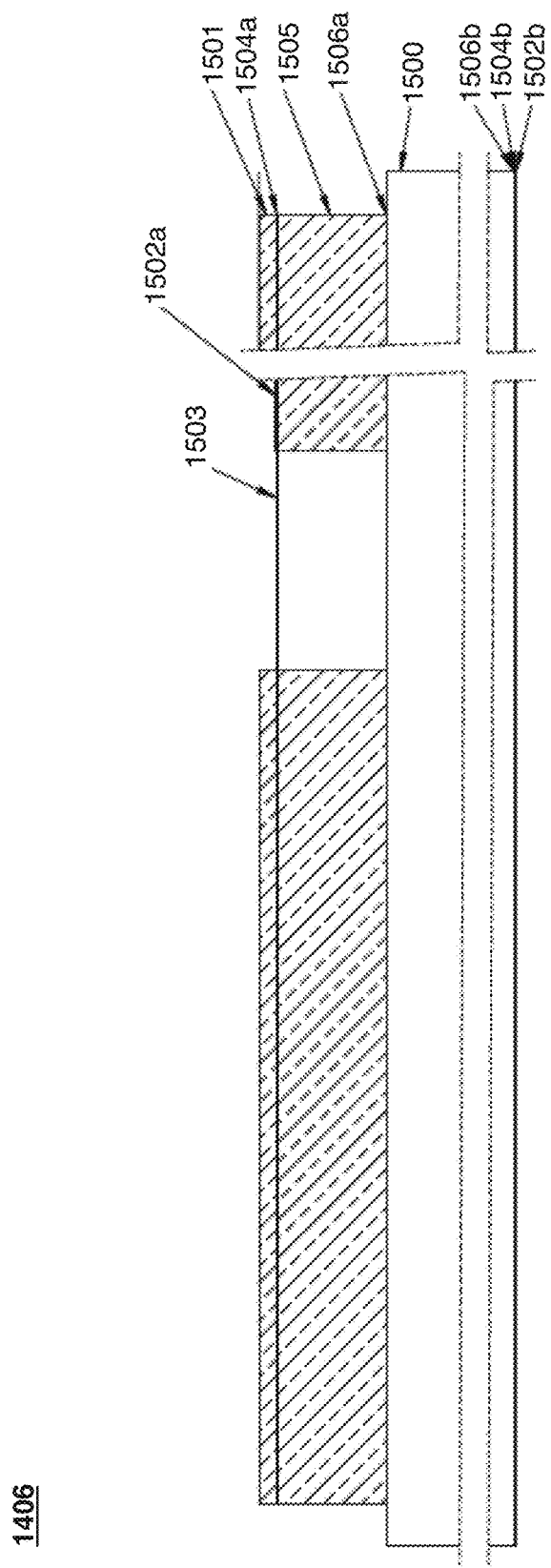
FIG. 15C is a cross section of the submount of FIG. 15A.
Figure 15D:
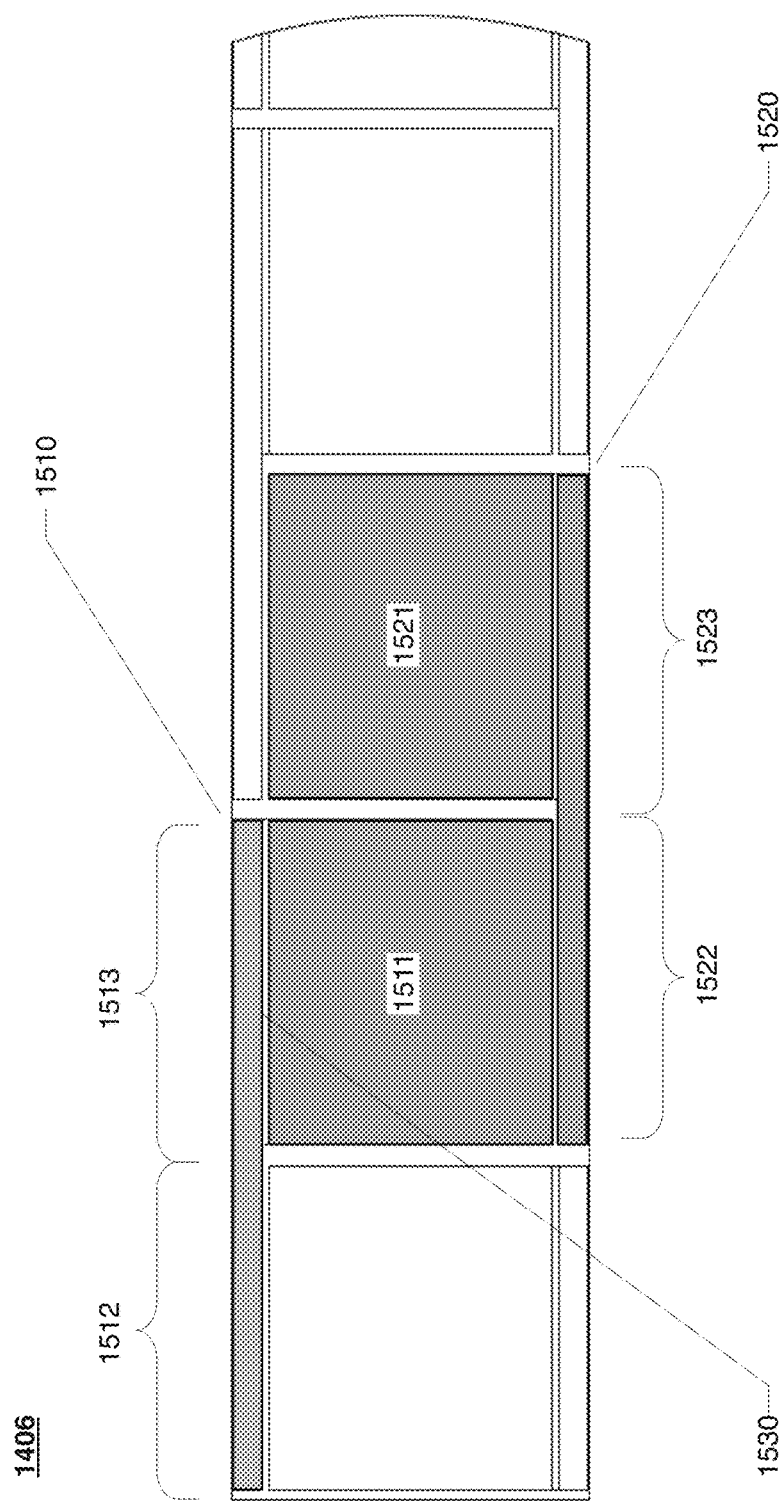
FIG. 15D is an enlarged view of section D of FIG. 15A.

Submount 1406 is now described with reference to FIGS. 15A-D. FIG. 15A is a top view of a submount 1406 in accordance with an embodiment of the present invention. FIG. 15B is an isometric view of the submount of FIG. 15A, showing raised high current carrying electro-deposited features of the top surface of submount 1406. FIG. 15C is an edge view of submount 1406 of FIG. 15A, which illustrates various layers of submount 1406 in accordance with an embodiment of the present invention. FIG. 15D is an enlarged view of section D of FIG. 15A, illustrating the unique interlocking geometric configuration of bond pads 1511 and 1512 for two intermediate LEDs in a group of a seriesed LED array. For accuracy and clarity solder barrier 1530 is shown, but it is the very top most layer and electrical current flows underneath it. While for brevity only a single submount may be described below, it is to be understood that multiple submounts (e.g., 3) may be connected in electrical parallel in accordance with embodiments of the present invention.

According to one embodiment, submount 1406 has two primary functions: (i) to provide a means for electrically connecting one LED within a seriesed group to the next LED within the seriesed group and to flex circuit 1403 at the beginning and end of each group (the flex circuit 1403 connections are shown in greater detail in FIG. 17F); and (ii) to provide a spacially precise geometric mount for the LEDs that serves to locate and form them into a high-aspect ratio linear array.

LEDs of LED array 1407 are soldered to an about 5 micro inch gold layer on a bond pad portion (e.g., bond pad portion 1511) of submount 1406. Those skilled in the art will recognize various other means of affixing the LEDs to the bond pad are possible. For example, epoxy of diffusion bonding may be used to affix the LEDs.

According to one embodiment, the solder used is a SnCu deposited on the bottom surface of the LED. Alternatively, a paste available from Indium Corp. of America may be used, which may use a flux carrier (e.g., WS-3622) to attach the LEDs. In yet another embodiment, solder preforms may be used.

Returning to the present example, underneath the thin gold below bond pad area 1511 (and as described further below with reference to FIG. 15C) is a Ni diffusion barrier and Ti adhesion layer. Finally, there is a thick (e.g., 1 to 2 mil) copper current conduction layer forming an interlocking L-shaped structure (e.g., 1510 and 1520), a thick "arm" portion of which (e.g., 1511 and 1521) extends completely below the soldered portion of the LED and extends around to form a current trace (e.g., 1513 and 1523) and a wire bond pad area (e.g., 1512 and 1522), which together represent a "stem" of their respective L-shaped structures 1510 and 1520. In one embodiment, submount 1406 includes multiple alternating L-shaped structures in opposing orientation. The L-shaped patterned circuit material layers may be patterned on the submount in an inter-locking arrangement in which the stem portion of adjacent L-shaped patterned circuit material layers of the plurality of L-shaped patterned circuit material layers are located on opposite sides of the array and run substantially parallel to each other.

Since stem portion 1512 of L-shaped copper current conduction layer 1510 operates as a wire bond area, in order for reliable wire bonds to form, it is desirable to have thicker 125 micro inch gold. Also, it is desirable to avoid solder creep or flow onto bond pad areas (e.g., 1511 and 1521). Hence, in one embodiment, a solder dam or solder barrier (e.g., solder barrier 1530) is effectuated from the square edge of bond pad 1511 at the beginning of the elongate portion and extending about 2 mils towards the wire pad trace region. This solder dam is preferably TiW that is sputtered through a mask onto the wafer before the surmounts are diced into individual chips. This solder dam functions because TiW readily oxidize in air and solder will not flow across an oxidized surface.

Although bond pad (e.g., 1511), circuit trace (e.g., 1513), and wire bond pad area (e.g., 1512) all essentially share the same monolithic conductive current carrying layer, which is essentially the same geometric shape described by an "L", the bond pad area can still be considered elongate as it extends beyond the area that is substantially underneath the LED. This elongate shape is orthogonal to the long axis of the LED array 1407, as well as the array of submounts that are themselves arrayed edge to edge in an elongate pattern.

Circuit trace (e.g., 1513) is elongate along the long axis of LED array 1407 as it not only traverses the gap between the last edge and the beginning edge of each LED in the array, but also traverses the distance between the last edge and the beginning edge thereby it is longer than an LED edge. This elongate portion of the circuit trace is the long thin "stem" of the "L" shape. The length of individual circuit traces, (e.g., circuit trace 1513) which includes the distance between the LED edges plus the length of an LED edge itself is preferably an approximate ratio of 8:1, with a range of 4:1 to 16:1. Circuit traces preferably have a thickness (including all layers whether adhesion, current carrying, or protective) that is preferably 50 microns (2 mil thick) with a range of approximately 10 to 100 microns and a width that is preferably at least 250 microns (10 mil) wide with a range of 50 to 500 microns. In one embodiment, the cross-section is about 5:1, but could range from 2:1 to 20:1.

Since embodiments of the present invention involve a high current flux device, sufficient conductive material (e.g., copper) is typically used to carry electrical current without undue resistive losses. In a conventional series circuit layout, electrical current from one LED to the next is often carried through small wires that are conventionally bonded to the top surface of one LED and then to an extended (or elongate) bond pad of the next LED—with the bond pad in electrical communication with the bottom surface of this next die. As stated previously, this type of conventional series circuit layout could take up an undesirable amount of area that does not emit photons (non-light emitting area) along the length of the elongate array. Therefore, in one embodiment, instead of using wires to carry the current between LEDs, a circuit trace parallel to the outside edge (see, e.g., 1801 of FIG. 18C) of the LED array 1407 is used.

According to one embodiment, submount 1406 consists of a substrate material (e.g., beryllium oxide (BeO)). In one embodiment, this layer is kept as thin as is reasonably possible in order to minimize the thermal resistance while still maintaining manufacturability. In the present example, the bottom surface of the BeO wafer may consist of three layers: (i) a titanium adhesion layer 1506b, a nickel barrier 1504b to prevent absorption and diffusion of a gold flashing 1502b to provide a bondable surface. These layers allow solder to bond to the gold layer and to micro-channel cooler 1401.

The top surface of the wafer has another isolation barrier with a copper layer 1505 on top. Copper layer 1505 behaves much the same way as a copper etch on a traditional printed circuit board, providing electrical traces and forming pads on which components may be mounted. In one embodiment, the thickness of copper layer 1505 is selected to maximize thermal conductivity and minimize electrical resistance while maintaining a reasonable manufacturing cost. The top surface of copper layer 1505 is coated with nickel barrier 1504a to prevent diffusion of the above gold coatings. In the areas where solder 1699 is applied and a SMT component, in this case, an anode pad of the LED, a thin gold flashing 1502a may be applied. In areas where wire-bonds are to be connected, a thicker gold pad 1501 may be applied. In areas where solder is not desired an insulation or solder stop layer 1503 of TiW is present. In one embodiment, solder stop layer 1503 is used as a "solder dam." The solder stop layer 1503 also helps to ensure the LEDs remain centered on the bond pads and do not float during the soldering process while maintaining electrical continuity to other pads through the copper layer 1505 below. In this manner, all top layers may be formed to create multiple (e.g., twelve) electrically isolated sections—one for each LED in the group.

In one embodiment, in order to maintain electrically continuity between the bond pad and the circuit trace regions they are of monolithic construction. This construction may be manufactured via a photolithographic process on the native submount wafer that is preferably BeO or selected from the group of materials that are preferably both thermally conductive and electrically insulating, e.g., AlN, diamond, silicon, GaN and the like.

In the context of the present example, a first seed layer of metal may be sputtered by conventional sputtering means through a mask that has the inter-locking "L" shaped pattern that is found repeating down the long axis of the submount 1406. This pattern is built up through an electro-plating process. A highly electrically conductive metal, e.g., copper, is preferred. The seed layer may have an adhesion layer, e.g., titanium 1506, sputtered firstly. After the thick, preferably copper layer is electro-plated, a diffusion layer 1504a, e.g., nickel, is deposited either by sputtering or electro-plating means. Finally, a protective layer 1501 may be deposited by sputter or electro-plating means. This protective layer is usually a sputtered precious metal, e.g., silver or gold. These metals are usually employed because wires are conventionally and easily bonded to this protective layer 1501. This protective layer also prevents oxidation of the current carrying layer 1505. A solder dam (or solder barrier) (e.g., solder barrier 1503) layer is provided in one embodiment of the present invention. It separates bond pad region 1511 from the circuit trace/wire bond region 1513 and prevents solder 1699 from under the die (on top of the bond pad) from migrating into or onto the region where wire bonds may be affixed (the wire bond pad region). Solder in this region would have a deleterious affect on wire bond reliability. Solder dam (e.g., solder dam 1503) is preferably deposited through a mask by sputtering means and is preferably a highly oxidative material, e.g., TiW.

In the context of FIG. 15D, two exemplary electrically isolated L-shaped structures are shaded 1510 and 1520. Each of the shaded L-shaped structures 1510 and 1520 denote the electrically connected layout of one arm (bond pad) and stem combination. A solder dam (e.g., solder dam 1530). This unique geometry allows LEDs to be placed in an array with an absolute minimum of space between them. This density allows for an exceptional power output to be attained with a minimum of space. It also allows for heat to be efficiently removed from the LEDs with a minimum of space used.

As described above, solder barrier 1530 between bond pad area 1511 and wire bond/circuit trace area 1513 prevents solder between the bond pad and the LED from spreading onto the wire bond area 1513 and contaminating the surface, which could interfere with wire bonding. The solder dam 1530 is preferably deposited by sputtering a highly oxidizable metal or metal combination, e.g., TiW. The TiW will oxidize readily and thereby prevent any solder from spreading over it. Depending upon the particular implementation, the thickness of the TiW may be on the order of angstroms or nanometers.

Figure 16C:
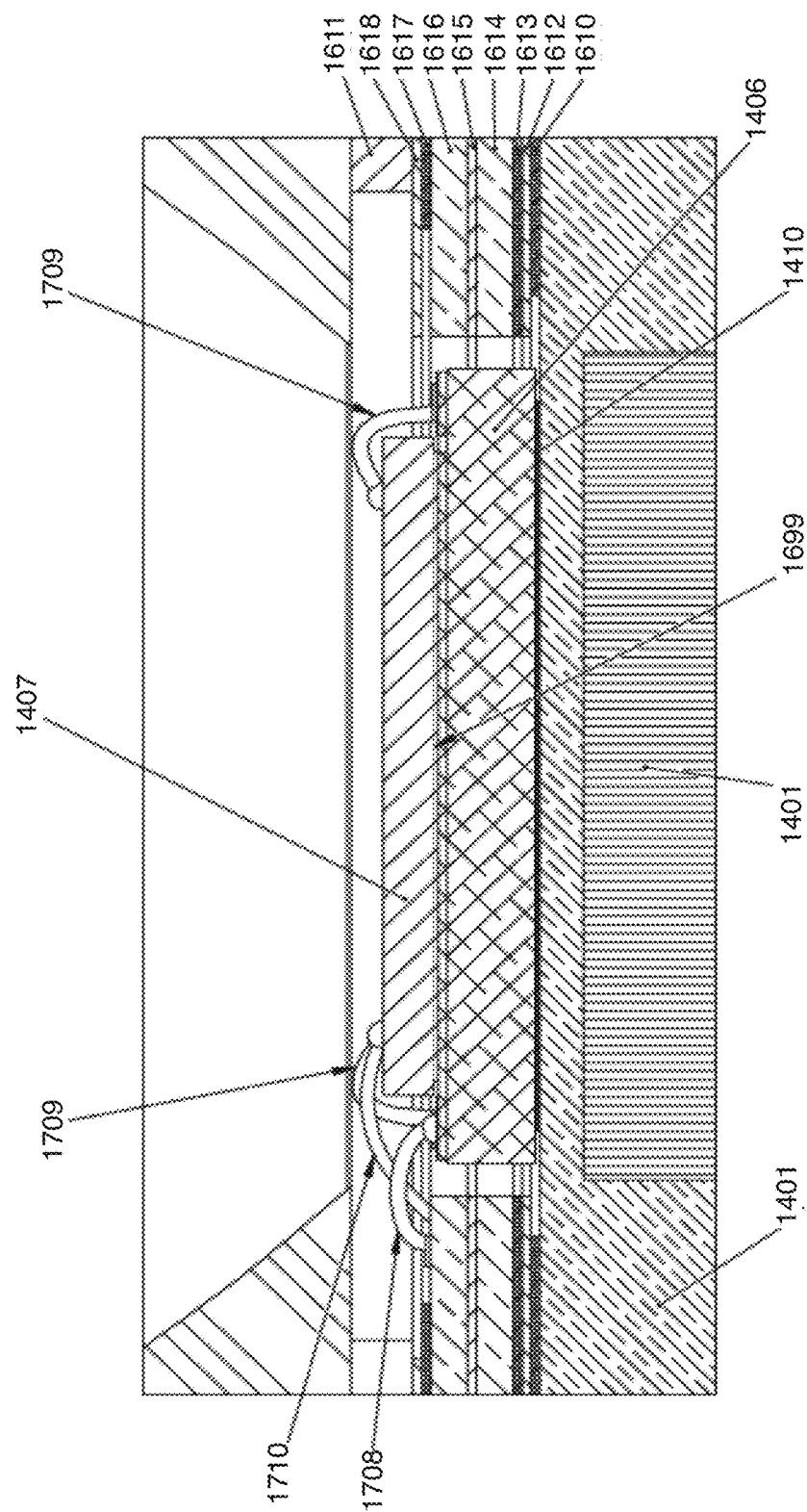
FIG. 16C is a magnified front cut-away view illustrating an LED array and its interface with a submount and various flex circuit layers in accordance with an embodiment of the present invention.

Flex circuit 1403 is now described with reference to FIGS. 16A-C. FIG. 16A is a top view of flex circuit 1403 of FIG. 14B. FIG. 16B is an isometric exploded view of flex circuit 1403 of FIG. 14B, illustrating the vertical construction of a flex circuit stack and its position and orientation to the micro-channel cooler 1401 in accordance with an embodiment of the present invention. FIG. 16C is a cross section of the flex circuit 1403 of FIG. 14B, which illustrates the various layers of the stack once assembled.

In the present example, flex circuit 1403 is a multilayer flexible assembly consisting of two isolated electrical layers and associated polyamide isolation layers and adhesive layers. An anode pad 1601 is present on the top edge of flex circuit 1403, as is a cathode pad 1602. These pad areas provide the respective wire mounts for a firm electrical contact area to appropriate copper conductive layer by, for example, removing the material of all above layers from the stack in the desired region. Material may be removed in the same fashion from the area above a series of three anode wire-bond pads 1603 and cathode wire-bond pads 1604. These exposed copper areas may be nickel barrier coated and gold flashed in order to provide a bondable surface. In one embodiment, flex circuit 1403 also provides a mounting area 1605 and pair of bond pads for ESD protection. In the illustrated configuration, six such areas are present. Each area has a cathode and anode pad and is located on the upper conductive layer. The other layer is connected to a pad that is isolated from the rest of the layer by a captive plated through-hole via.

According to the present example, the center of flex circuit 1403 consists of an electrically insulating polyamide core 1615 made out of a dielectric material, e.g., Kapton available from Dupont in Wilmington, Del. In one embodiment, a copper layer is additively grown on the bottom of this core and forms a cathode conductor layer 1614. The same process can be applied to the top of the core and this layer forms an anode conductor layer 1616. Copper thickness may vary, but should be as thick as possible to maximize current carrying capacity while still maintaining an appropriate bend radius to accommodate the geometric constraints of the lamp head module as a whole. All other layers should ideally be kept at a minimally manufacturable thickness so as to not further reduce flexibility of flex circuit 1403.

In the context of the present example, an adhesive layer 1617 is placed on the top of the surface of anode layer 1616. Its purpose is to allow a polyamide protective coverlay 1618 on the top surface of the flex stack. These two layers are removed in areas where access to the anode conductor is desired as shown in FIG. 16A. The same process is applied to the exposed surface of the cathode conductor layer with an adhesive layer 1613 and coverlay 1612.

An adhesive layer 1610 that is roughly the dimensions of micro-channel cooler 1401 may be applied to bond micro-channel cooler 1401 to flex circuit 1403 during a final lamination process.

With reference to FIG. 16C, it should be noted that if the macro reflector is set too high above the emitting layer of the LEDs output efficiency will suffer as photons will impinge on the bottom surface of the reflector without entering the macro-reflector inlet aperture. Efficient capture of photons emitted by an LED by a reflector is known as capture efficiency. Photons that impinge on the bottom side of the reflector will be wasted and they will simply warm up the reflector and do no work on the workpiece. On the other hand, if the macro-reflector is set too close to the emitting surface of the LEDs there is a chance that it could touch the wires and create shorting, ESD, or lifetime issues. As such, in one embodiment, the base of the reflector is positioned at a precise, desired distance from the emitting surface of the LED array 1407 using a spacer layer 1611. According to one embodiment, the entrance aperture of the reflector pair is positioned within 0 to 25 microns (range 0-250 microns) above or below the light emitting surface of the LED array 1407. Note that in the present example, the spacer layer 1611 does not extend as far as the other layers so as to not unnecessarily add thickness to the bend region, which would make the bending of the flex circuit 1403 around the edge of the lamp body more difficult.

Although in the present example, flex-circuit 1403 is shown as wrapping around one side of lamp body 1404, in alternative embodiments, one or both of the anode and cathode layers could wrap around both sides and the anode and cathode layers could be continuous between both sides or have an electrical discontinuity between both sides.

Figure 17A:
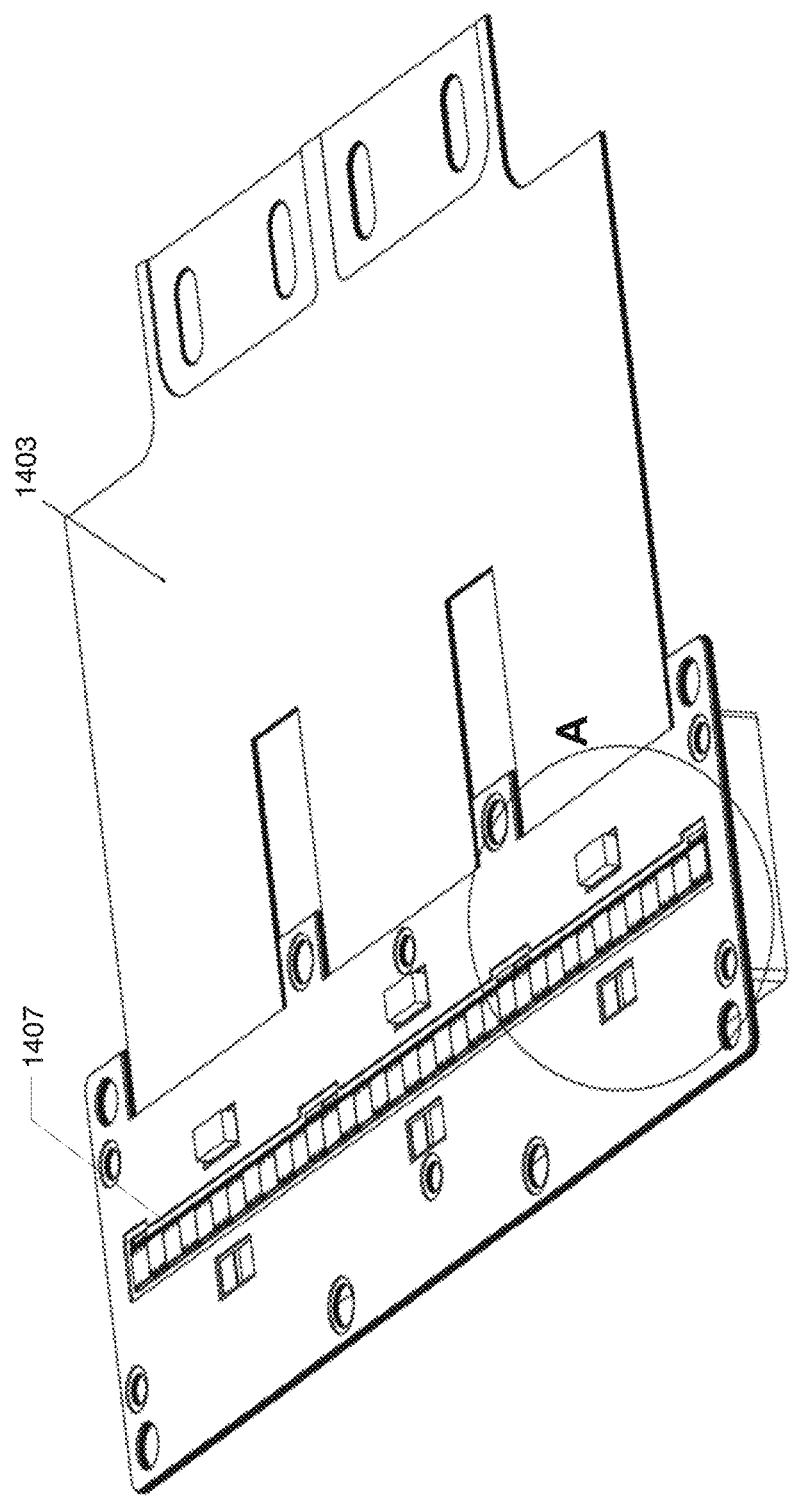
FIG. 17A is an isometric view of the LED array assembled to the flex circuit and the micro-channel cooler in accordance with an embodiment of the present invention.
Figure 17B:
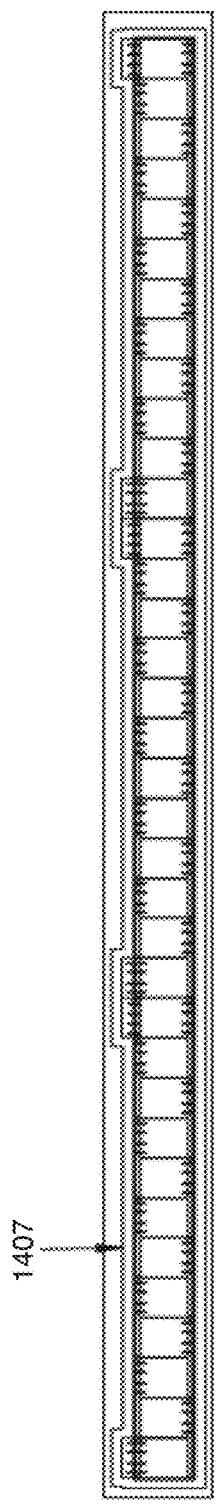
FIG. 17B is a top view of the LED array of FIG. 17A.
Figure 17C:
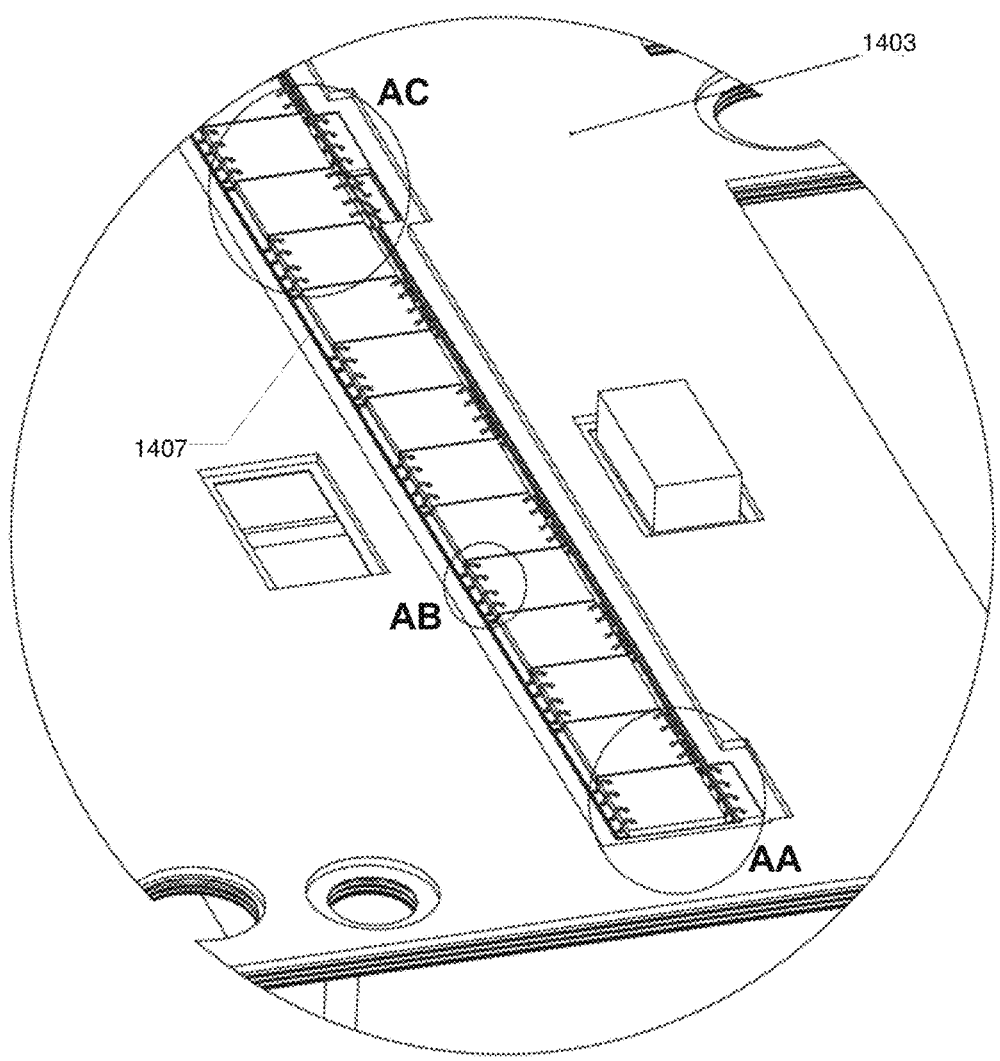
FIG. 17C is an enlarged view of section A of FIG. 17A showing wire-bond connections for a group of electrically seriesed LEDs of the LED array of FIG. 17B.
Figure 17D:
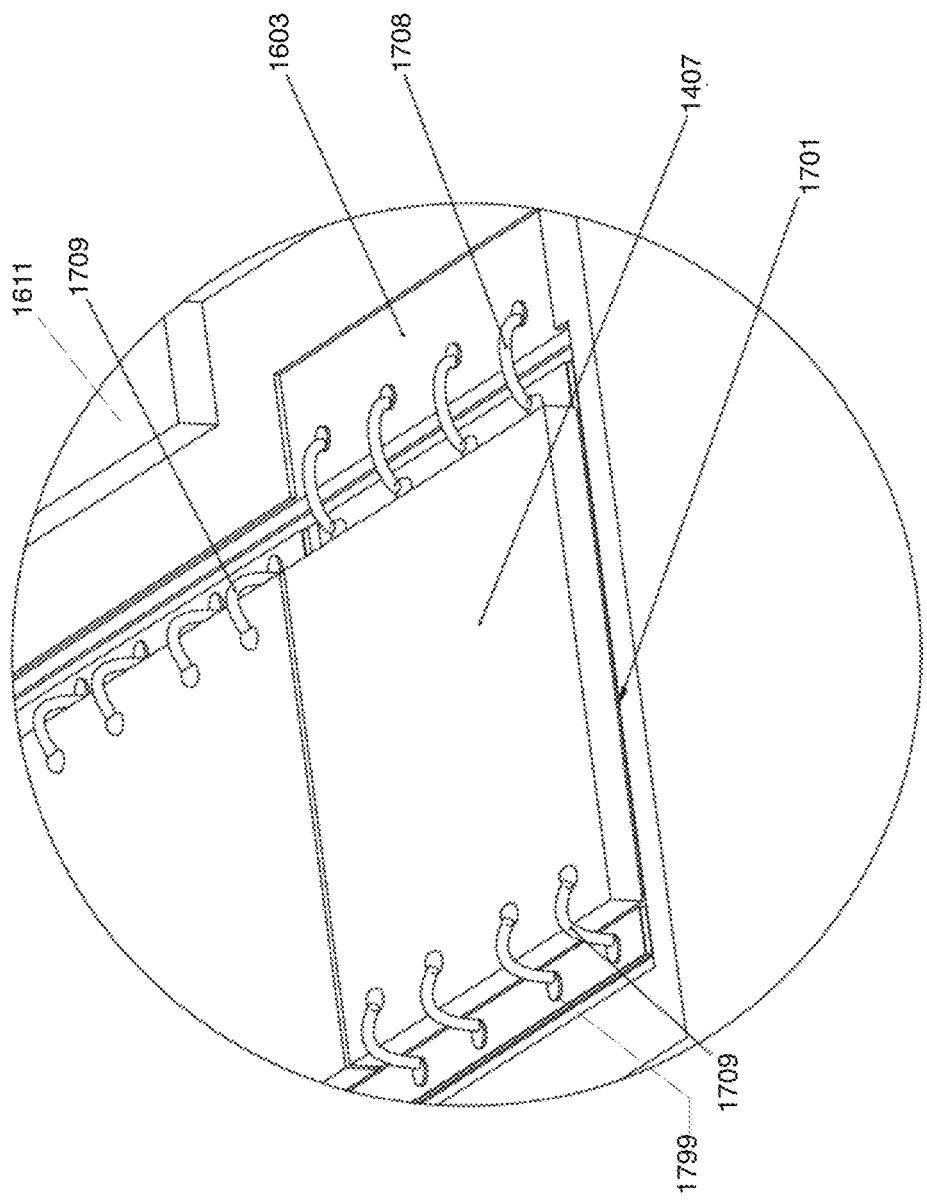
FIG. 17D is a further enlarged view of section AA of FIG. 17B showing a first LED of the group of electrically seriesed LEDs.

With reference to FIGS. 17A-17F, novel characteristics of LED array 1407 will now be described. FIG. 17A is an isometric view of the LED array assembled to the flex circuit and the micro-channel cooler in accordance with an embodiment of the present invention. FIG. 17B is a top view of the LED array of FIG. 17A. FIG. 17C is an enlarged view of section A of FIG. 17A showing wire-bond connections for a group of seriesed LEDs of the LED array of FIG. 17B. FIG. 17D is a further enlarged view of section AA of FIG. 17B showing a first LED of the group of seriesed LEDs.

In the context of the present example, each LED or package is constructed with an anode pad 1701 on the underside of the LED or package for SMT soldering and placement. Cathode pads 1702 (shown in FIG. 17E) are located on the top surface towards a common edge of the LED. Cathode pads 1702 are designed for preferably the balls of wire-bonds to be affixed. Specifically, the foot or wedge end of a wire-bond attached as terminating a wire-bond on the LED surface would require too much downward pressure and damage the LED epitaxial layer. Anode foot 1799 of wire 1709 is affixed to the stem of anode trace forming (where the trace forms a wire bod pad). These two pads provide the electrical connections for the LEDs. An alternating orientation of the LEDs is illustrated by FIG. 17B. The alternating orientation facilitates formation of a high-density array because it allows for series configuration with a minimal of electrical resistance between LEDs as opposed to prior art configurations.

FIG. 17C is an enlarged view of section A of FIG. 17A showing wire-bond connections for one submount and the beginning of the next submount, which is connected in electrical parallel with the first. An ESD protection device, in this case a SMT zener diode is also shown.

FIG. 17D is a further enlarged view of section AA of FIG. 17B showing a first LED in a group of seriesed LEDs and the anode-to-flex-circuit wire bonds (e.g., wire bond 1708) with the ball originating at the submount and the tail connected to anode pad 1603 of flex circuit 1403.

Figure 17E:
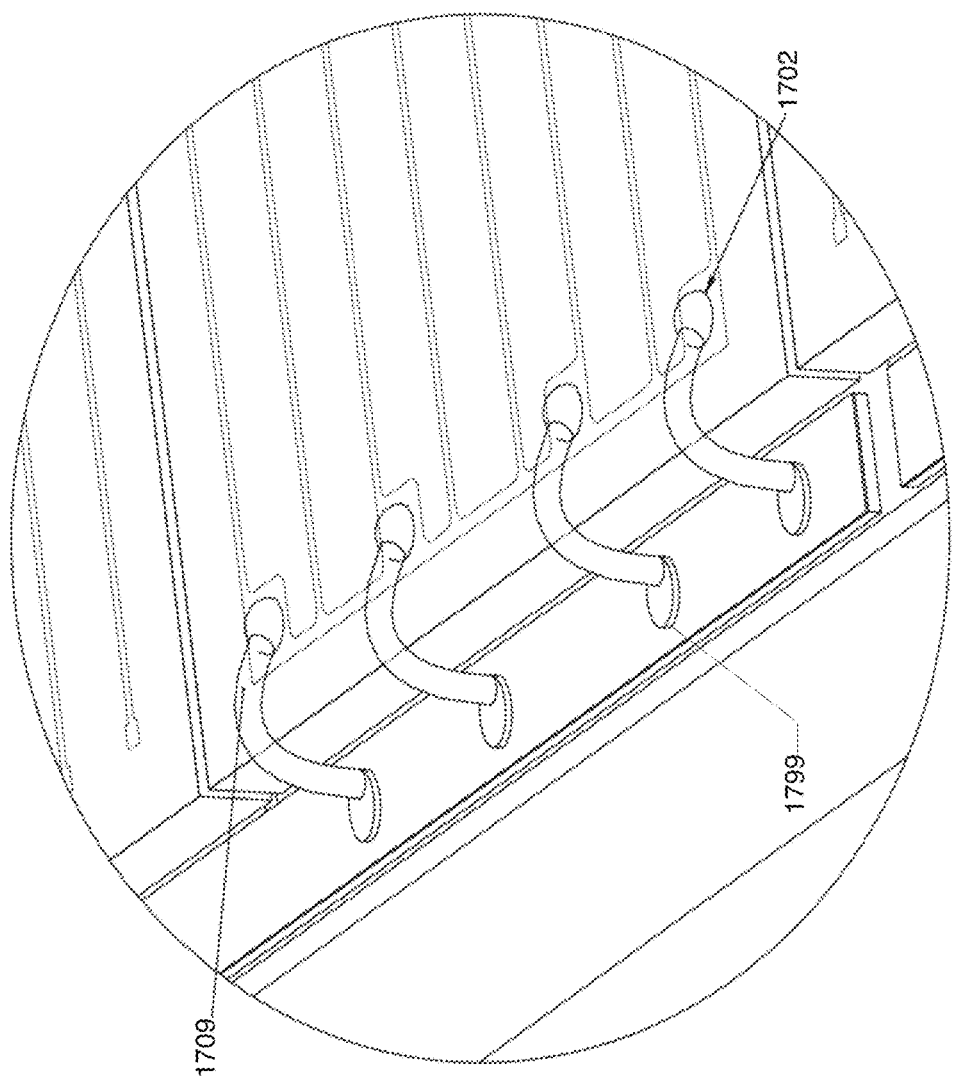
FIG. 17E is a further enlarged view of section AB of FIG. 17B.

FIG. 17E is a further enlarged view of section AB of FIG. 17B showing an intermediate LED of a group of seriesed LEDs and LED cathode pad 1702 to submount wire-bond 1709. In one embodiment, there are four such cathode pads 1702 and wire-bonds per LED.

Figure 17F:
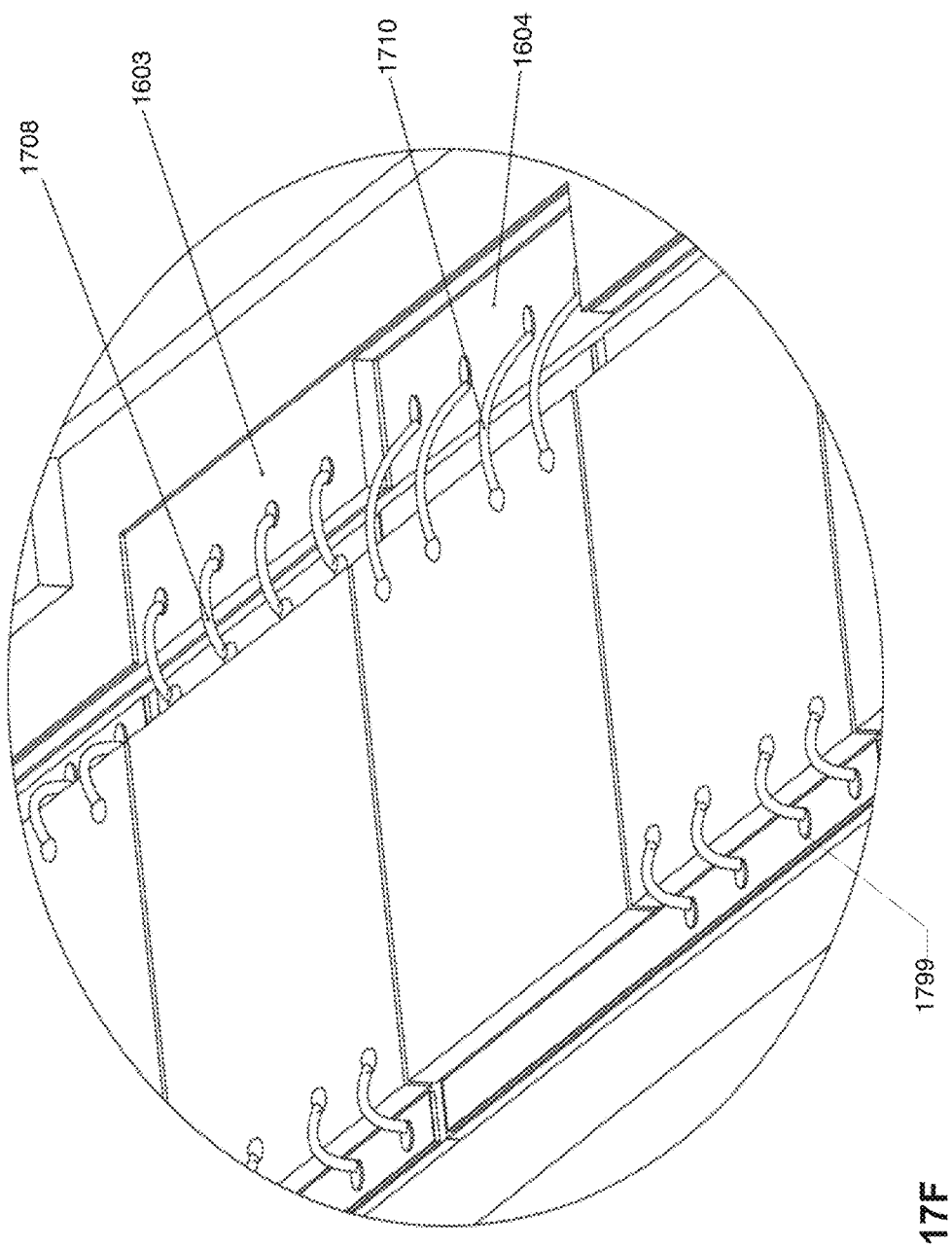
FIG. 17F is a further enlarged view of section AC of FIG. 17B.

FIG. 17F is a further enlarged view of section AC of FIG. 17B showing a final LED in a group of seriesed LEDs. Exemplary LED-cathode-pad-to-flex-cathode-pad wire-bonds (e.g., wire bond 1710) are shown. In one embodiment, these are the longest wire bonds in the system. Care should be taken to minimize their length to prevent undue voltage drop. Multiple wires to a single pad may be considered as well as rectangular or other geometric shapes and materials such as copper, silver, gold and the like. The initiating LED and its respective bonds of the next LED submount are also shown.

According to one embodiment, lamp head module 1400 has three submount arrays. By sharing the anode layer and cathode layer provided by flex circuit 1403, multiple submounts may be wired in parallel. In the context of the present example, this produces a final electrical assembly of the three parallel arrays (range 2 to 20) of 12 (range 2 to 200) seriesed LEDs.

All wire bonds may consist of a single or multiple wires. These wires may be mounted linearly (as shown) or in a stacked configuration. Diameter of the wire may be varied as needed to attain the current capacity desired for the specific application. Larger loops may be required for larger diameters; therefore, it may be advisable to use multiple smaller diameter bonds in applications with tight mechanical constraints.

Figure 18C:
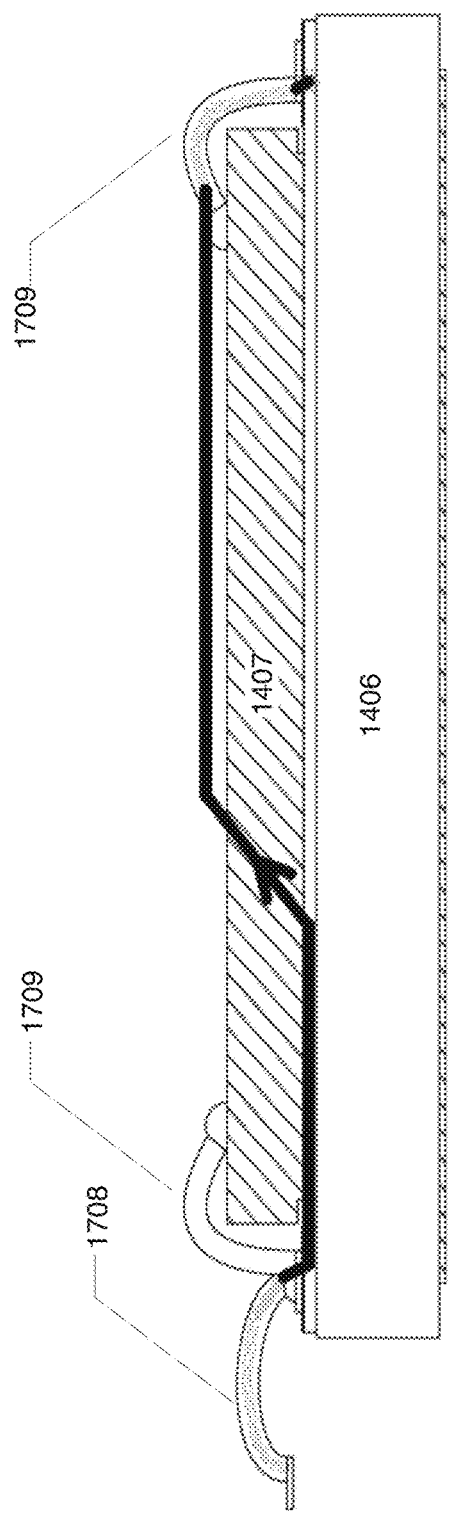
FIG. 18C is a cross section of the group of electrically seriesed LEDs of FIG. 18A taken along section line A.
Figure 18D:
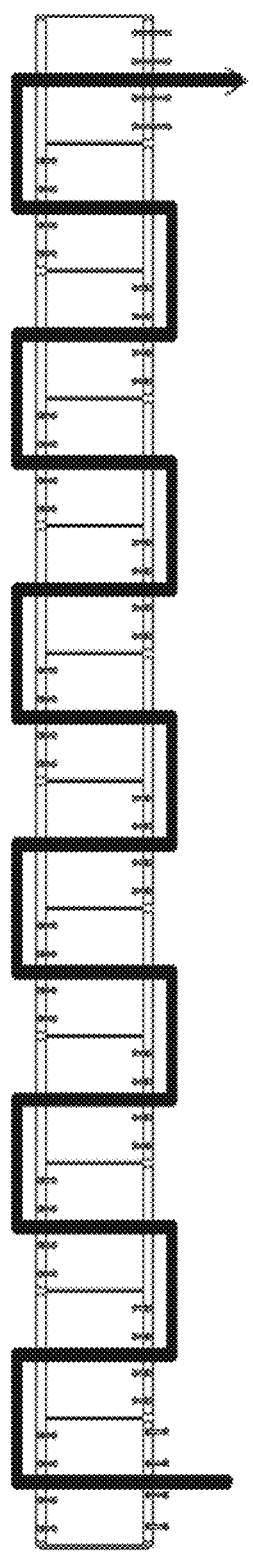
FIG. 18D conceptually illustrates a power path of a group of electrically seriesed LEDs in accordance with an embodiment of the present invention.

FIG. 18A conceptually illustrates a power path of a group of seriesed LEDs in accordance with an embodiment of the present invention. FIG. 18B is a magnified view of the first 4 LEDs of the group of seriesed LEDs of FIG. 18A. FIG. 18C is a cross section of the group of seriesed LEDs of FIG. 18A taken along section line A. In FIG. 18A, three of the L-shaped structures described with reference to FIG. 15D are shaded. FIG. 18D is the same as FIG. 18A, but excludes the shading of the exemplary L-shaped structures.

According to the present example, current travels in series from an anode layer of flex circuit 1403 through wire bonds to a wire bond pad of the submount 1406, which is connected to the anode pad of the first LED on the underside of the LED. FIG. 18C shows a cross section of a first LED in the series. The current path travels through the wire-bond to the submount through the LED where a large portion of the electrical energy is converted into light energy. Waste heat energy is also produced as a byproduct. The cooler the LED p-n junction is, the more efficient it is in its light emission. The intent of the cooling subsystem 1470 is to cool the LED array 1407 while be operated at substantial current levels and still maintaining a junction temperature low enough to give reasonably efficient operation of the LED array 1407. Power then travels from the cathode of the LED to the stem and bond pad of the next "L" of the submount through the wire-bond 1709. This pattern continues until the end of the group of seriesed LEDs is reached.

FIG. 18A shows how the above described process is repeated in a zigzag pattern until the final LED in the series is reached at which point wire-bonds of type 1710 are used instead of wire bonds of type 1709 to connect the cathode pads of the final LED to cathode layer 1604 of flex circuit 1403 as illustrated in the context of FIGS. 17A-F. It is important to note that while the present example uses twelve LEDs in series, longer or shorter series groups may be employed depending on the application. Likewise the LED array 1407 may consist of a single submount or numerous submounts and is only limited by the current carrying capacity of flex circuit 1403 and the micro-channel cooler's ability to transfer heat away from the LED array 1407 and maintain acceptable junction temperatures.

Figure 19:
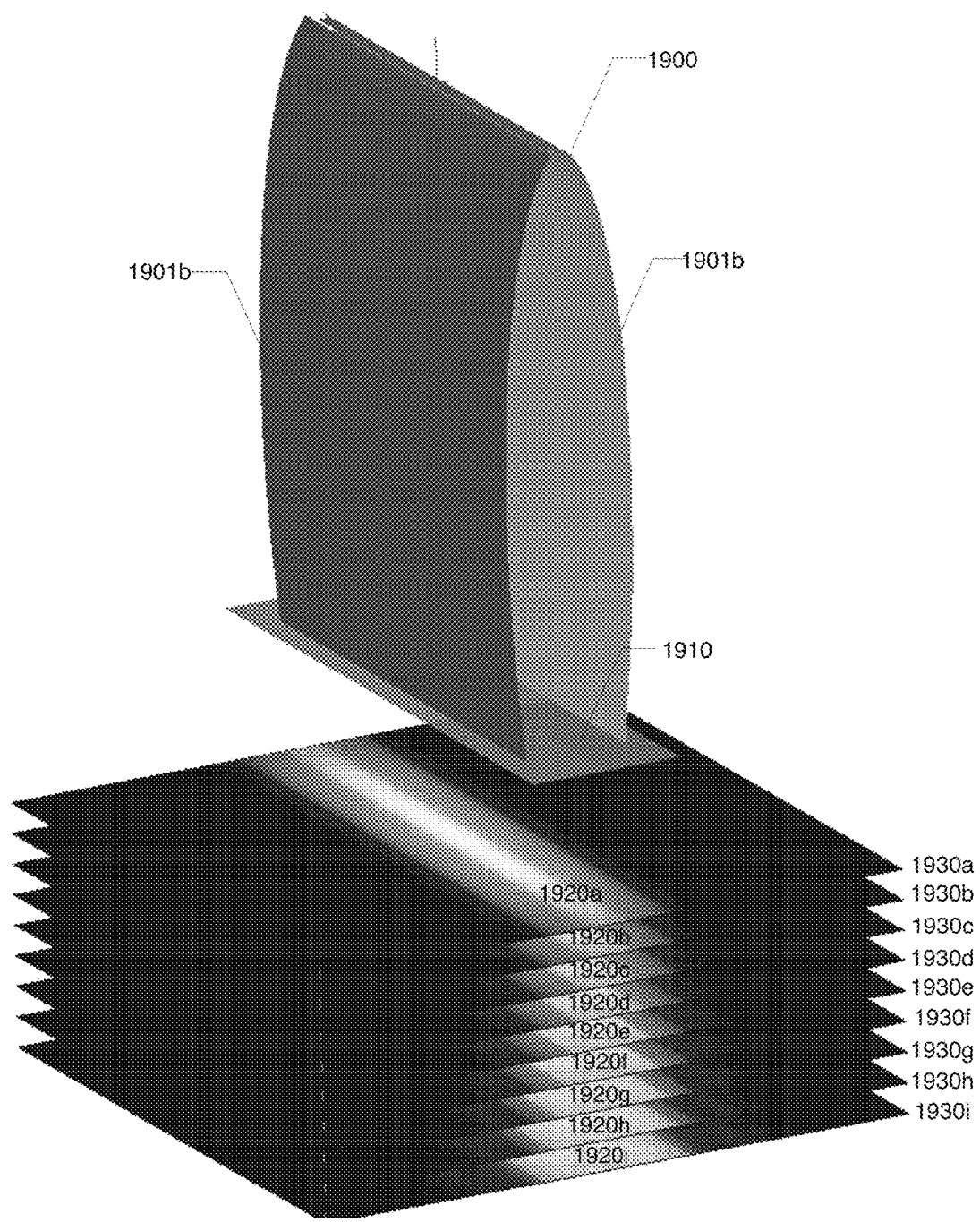
FIG. 19 illustrates irradiance patterns from an 80 mm long reflector that creates a 25 mm wide irradiated area focused 65 mm below the reflector opening in accordance with an embodiment of the present invention.

FIG. 19 illustrates irradiance patterns from an exemplary 80 mm long reflector that creates an approximately 25 mm wide irradiated area focused 65 mm below the reflector window 1910 in accordance with an embodiment of the present invention. The planes 1930*a-i* showing the irradiance patterns 1920*a-i* go from 25 mm to 65 mm below the reflector in 5 mm increments. The trend in the irradiance patterns at the different depths is that they get narrower as they get closer to the reflector, however since the focal distance of this reflector design is relatively far away (65 mm), the irradiance pattern widths don't significantly change from the lower to the upper part of the light field. So this means that the desired beam width stays relatively constant over an increased "depth of field" at this focal distance and this effect increases as the focal plane distance increases. According to one embodiment, during operation, the distance from the exit aperture to the surface of the workpiece is approximately between 0.01 to 0.1 (range 0.01 to 10) times the length of the reflector (i.e., distance from the entrance aperture to the exit aperture).

The core of embodiments of the present invention is a high density LED array (e.g., LED array 1407), which results in the smallest possible radiant area with the highest possible radiance ("brightness"). This high density radiant source, made possible due to a very low thermal resistance substrate design (e.g., micro-channel cooler 1401) that effectively mitigates the high heat density, allows for precise optical control in the smallest possible sized reflector system. The high density radiant source also allows for a reflector with a high capture efficiency. In other words, a high percentage of the radiant energy emitted from the source can be captured and controlled by the reflector. As a result of this increased level of optical control, one desired irradiance pattern that can be achieved is referred to as the "top hat" pattern. A "top hat" irradiance pattern is one in which higher irradiance values are uniform over some distance with abrupt boundaries on either side as the irradiance decreases to lower or negligible values. This is in comparison to a typical Gaussian, or smoothly tapered pattern, where the irradiance falls off from a center peak value more smoothly. Such irradiance patterns can be favorable to practical industrial applications, such as UV curing. In this particular example, the high density radiant area has been configured into a high aspect ratio line source, so the top hat distribution is formed perpendicular to the length of the reflector. Other aspects of the irradiance pattern, such as larger working distances, greater pattern depth of field, increased uniformity and decreased underutilized spill light are all desirable and all more achievable with the high density radiant source due to the improved optical control it provides.

Embodiments of the present invention create a top hat profile by shaping the macro reflector profile in a shape that closely approximates or represents multiple (e.g., 5,6,7, . . . 10) elliptical profiles on each reflector half (e.g., 1901*a* and 1901*b*) in a linear trough. According to one embodiment, the macro reflector profile is optimally designed using Photopia, a non-imaging ray trace software package available from LTI Optics of Westminster, Colo. USA. These profiles can be defined in one or more mathematical equations, if so desired.

Each ellipse manipulates or controls the photons that impinge upon it and deflects (reflects) them in such a way as to ultimately "push" more photons from the center of the pattern on the workpiece to the edges of the pattern on workpiece. This can be advantageous to photo curing of polymers for a multitude of reasons. An irradiance pattern at large working distances allows longer times between output window cleaning as well as less susceptibility to window damage. Increased uniformity also allows better utilization of photons towards the goal of not over irradiating (wasteful) or under irradiating (under curing) any part of the workpiece. An irradiance pattern with a greater depth of field is beneficial when curing 3D objects that require curing on surfaces at a range of distances from the output window. A real-world example of such a 3D object is curing of ink on beer or soda cans.

Figure 20:
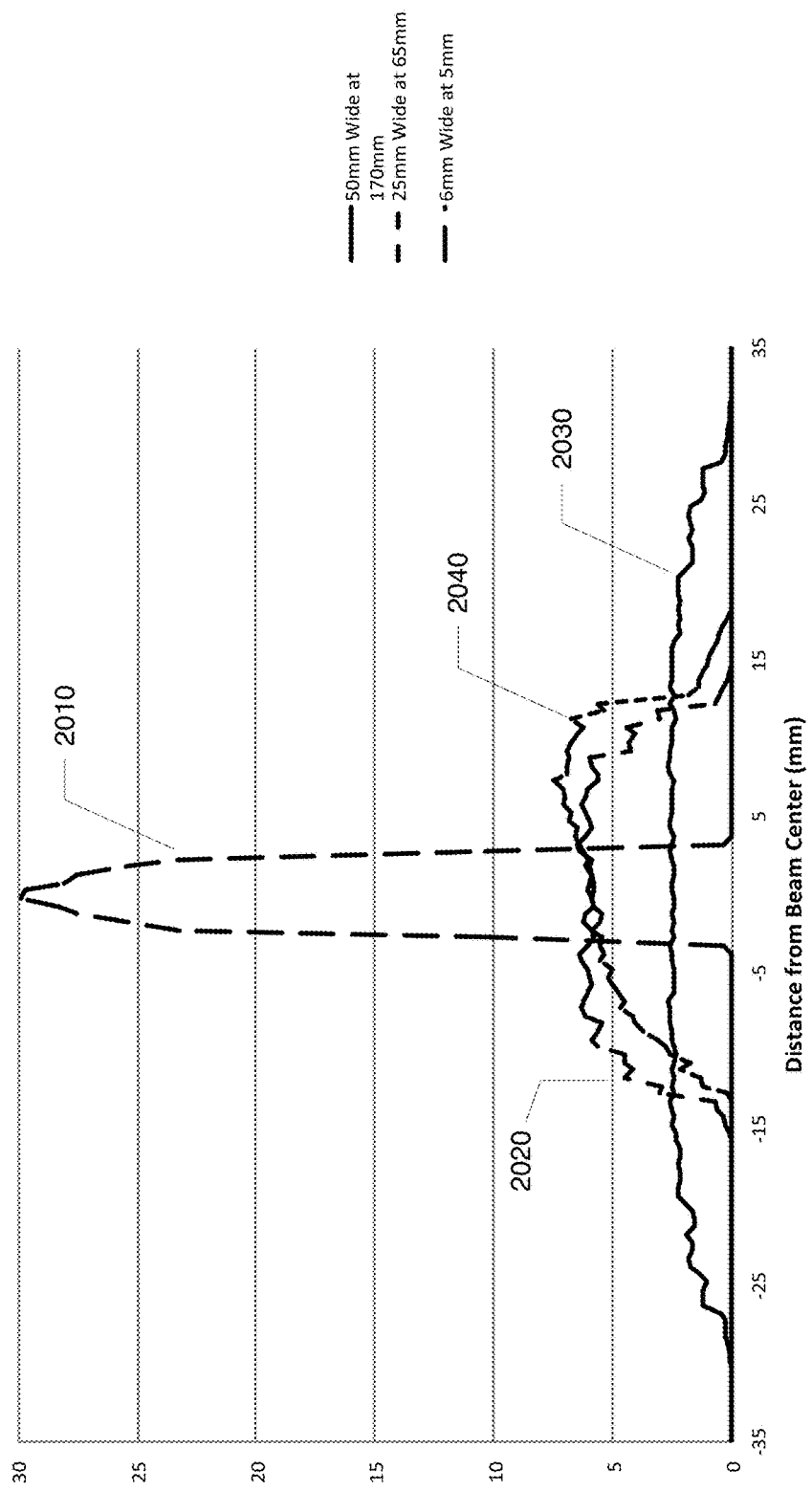
FIG. 20 is a graph illustrating cross sections of various irradiance profiles at a center of a workpiece surface for 5 mm, 25 mm and 50 mm stand-off distances in accordance with an embodiment of the present invention.

FIG. 20 is a graph illustrating cross sections of various irradiance profiles at a center of a workpiece surface for 5 mm, 25 mm and 50 mm stand-off distances (i.e., the distance between the window of the macro-reflector and the surface of the workpiece) in accordance with an embodiment of the present invention. The x-axis represents the distance from the beam center in millimeters. The y-axis represents irradiance in Watts per square centimeter (W/cm$^2$).

As can be observed with reference to the present example, a high density LED array allows for a wide variety of beam irradiance patterns that can be projected onto a workpiece, including: high center peak, flat-top top hat and asymmetric top hat.

The present example illustrates profiles for a high irradiance beam 2010 at 5 mm stand-off, flat top, top hat beams at 25 mm 2020 and at 50 mm 2030 and an asymmetric top hat beam at 25 mm 2040. Asymmetric profiles can be advantageously used in photocuring where oxygen inhibition is causing tack free cure issues. The entire power portion of the asymmetric beam can pre-cure the top surface of the workpiece polymer tack free and also inhibit the diffusion of more oxygen from the atmosphere into the uncured polymer on the workpiece. This graph shows the asymmetric profile having a higher intensity on the right-hand side, which could be optimal for a conveyor that is running from the right-side of the figure to the left-side. The conveyor could run in either direction. There could also be dips in the asymmetry or the asymmetric profile could have a higher intensity on the left-hand side. Note also multiple lamps could be arrayed sequentially down the length of a conveyor or orthogonal to the length of a conveyor. Each of the lamp head modules may produce different or the same beam profiles (e.g., high center peak, flat-top top hat and asymmetric top hat).

Integrating the area under the profile curves gives an approximate degree of the energy in the beam. In a continuous line of reflectors, the 25 mm wide profile 2020 has the same total energy as the 50 mm wide profile 2030, but the peak intensity of the 50 mm wide beam 2030 is about one half the peak intensity of the 25 mm wide beam 2020.

A high peak irradiance, nearly Gaussian beam profile can be advantageous for curing applications that require a lot of energy into a material on a moving conveyor in a short period of time, whereas a top hat profile can be advantageous for those applications requiring a longer time for energy input such as those limited by reaction kinetics.

Many photo-chemical reactions have surface curing inhibition related aspects that require photons to be injected into the material over a long enough period of time for the reaction to take place. If photons arrive too quickly they may not be utilized as the chemical reaction required to get a proper cure takes place in a time period longer than the arrival time period of the photons. Thus, it can be advantageous to spread the beam out over a wider area so that the curing material spends a longer time under the beam without having to slow down the conveyor moving the material under the UV irradiating device. Additionally, the top hat distribution can provide the required minimum amount of energy for curing without over irradiating other parts of the material, thus wasting energy. The top hat distribution can be more effectively achieved with the high density LED array since the cross section of the linear (high aspect ratio) radiant area is small, therefore providing better optical control. It should be noted that the top hat profiles in the context of the high density LED array (e.g., LED array 1407) are extremely uniform showing no pixilation or shower head effects of lower density LED arrays.

While embodiments of the invention have been illustrated and described, it will be clear that the invention is not limited to these embodiments only. Numerous modifications, changes, variations, substitutions, and equivalents will be apparent to those skilled in the art, without departing from the spirit and scope of the invention, as described in the claims.

What is claimed is:

1. A lamp head module comprising:
   a power source having an anode output connection and a cathode output connection;
   an array of light emitting devices having a light emitting surface, the array having high brightness and a high aspect ratio;
   a submount configured to electrically interface with a light emitting device of the array, the submount including a light emitting device bond pad area and an electrical conductor bond area;
   a lamp body;
   a patterned circuit, mounted to the lamp body, the patterned circuit having a high aspect ratio in terms of its length and height, the patterned circuit having formed therein an opening within which the array is located and the submount is mounted, and the patterned circuit comprising opposite electrical polarity conductive patterned layers including an anode layer and a cathode layer;
   wherein a first end of the patterned circuit exposes a first portion of the anode layer to form an electrical connection with the anode output connection of the power source and exposes a first portion of the cathode layer to form an electrical connection with the cathode output connection of the power source;
   wherein a second end of the patterned circuit exposes a second portion of the anode layer, which is electrically coupled to the light emitting device bond pad area; and
   wherein the second end of the patterned circuit exposes a second portion of the cathode layer, which is electrically coupled to the electrical conductor bond area.

2. The lamp head module of claim 1, wherein the high aspect ratio comprises a length of the array being greater than a width of the array.

3. The lamp head module of claim 1, wherein the patterned circuit wraps around the lamp body such that the first end of the patterned circuit is substantially in a plane perpendicular to a plane containing the light emitting surface of the array and wherein the second end of the patterned circuit is substantially in a plane parallel to the light emitting surface of the array.

4. The lamp head module of claim 1, further comprising a cooler assembly having a top surface to which the submount and the second end of the patterned circuit are bonded.

5. The lamp head module of claim 1, further comprising a macroreflector, affixed to the patterned circuit, to direct photons emitted by the array.

6. The lamp head module of claim 1, wherein at least one of the light emitting devices comprises a visible light emitting device.

7. The lamp head module of claim 1, wherein at least one of the light emitting devices comprises an infrared light emitting device.

8. A lamp head module comprising:
   an array of light emitting devices having a light emitting surface, the array having high brightness and a high aspect ratio;
   a submount configured to electrically interface with a light emitting device of the array, the submount including a light emitting device bond pad area and an electrical conductor bond area;
   a lamp body;
   a patterned circuit, mounted to the lamp body, the patterned circuit having a high aspect ratio in terms of its length and height, the patterned circuit having formed therein an opening within which the array is located and the submount is mounted, and the patterned circuit comprising a conductive layer and a non-conductive layer;
   a cooler assembly having a plurality of channels through which coolant flows and having a top surface to which the submount and the patterned circuit are bonded;
   a means for sealing the cooler assembly to the lamp body and for preventing coolant from by-passing the plurality of channels; and
   a power source having an anode output connection and a cathode output connection;
   wherein a first end of the patterned circuit exposes a first portion of the conductive layer to form an electrical connection with the anode output connection of the power source and exposes a second portion of the conductive layer to form an electrical connection with the cathode output connection of the power source;
   wherein a second end of the patterned circuit exposes a third portion of the conductive layer, which is electrically coupled to the light emitting device bond pad area; and
   wherein the second end of the patterned circuit exposes a fourth portion of the conductive layer, which is electrically coupled to the electrical conductor bond area.

9. The lamp head module of claim 8, wherein the high aspect ratio comprises a length of the array being greater than a width of the array.

10. The lamp head module of claim 8, wherein the cooler assembly comprises a micro-channel cooler.

11. A lamp head module comprising:
an array of light emitting devices having a light emitting surface, the array having high brightness and a high aspect ratio;
a submount configured to electrically interface with a light emitting device of the array, the submount including a light emitting device bond pad area and an electrical conductor bond area;
a lamp body having an inlet coolant flow channel and an outlet coolant flow channel;
a patterned circuit, mounted to the lamp body, the patterned circuit having a high aspect ratio in terms of its length and height, the patterned circuit having formed therein an opening within which the array is located and the submount is mounted, and the patterned circuit comprising a conductive layer and a non-conductive layer;
a cooler assembly having a plurality of channels through which coolant flows and having a top surface to which the submount and the patterned circuit are bonded;
wherein the inlet coolant flow channel directs the coolant toward an underside of the array in a direction substantially perpendicular to the light emitting surface;
wherein the outlet coolant flow channel directs the coolant away from the underside of the array in a direction substantially perpendicular to the light emitting surface; and
wherein waste heat is removed from the array by directing the coolant from the inlet coolant flow channel to the outlet coolant flow channel through the cooler assembly; and
a power source having an anode output connection and a cathode output connection;
wherein a first end of the patterned circuit exposes a first portion of the conductive layer to form an electrical connection with the anode output connection of the power source and exposes a second portion of the conductive layer to form an electrical connection with the cathode output connection of the power source;
wherein a second end of the patterned circuit exposes a third portion of the conductive layer, which is electrically coupled to the light emitting device bond pad area; and
wherein the second end of the patterned circuit exposes a fourth portion of the conductive layer, which is electrically coupled to the electrical conductor bond area.

12. The lamp head module of claim 11, wherein the high aspect ratio comprises a length of the array being greater than a width of the array.

13. The lamp head module of claim 11, wherein the inlet coolant flow channel and the outlet coolant flow channel are separated by a divider.

14. The lamp head module of claim 13, wherein the divider has a thickness substantially similar to the width of the array.

15. The lamp head module of claim 13, wherein the divider has a thickness that is thinner than the width of the array.

16. The lamp head module of claim 13, wherein the divider has a thickness that is thicker than the width of the array.

17. The lamp head module of claim 13, wherein the thickness is within approximately 10% of the width of the array.

* * * * *